(12) United States Patent
Tsubata

(10) Patent No.: US 8,854,563 B2
(45) Date of Patent: Oct. 7, 2014

(54) ACTIVE MATRIX SUBSTRATE, LIQUID CRYSTAL PANEL, LIQUID CRYSTAL DISPLAY DEVICE, LIQUID CRYSTAL DISPLAY UNIT, AND TELEVISION RECEIVER

(75) Inventor: Toshihide Tsubata, Osaka (JP)

(73) Assignee: Sharp Kabushiki Kaisha, Osaka (JP)

(*) Notice: Subject to any disclaimer, the term of this patent is extended or adjusted under 35 U.S.C. 154(b) by 123 days.

(21) Appl. No.: 13/503,680

(22) PCT Filed: Aug. 6, 2010

(86) PCT No.: PCT/JP2010/063427
§ 371 (c)(1),
(2), (4) Date: Apr. 24, 2012

(87) PCT Pub. No.: WO2011/052277
PCT Pub. Date: May 5, 2011

(65) Prior Publication Data
US 2012/0206659 A1    Aug. 16, 2012

(30) Foreign Application Priority Data
Oct. 28, 2009    (JP) .................... 2009-247785

(51) Int. Cl.
*G02F 1/1343* (2006.01)
*G02F 1/136* (2006.01)
*G09G 3/36* (2006.01)

(52) U.S. Cl.
CPC ...... *G09G 3/3659* (2013.01); *G09G 2310/0251* (2013.01); *G02F 1/134336* (2013.01); *G09G 2310/08* (2013.01); *G09G 2300/0443* (2013.01); *G09G 2300/0426* (2013.01); *G09G 2320/028* (2013.01); *G09G 3/3614* (2013.01); *G09G 2300/0447* (2013.01)
USPC .............................. 349/39; 349/43

(58) Field of Classification Search
USPC ............................................. 349/43
See application file for complete search history.

(56) References Cited

U.S. PATENT DOCUMENTS 6,707,441 B1 * 3/2004 Hebiguchi et al. .......... 345/92
2001/0013852 A1   8/2001 Matsushima et al.
(Continued)

FOREIGN PATENT DOCUMENTS

JP   8-234166 A    9/1996
JP   11-161243 A   6/1999
(Continued)

OTHER PUBLICATIONS

Official Communication issued in International Patent Application No. PCT/JP2010/063427, mailed on Sep. 21, 2010.

*Primary Examiner* — Bumsuk Won
*Assistant Examiner* — Edmond Lau
(74) *Attorney, Agent, or Firm* — Keating & Bennett, LLP

(57) ABSTRACT

An active matrix substrate is arranged such that each pixel region includes two pixel electrodes, each data signal line extends in a column direction, each column of pixel regions is associated with two data signal lines, one pixel electrode of the pixel region included in the column of pixel regions is connected to one of the two data signal lines via a transistor that is connected to a scanning signal line, the other pixel electrode of the pixel region is connected to the other one of the two data signal lines via a transistor that is connected to another scanning signal line, and one of pixel electrodes included in one of two adjacent pixel regions of the column and one of pixel electrodes included in the other one of the two adjacent pixel regions of the column are connected to an identical scanning signal line via respective transistors.

12 Claims, 35 Drawing Sheets

(56) References Cited

U.S. PATENT DOCUMENTS

| | | |
|---|---|---|
| 2003/0146893 A1 | 8/2003 | Sawabe |
| 2005/0035934 A1* | 2/2005 | Kitani et al. ............... 345/87 |
| 2005/0099379 A1* | 5/2005 | Iisaka ...................... 345/100 |
| 2005/0253797 A1 | 11/2005 | Kamada et al. |
| 2006/0164350 A1* | 7/2006 | Kim et al. ................. 345/87 |
| 2006/0164352 A1 | 7/2006 | Yoo et al. |
| 2007/0176178 A1* | 8/2007 | Lee et al. ................. 257/59 |
| 2008/0002076 A1* | 1/2008 | Yagi et al. ............... 349/39 |
| 2008/0284776 A1* | 11/2008 | Hirayama ................ 345/214 |
| 2008/0291189 A1* | 11/2008 | Song et al. .............. 345/209 |
| 2009/0153594 A1 | 6/2009 | Umeda |

FOREIGN PATENT DOCUMENTS

| | | |
|---|---|---|
| JP | 2003-295160 A | 10/2003 |
| JP | 2005-316211 A | 11/2005 |
| JP | 2006-209135 A | 8/2006 |
| JP | 2009-53589 A | 3/2009 |
| JP | 2009-145593 A | 7/2009 |
| WO | WO 2008149569 A1 * | 12/2008 |

* cited by examiner

ACTIVE MATRIX SUBSTRATE, LIQUID CRYSTAL PANEL, LIQUID CRYSTAL DISPLAY DEVICE, LIQUID CRYSTAL DISPLAY UNIT, AND TELEVISION RECEIVER

TECHNICAL FIELD

The present invention relates to a pixel division mode active matrix substrate or liquid crystal panel.

BACKGROUND ART

As a technique for improving viewing angle characteristics of liquid crystal display devices, a pixel division mode is known in which two pixel electrodes (a bright pixel electrode corresponding to a bright sub-pixel and a dark pixel electrode corresponding to a dark sub-pixel) are provided in a single pixel. FIG. 36 illustrates an example of a pixel division mode liquid crystal panel. This liquid crystal panel is an individual-writing type liquid crystal panel in which two data signal lines are associated with a single pixel and different data signals are written into bright and dark pixel electrodes during display of a halftone. This individual-writing type liquid crystal panel has the following advantages over a capacitively-coupled type liquid crystal panel in which two capacitively-coupled pixel electrodes are provided in a single pixel and a data signal is written into only one of the two pixel electrodes. Specifically, the individual-writing type liquid crystal panel is highly reliable since no electrically floating pixel electrode is present. Moreover, luminance of bright and dark sub-pixels can be accurately controlled.

CITATION LIST

Patent Literature 1

Japanese Patent Application Publication, Tokukai, No. 2006-209135 A (Publication Date: Aug. 10, 2006)

SUMMARY OF INVENTION

Technical Problem

However, the configuration of FIG. 36 has the following problem. Specifically, since writing is carried out per one pixel row, a sufficient pixel charging time cannot be secured in a case where the configuration of FIG. 36 is applied, for example, to a large-sized high-definition liquid crystal display device or a liquid crystal display device driven at high-speed (e.g., double-speed drive, triple-speed drive). This causes deterioration in display quality.

An object of the present invention is to extend a pixel charging time of an individual-writing type liquid crystal display device.

Solution to Problem

The present active matrix substrate includes: data signal lines; scanning signal lines; pixel electrodes; and transistors, the data signal lines extending in a column direction, each column of pixel regions being associated with two data signal lines, each pixel region included in said each column including a plurality of pixel electrodes, one of the plurality of pixel electrodes of said each pixel region being connected to one of the two data signal lines via a transistor that is connected to a scanning signal line, another one of the plurality of pixel electrodes of said each pixel region being connected to the other one of the two data signal lines via a transistor that is connected to another scanning signal line, and one of pixel electrodes in one of two adjacent pixel regions of said each column and one of pixel electrodes in the other one of the two adjacent pixel regions of said each column being connected to an identical scanning signal line via respective transistors.

In a liquid crystal display device including the present active matrix substrate, individual writing can be carried out with respect to a plurality of pixel electrodes provided in a pixel region while selecting scanning signal lines two at a time. This makes it possible to extend a pixel charging time of an individual-writing type liquid crystal display device.

Advantageous Effects of Invention

According to the present invention, it is possible to extend a pixel charging time of an individual-writing type liquid crystal display device.

Figure 29:
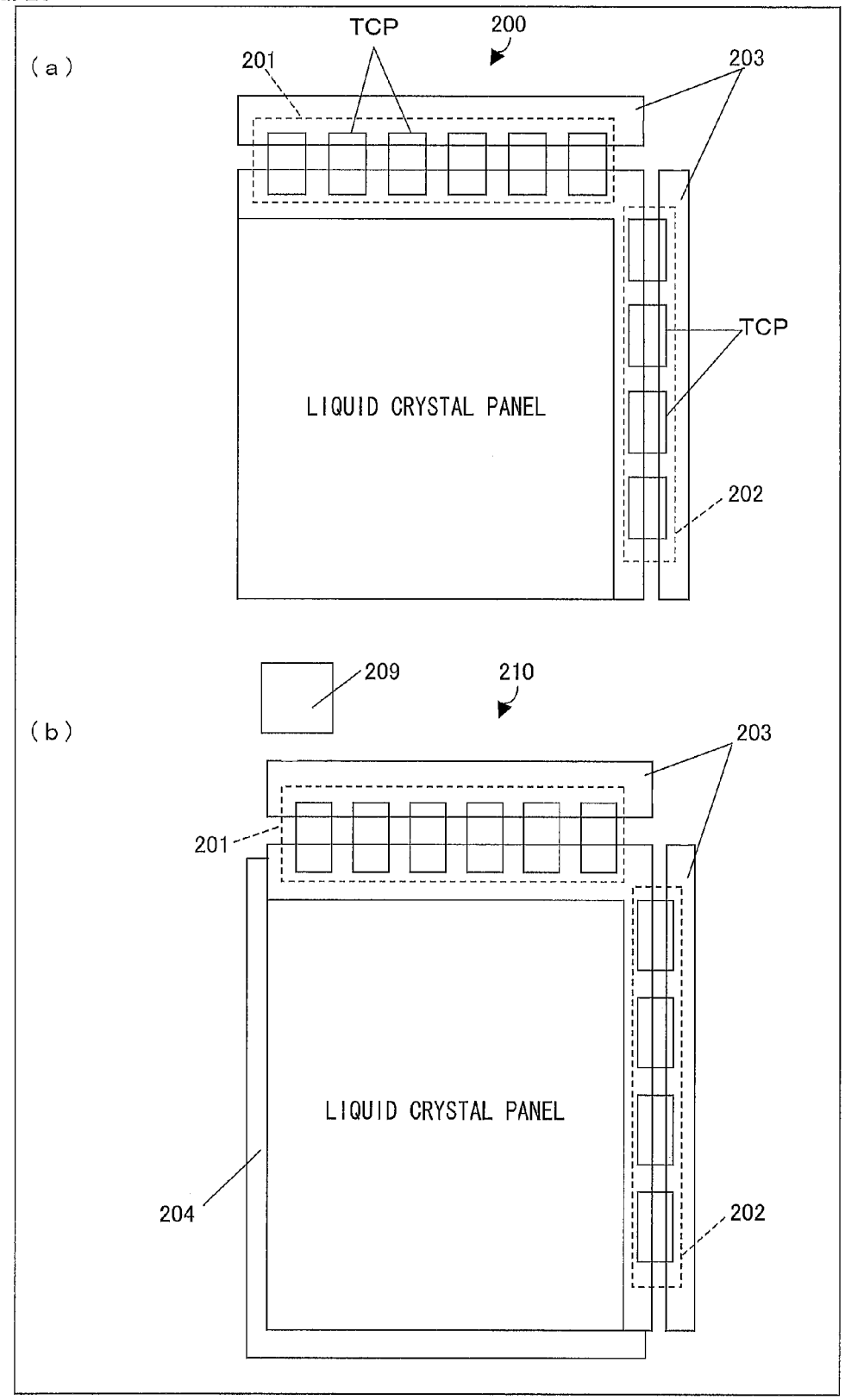

(a) of FIG. 29 is a diagram schematically illustrating a configuration of the present liquid crystal display unit, and (b) of FIG. 29 is a diagram schematically illustrating a configuration of the present liquid crystal display device.

Figure 30:
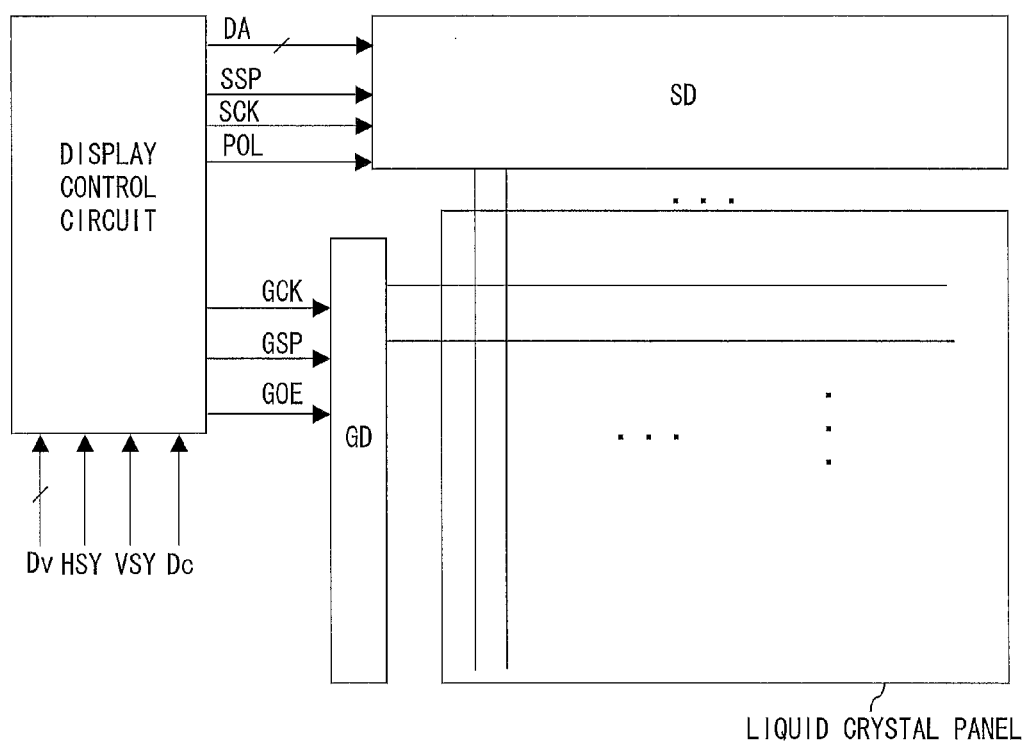

FIG. 30 is a block diagram explaining an overall configuration of the present liquid crystal display device.

Figure 31:
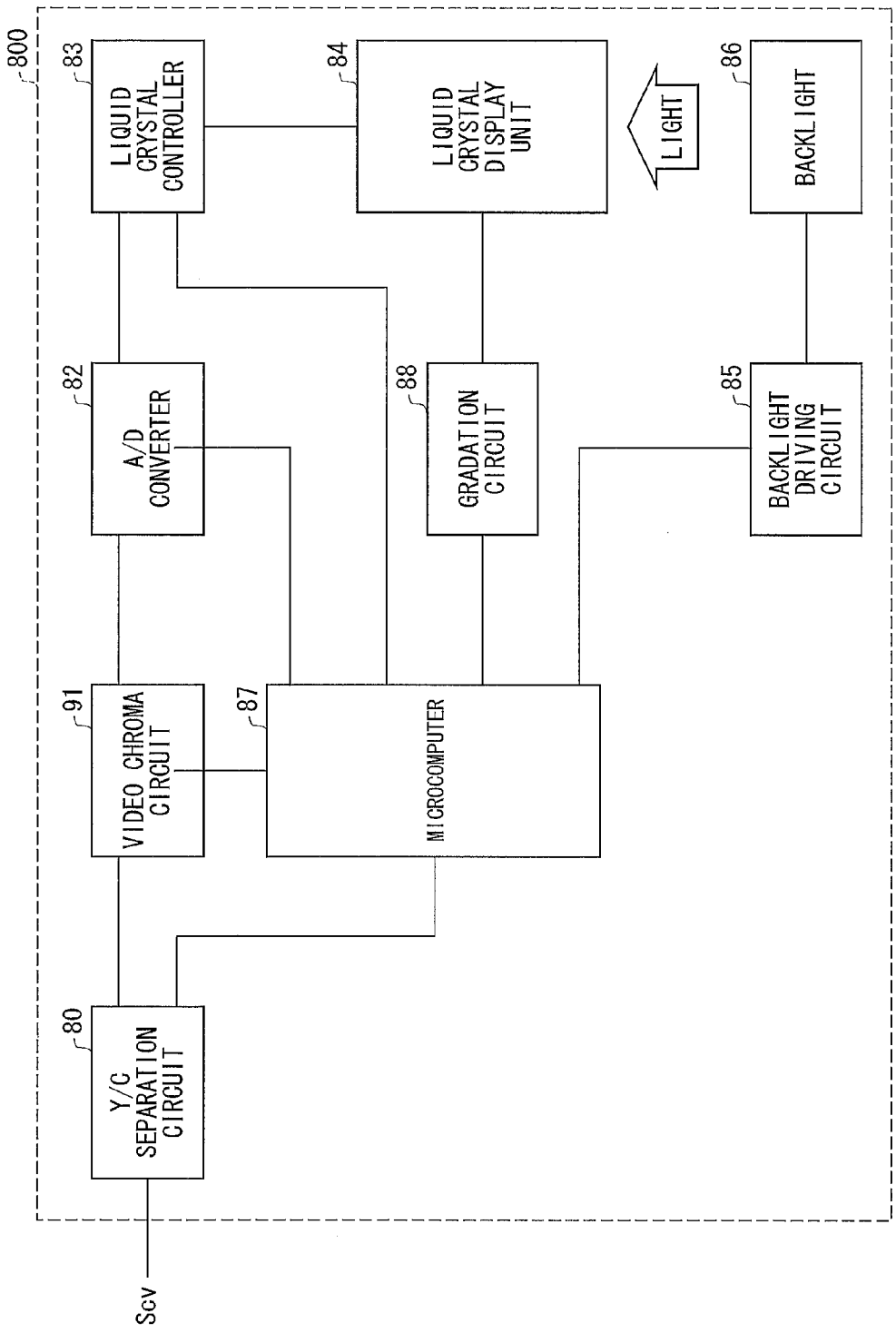

FIG. 31 is a block diagram explaining functions of the present liquid crystal display device.

Figure 32:
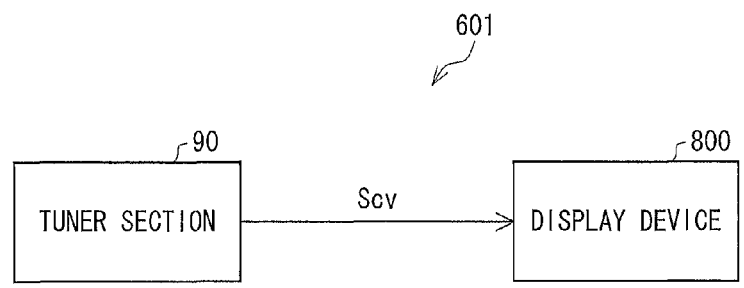

FIG. 32 is a block diagram explaining functions of the present television receiver.

Figure 33:
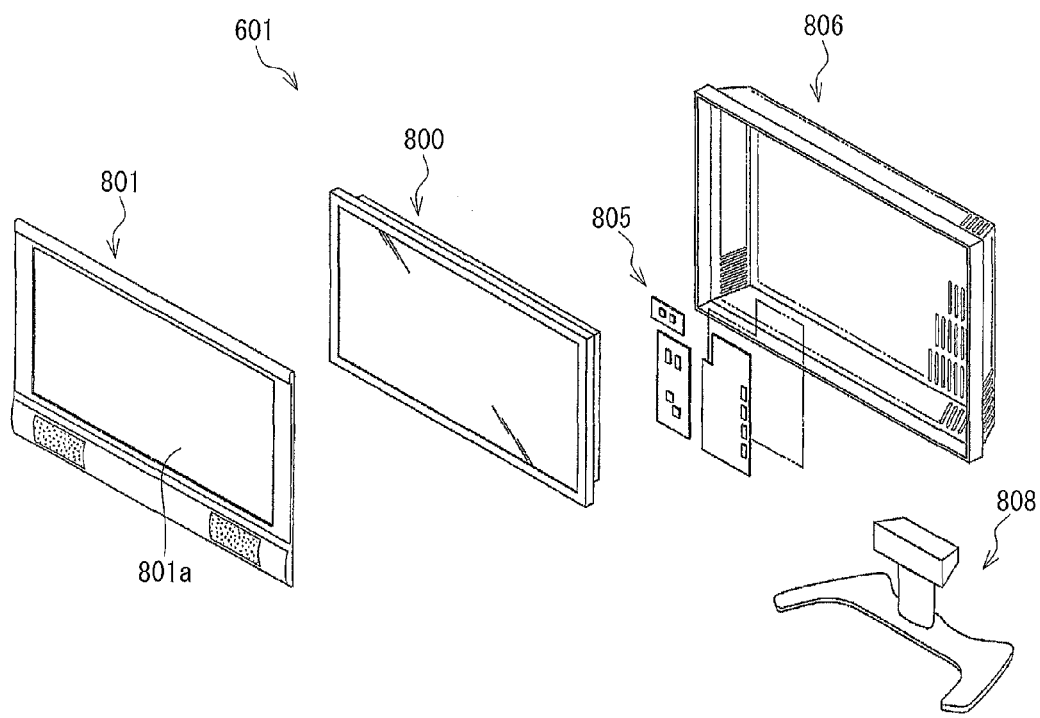

FIG. 33 is an exploded perspective view illustrating a configuration of the present television receiver.

Figure 6:
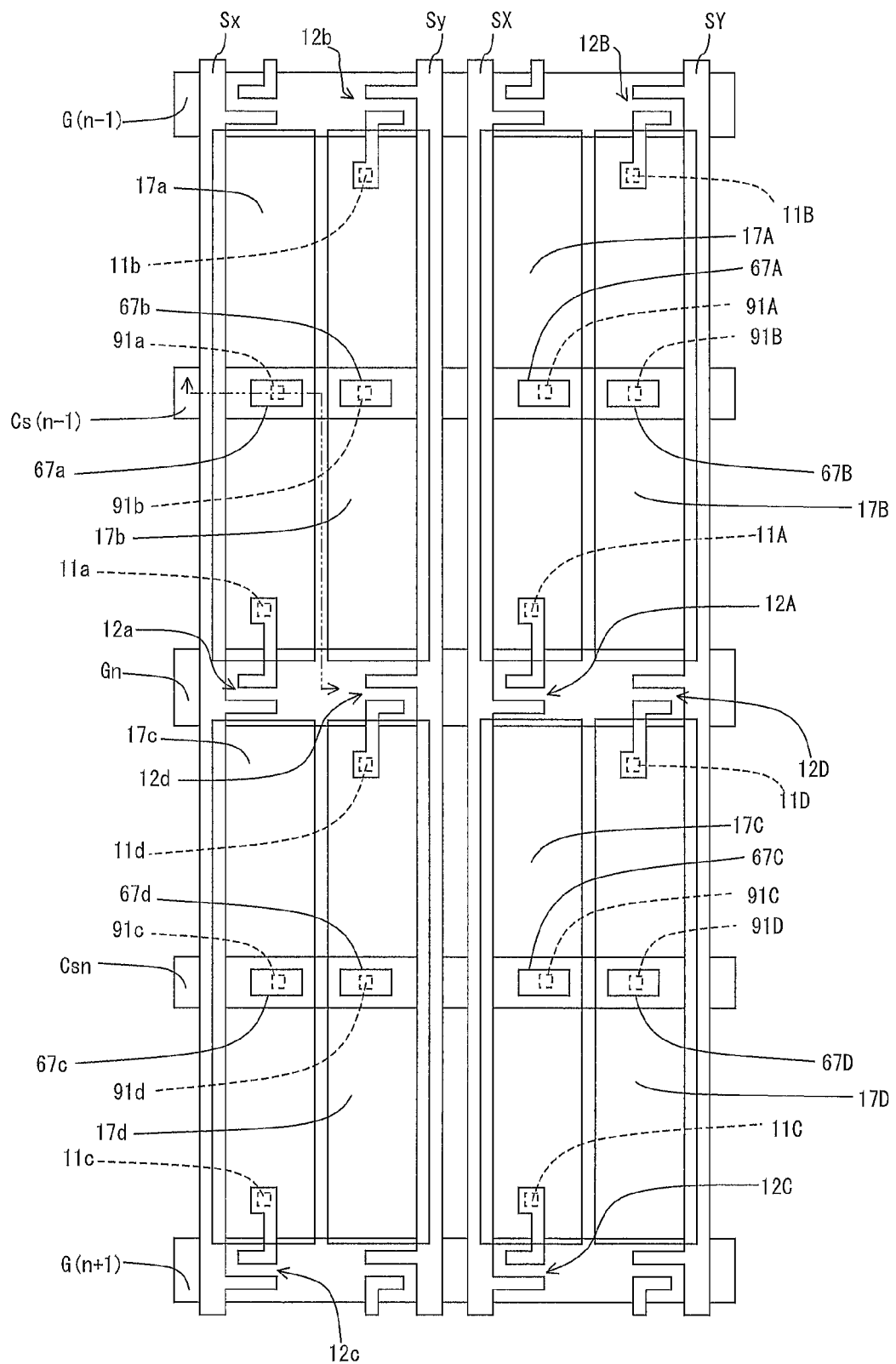
FIG. 6 is a plan view illustrating a specific configuration of the liquid crystal panel of FIG. 1.
Figure 34:
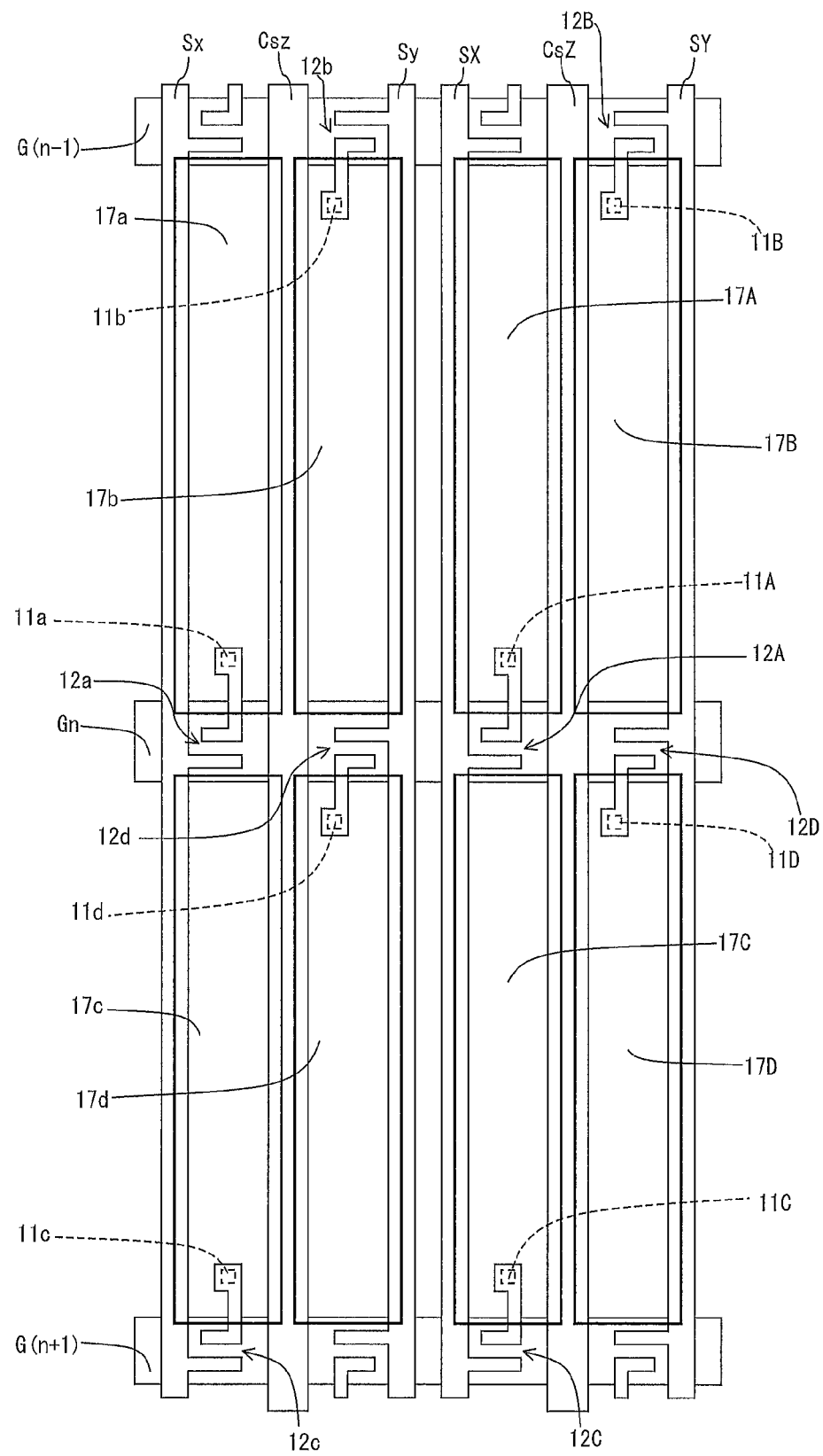

FIG. 34 is a plan view illustrating a modification of FIG. 6.

Figure 35:
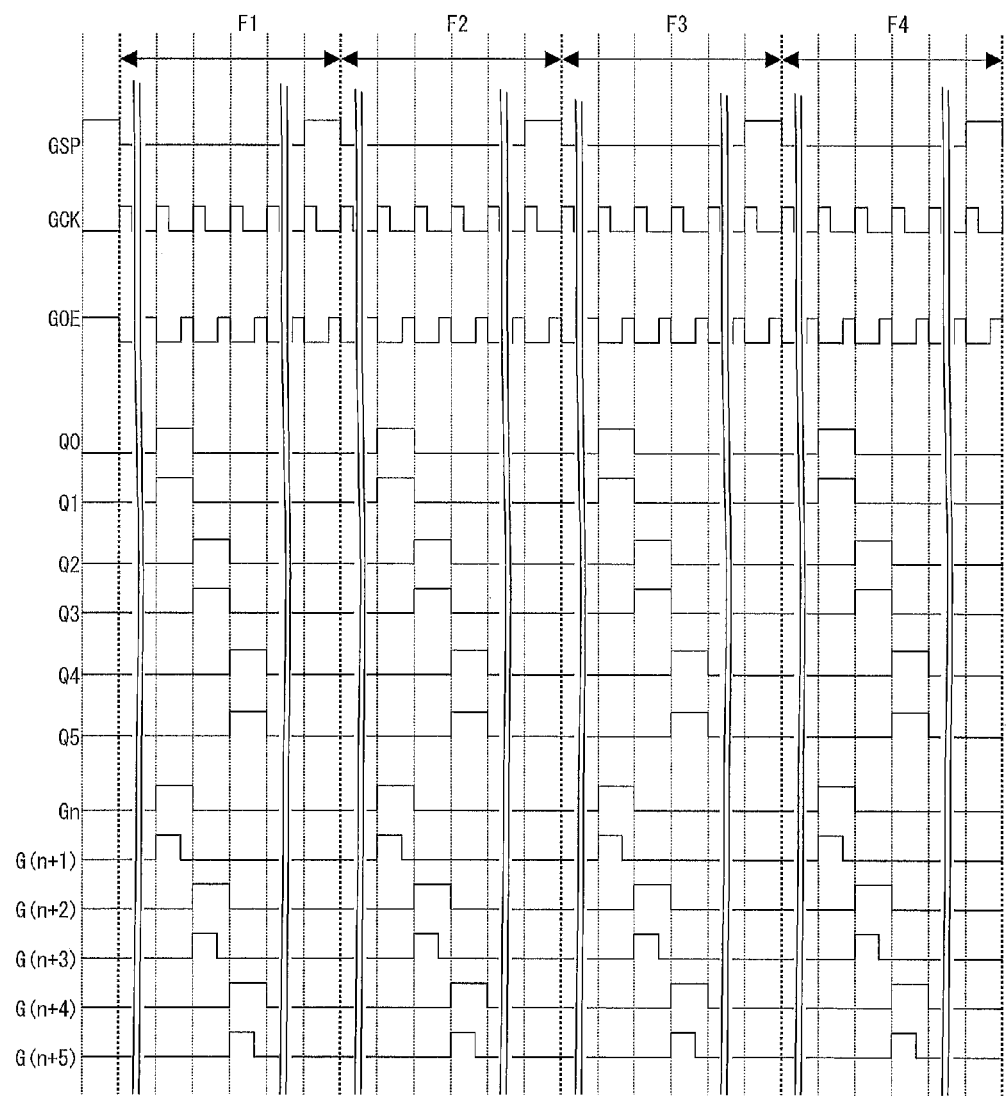

FIG. 35 is a diagram schematically illustrating a configuration of a gate driver of the present liquid crystal display device.

Figure 36:
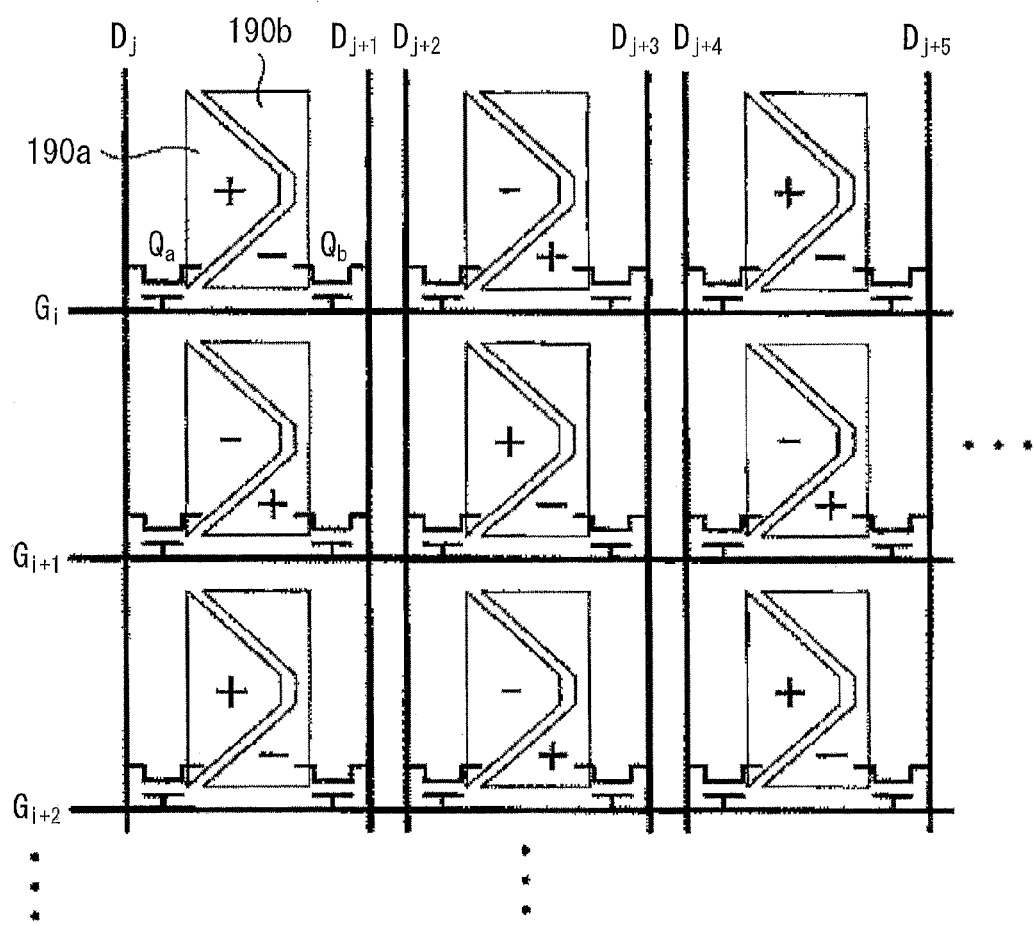

FIG. 36 is a diagram schematically illustrating a configuration of a conventional liquid crystal panel.

DESCRIPTION OF EMBODIMENTS

Exemplary embodiments of the present invention are described below with reference to FIGS. 1 through 35. Note that, for convenience of description, a direction in which data signal lines extend is hereinafter referred to as a column direction, and a direction in which scanning signal lines extend is hereinafter referred to as a row direction. Needless to say, however, the scanning signal lines may extend in a horizontal direction or in a vertical direction depending on how the liquid crystal display device (or a liquid crystal panel or an active matrix substrate used in the liquid crystal display device) is used (viewed). Further, 1 pixel region of an active matrix substrate corresponds to 1 pixel of a liquid crystal panel or a liquid crystal display device.

Embodiment 1

Figure 1:
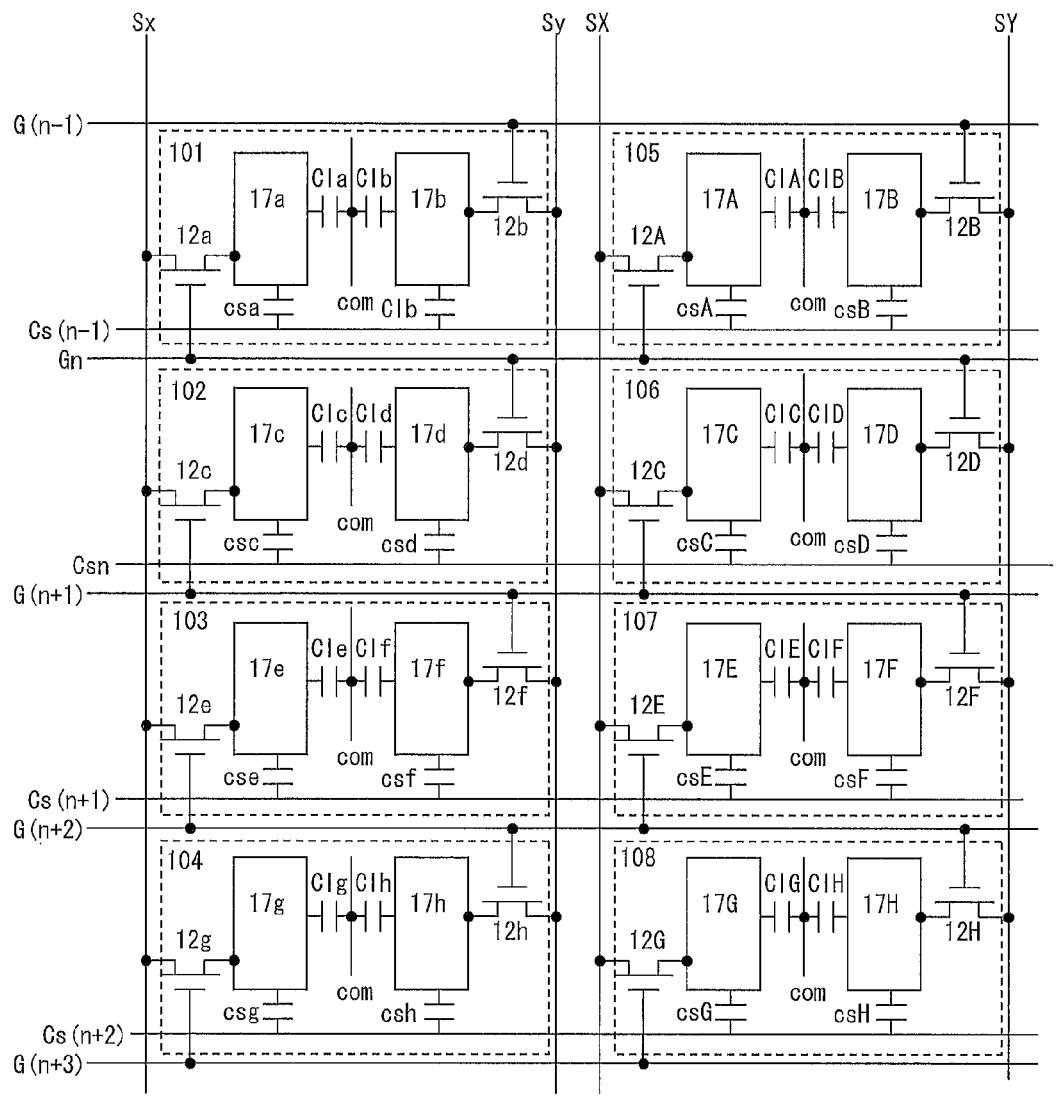
FIG. 1 is a circuit diagram illustrating a configuration of a liquid crystal panel of Embodiment 1.

FIG. 1 is an equivalent circuit diagram illustrating part of the present liquid crystal panel 5a. As illustrated in FIG. 1, the liquid crystal panel 5a is arranged such that each pixel includes a plurality of pixel electrodes, data signal lines extend in the column direction, each pixel column is associated with two data signal lines, one of pixel electrodes of a pixel included in the pixel column is connected to one of the two data signal lines via a transistor that is connected to a scanning signal line, another one of the pixel electrodes of the pixel is connected to the other one of the two data signal lines via a transistor that is connected to another scanning signal line, and one of pixel electrodes included in one of two adjacent pixels of the pixel column and one of pixel electrodes included in the other one of the two adjacent pixels of the pixel column are connected to an identical scanning signal line via respective transistors. Further, two pixel electrodes are aligned in each pixel in the row direction, and two pixel electrodes which belong to an identical pixel column and which are connected to an identical scanning signal line via respective transistors are disposed diagonally opposite to each other.

For example, two data signal lines Sx and Sy are provided corresponding to a pixel column including pixels 101 to 104 aligned in the column direction, a scanning signal line G(n−1) is provided corresponding to a gap between a pixel row including pixels 101 and 105 aligned in the row direction and a pixel row on an upstream side of the pixel row in a scanning direction, a scanning signal line Gn is provided corresponding to a gap between a pixel row including pixels 102 and 106 aligned in the row direction and the pixel row including the pixels 101 and 105, a scanning signal line G(n+1) is provided corresponding to a gap between a pixel row including pixels 103 and 107 aligned in the row direction and the pixel row including the pixels 102 and 106, a scanning signal line G(n+2) is provided corresponding to a gap between a pixel row including pixels 104 and 108 aligned in the row direction and the pixel row including the pixels 103 and 107, a scanning signal line G(n+3) is provided corresponding to a gap between the pixel row including the pixels 104 and 108 and a pixel row on a downstream side of the pixel row in the scanning direction, and two data signal lines SX and SY are provided corresponding to a pixel column including the pixels 105 to 108 aligned in the column direction. Further, a retention capacitor wiring Cs (n−1), a retention capacitor wiring Csn, a retention capacitor wiring Cs(n+1), and a retention capacitor wiring Cs(n+2) are provided corresponding to the pixel row including the pixels 101 and 105, the pixel row including the pixels 102 and 106, the pixel row including the pixels 103 and 107, and the pixel row including the pixel 104 and 108, respectively.

In the pixel 101, two pixel electrodes 17a and 17b are aligned in this order in the row direction. The pixel electrode 17a is connected to a drain electrode of a transistor 12a connected to the scanning signal line Gn. The pixel electrode 17b is connected to a drain electrode of a transistor 12b connected to the scanning signal line G(n−1). A source electrode of the transistor 12a is connected to the data signal line Sx. A source electrode of the transistor 12b is connected to the data signal line Sy. A liquid crystal capacitance C1a is formed between the pixel electrode 17a and the common electrode (counter electrode) com, a liquid crystal capacitance C1b is formed between the pixel electrode 17b and the common electrode (counter electrode) com, a retention capacitance csa is formed between the pixel electrode 17a and the retention capacitor wiring Cs(n−1), and a retention capacitance csb is formed between the pixel electrode 17b and the retention capacitor wiring Cs(n−1).

In the pixel 102 that is adjacent to the pixel 101 in the column direction, two pixel electrodes 17c and 17d are aligned in this order in the row direction. The pixel electrode 17c is connected to a drain electrode of a transistor 12c connected to the scanning signal line G(n+1). The pixel electrode 17d is connected to a drain electrode of a transistor 12d connected to the scanning signal line Gn. A source electrode of the transistor 12c is connected to the data signal line Sx. A source electrode of the transistor 12d is connected to the data signal line Sy. A liquid crystal capacitance C1c is formed between the pixel electrode 17c and the common electrode (counter electrode) com, a liquid crystal capacitance C1d is formed between the pixel electrode 17d and the common electrode (counter electrode) com, a retention capacitance csc is formed between the pixel electrode 17c and the retention capacitor wiring Csn, and a retention capacitance csd is formed between the pixel electrode 17d and the retention capacitor wiring Csn.

In the pixel 103 that is adjacent to the pixel 102 in the column direction, two pixel electrodes 17e and 17f are aligned in this order in the row direction. The pixel electrode 17e is connected to a drain electrode of a transistor 12e connected to the scanning signal line G(n+2). The pixel electrode 17f is connected to a drain electrode of a transistor 12f connected to the scanning signal line G(n+1). A source electrode of the transistor 12e is connected to the data signal line Sx. A source electrode of the transistor 12f is connected to the data signal line Sy. A liquid crystal capacitance C1e is formed between the pixel electrode 17e and the common electrode (counter electrode) com, a liquid crystal capacitance C1f is formed between the pixel electrode 17f and the common electrode (counter electrode) com, a retention capacitance cse is formed between the pixel electrode 17e and the retention capacitor wiring Cs(n+1), and a retention capacitance csf is formed between the pixel electrode 17f and the retention capacitor wiring Cs(n+1).

In the pixel 104 that is adjacent to the pixel 103 in the column direction, two pixel electrodes 17g and 17h are aligned in this order in the row direction. The pixel electrode 17g is connected to a drain electrode of a transistor 12g connected to the scanning signal line G(n+3). The pixel electrode 17h is connected to a drain electrode of a transistor 12h connected to the scanning signal line G(n+2). A source electrode of the transistor 12g is connected to the data signal line Sx. A source electrode of the transistor 12h is connected to the data signal line Sy. A liquid crystal capacitance C1g is formed between the pixel electrode 17g and the common electrode (counter electrode) com, a liquid crystal capacitance C1h is formed between the pixel electrode 17h and the common electrode (counter electrode) com, a retention capacitance csg is formed between the pixel electrode 17g and the retention capacitor wiring Cs(n+2), and a retention capacitance csh is formed between the pixel electrode 17h and the retention capacitor wiring Cs(n+2).

In the pixel 105 that is adjacent to the pixel 101 in the row direction, two pixel electrodes 17A and 17B are aligned in this order in the row direction. The pixel electrode 17A is connected to a drain electrode of a transistor 12A connected to the scanning signal line Gn. The pixel electrode 17B is connected to a drain electrode of a transistor 12B connected to the scanning signal line G(n−1). A source electrode of the transistor 12A is connected to the data signal line SX. A source electrode of the transistor 12B is connected to the data signal line SY. A liquid crystal capacitance C1A is formed between the pixel electrode 17A and the common electrode (counter electrode) com, a liquid crystal capacitance C1B is formed between the pixel electrode 17B and the common electrode (counter electrode) com, a retention capacitance CsA is formed between the pixel electrode 17A and the retention capacitor wiring Cs(n−1), and a retention capacitance CsB is formed between the pixel electrode 17B and the retention capacitor wiring Cs(n−1).

In the pixel 106 that is adjacent to the pixel 102 in the row direction, two pixel electrodes 17C and 17D are aligned in this order in the row direction. The pixel electrode 17C is connected to a drain electrode of a transistor 12C connected to the scanning signal line G(n+1). The pixel electrode 17D is connected to a drain electrode of a transistor 12D connected to the scanning signal line Gn. A source electrode of the transistor 12C is connected to the data signal line SX. A source electrode of the transistor 12D is connected to the data signal line SY. A liquid crystal capacitance C1C is formed between the pixel electrode 17C and the common electrode (counter electrode) com, a liquid crystal capacitance C1D is formed between the pixel electrode 17D and the common electrode (counter electrode) com, a retention capacitance csC is formed between the pixel electrode 17C and the retention capacitor wiring Csn, and a retention capacitance csD is formed between the pixel electrode 17D and the retention capacitor wiring Csn.

In the pixel 107 that is adjacent to the pixel 103 in the row direction, two pixel electrodes 17E and 17F are aligned in this order in the row direction. The pixel electrode 17E is connected to a drain electrode of a transistor 12E connected to the scanning signal line G(n+2). The pixel electrode 17F is connected to a drain electrode of a transistor 12F connected to the scanning signal line G(n+1). A source electrode of the transistor 12E is connected to the data signal line SX. A source electrode of the transistor 12F is connected to the data signal line SY. A liquid crystal capacitance C1E is formed between the pixel electrode 17E and the common electrode (counter electrode) com, a liquid crystal capacitance C1F is formed between the pixel electrode 17F and the common electrode (counter electrode) com, a retention capacitance csE is formed between the pixel electrode 17E and the retention capacitor wiring Cs(n+1), and a retention capacitance csF is formed between the pixel electrode 17F and the retention capacitor wiring Cs(n+1).

In the pixel 108 that is adjacent to the pixel 104 in the row direction, two pixel electrodes 17G and 17H are aligned in this order in the row direction. The pixel electrode 17G is connected to a drain electrode of a transistor 12G connected to the scanning signal line G(n+3). The pixel electrode 17H is connected to a drain electrode of a transistor 12H connected to the scanning signal line G(n+2). A source electrode of the transistor 12G is connected to the data signal line SX. A source electrode of the transistor 12H is connected to the data signal line SY. A liquid crystal capacitance C1G is formed between the pixel electrode 17G and the common electrode (counter electrode) com, a liquid crystal capacitance C1H is formed between the pixel electrode 17H and the common electrode (counter electrode) com, a retention capacitance csG is formed between the pixel electrode 17G and the retention capacitor wiring Cs(n+2), and a retention capacitance csH is formed between the pixel electrode 17H and the retention capacitor wiring Cs(n+2).

Figure 2:
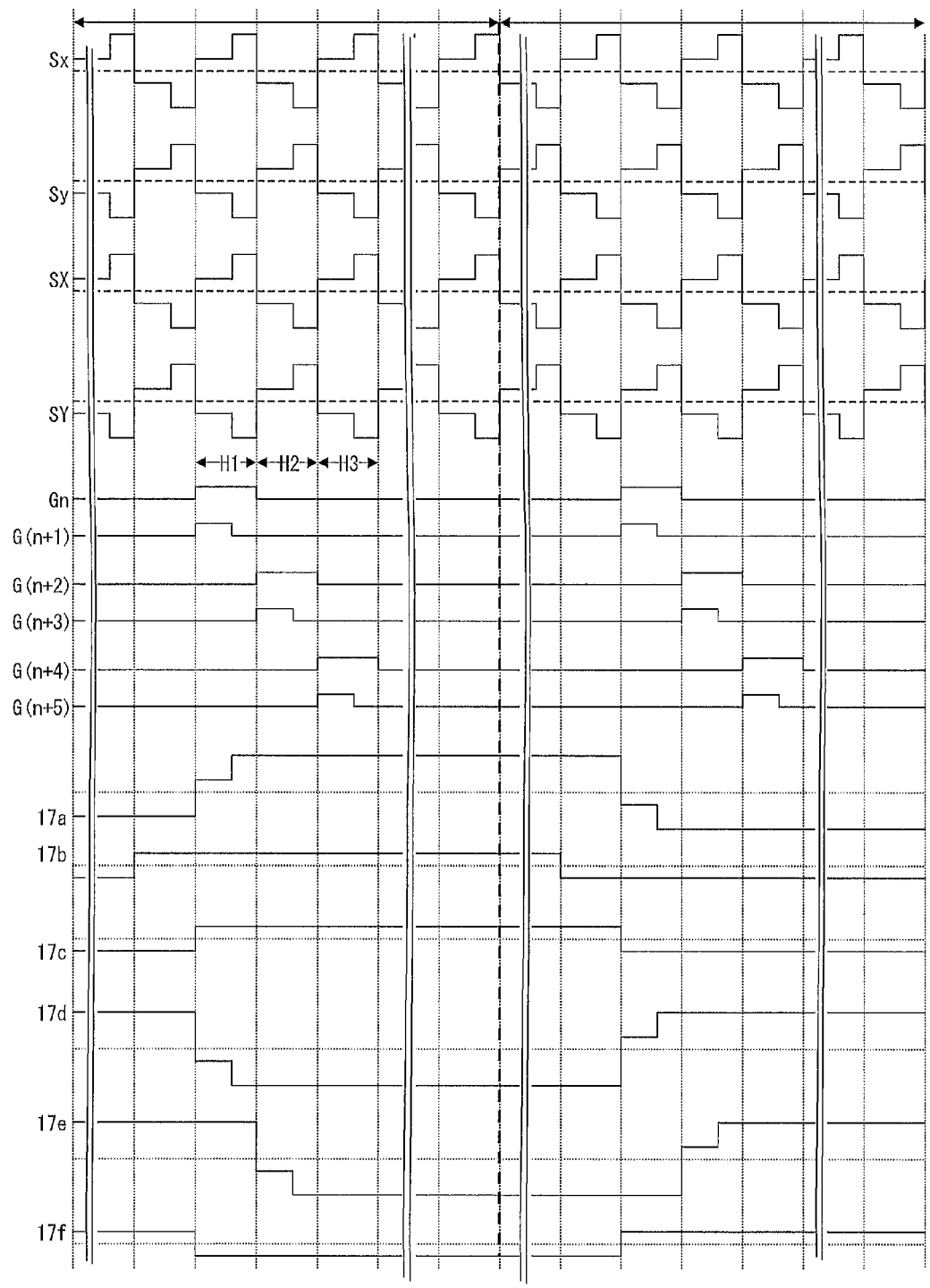
FIG. 2 is a timing chart illustrating a method for driving the liquid crystal panel of FIG. 1.
Figure 3:
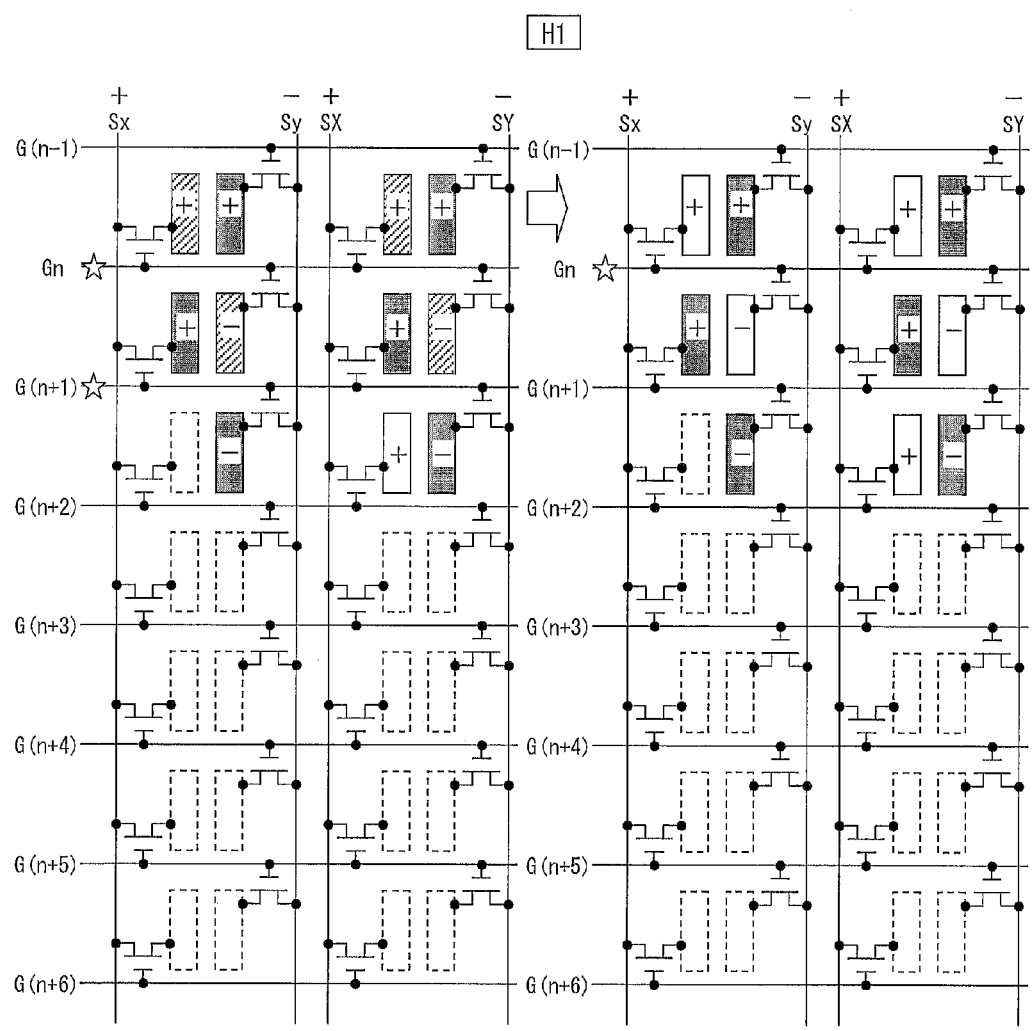
FIG. 3 is a diagram schematically explaining a state of a horizontal scanning period H1.
Figure 4:
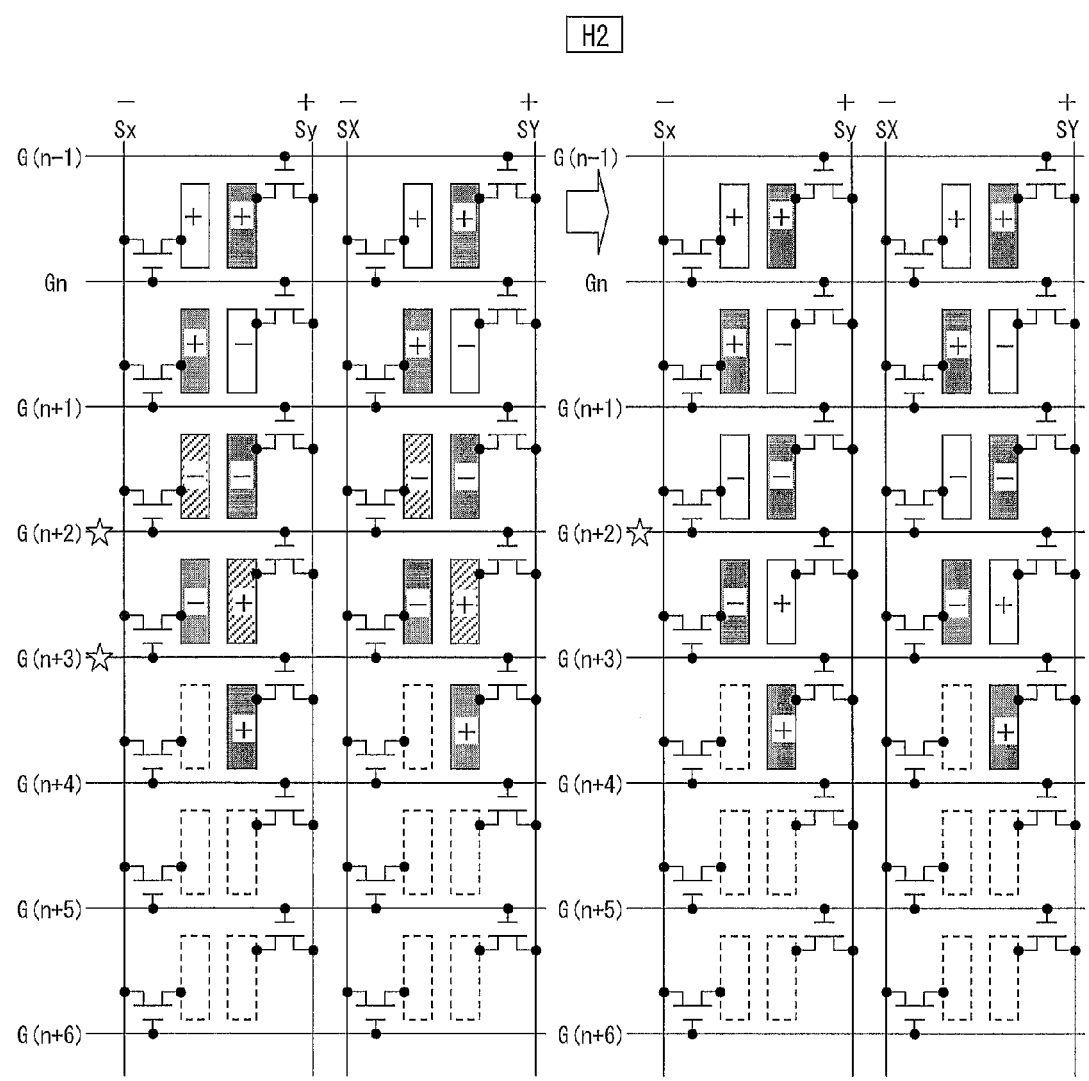
FIG. 4 is a diagram schematically explaining a state of a horizontal scanning period H2.
Figure 5:
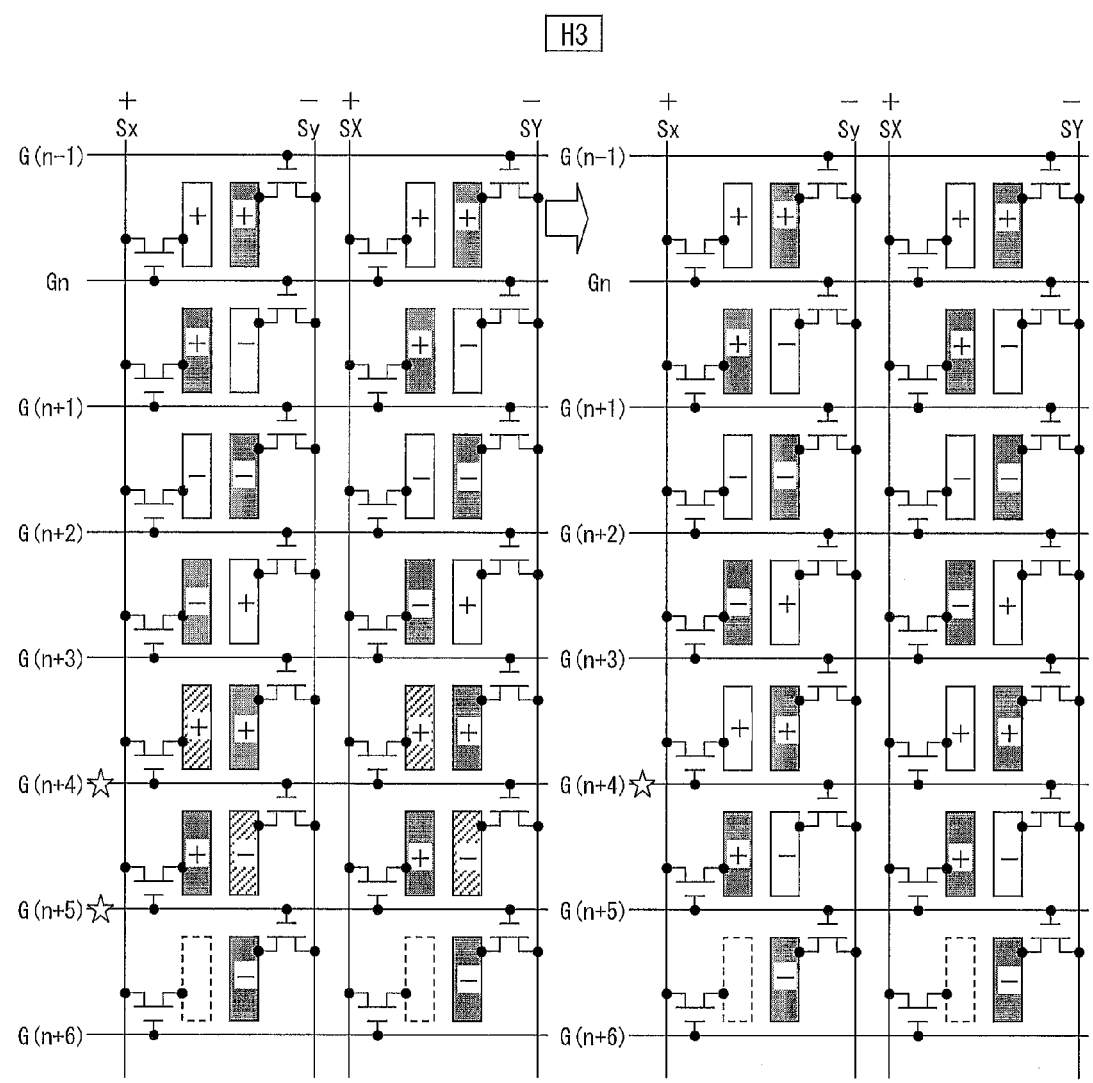
FIG. 5 is a diagram schematically explaining a state of a horizontal scanning period H3.

FIGS. 3 through 5 are diagrams schematically illustrating, for respective three successive horizontal scanning periods (H1 through H3), how the liquid crystal panel 5a is driven in a case where a halftone is displayed in part (seven pixel rows including the four pixel rows of FIG. 1) of the liquid crystal panel 5a. Note that FIG. 3 illustrates a two-scanning-signal-line selection period and a one-scanning-signal-line selection period of H1, FIG. 4 illustrates a two-scanning-signal-line selection period and a one-scanning-signal-line selection period of H2, and FIG. 5 illustrates a two-scanning-signal-line selection period and a one-scanning-signal-line selection period of H3. FIG. 2 is a timing chart (for two frames) illustrating how the liquid crystal panel 5a is driven in a case where a halftone is displayed in the part of the liquid crystal panel 5a. Sx, Sy, SX, and SY in FIG. 2 represent data signals supplied to the data signal lines Sx, Sy, SX, and SY of FIGS. 3 through 5, respectively, Gn through G(n+5) in FIG. 2 represent scanning signals (active High) supplied to the scanning signal lines Gn through G(n+5) of FIGS. 3 through 5, respectively, and 17a through 17f in FIG. 2 represent electric potentials of the pixel electrodes 17a through 17f of FIG. 1, respectively.

According to the driving method illustrated in FIGS. 2 through 5, scanning signal lines are sequentially selected two at a time, and a single horizontal scanning period includes (i) a two-scanning-signal-line selection period in which two scanning signal lines are concurrently selected and (ii) a one-scanning-signal-line selection period which follows the two-scanning-signal-line selection period and in which one of the two scanning signal lines is in a non-selection state. In a case where a halftone is displayed, a low-gradation data signal is supplied to each data signal line in the two-scanning-signal-line selection period, and a high-gradation data signal is supplied to each data signal line in the one-scanning-signal-line selection period. Data signals of reverse polarities are supplied to two data signal lines associated with a single pixel column. Data signals of an identical polarity are supplied to two adjacent data signal lines (e.g., Sy and SX) which are associated with different pixel columns. Note that a polarity of a data signal supplied to each data signal line is reversed every horizontal scanning period (1H).

For example, in the two-scanning-signal-line selection period of H1 out of the three successive horizontal scanning periods H1 through H3, two scanning signal lines Gn and G(n+1) are selected (made active). Accordingly, a positive pre-charge signal (low gradation) is written into the pixel electrode 17a that is connected to the scanning signal line Gn and the data signal line Sx via a transistor, a negative pre-charge signal (low gradation) is written into the pixel electrode 17d that is connected to the scanning signal line Gn and the data signal line Sy via a transistor, a positive low-gradation data signal is written into the pixel electrode 17c that is connected to the scanning signal line G(n+1) and the data signal line Sx via a transistor, and a negative low-gradation data signal is written into the pixel electrode 17f that is connected to the scanning signal line G(n+1) and the data signal line Sy via a transistor (see FIGS. 1, 2, and 3). Further, a negative pre-charge signal (low gradation) is written into the pixel electrode 17A that is connected to the scanning signal line Gn and the data signal line SX via a transistor, a positive pre-charge signal (low gradation) is written into the pixel electrode 17D that is connected to the scanning signal line Gn and the data signal line SY via a transistor, a negative low-gradation data signal is written into the pixel electrode 17C that is connected to the scanning signal line G(n+1) and the data signal line SX via a transistor, and a positive low-gradation data signal is written into the pixel electrode 17F that is connected to the scanning signal line G(n+1) and the data signal line SY via a transistor.

Next, in the one-scanning-signal-line selection period of H1, the scanning signal line G(n+1) is in a non-selection state and only the scanning signal line Gn is selected. Accordingly, a positive high-gradation data signal is written into the pixel electrode 17a that is connected to the scanning signal line Gn and the data signal line Sx via a transistor, and a negative high-gradation data signal is written into the pixel electrode 17d that is connected to the scanning signal line Gn and the data signal line Sy via a transistor (see FIGS. 1, 2, and 3). Further, a negative high-gradation data signal is written into the pixel electrode 17A that is connected to the scanning signal line Gn and the data signal line SX via a transistor, and a positive high-gradation data signal is written into the pixel electrode 17D that is connected to the scanning signal line Gn and the data signal line SY via a transistor.

Consequently, sub-pixels respectively corresponding to the pixel electrodes 17a, 17c, 17d, 17f, 17A, 17C, 17D, and 17F become bright sub-pixel (positive), dark sub-pixel (positive), bright sub-pixel (negative), dark sub-pixel (negative), bright sub-pixel (negative), dark sub-pixel (negative), bright sub-pixel (positive), and dark sub-pixel (positive), respectively.

In the two-scanning-signal-line selection period of H2, the two scanning signal lines G(n+2) and G(n+3) are selected (made active). Accordingly, a negative pre-charge signal (low gradation) is written into the pixel electrode 17e that is connected to the scanning signal line G(n+2) and the data signal line Sx via a transistor, a positive pre-charge signal (low gradation) is written into the pixel electrode 17h that is connected to the scanning signal line G(n+2) and the data signal line Sy via a transistor, a negative low-gradation data signal is written into the pixel electrode 17g that is connected to the scanning signal line G(n+3) and the data signal line Sx via a transistor, and a positive low-gradation data signal is written into a pixel electrode that is connected to the scanning signal line G(n+3) and the data signal line Sy via a transistor (see FIGS. 1, 2, and 4). Further, a positive pre-charge signal (low gradation) is written into the pixel electrode 17E that is connected to the scanning signal line G(n+2) and the data signal line SX via a transistor, a negative pre-charge signal (low gradation) is written into the pixel electrode 17H that is connected to the scanning signal line G(n+2) and the data signal line SY via a transistor, a positive low-gradation data signal is written into the pixel electrode 17G that is connected to the scanning signal line G(n+3) and the data signal line SX via a transistor, and a negative low-gradation data signal is written into a pixel electrode that is connected to the scanning signal line G(n+3) and the data signal line SY via a transistor.

Next, in the one-scanning-signal-line selection period of H2, the scanning signal line G(n+3) is in a non-selection state and only the scanning signal line G(n+2) is selected. Accordingly, a negative high-gradation data signal is written into the pixel electrode 17e that is connected to the scanning signal line G(n+2) and the data signal line Sx via a transistor, and a positive high-gradation data signal is written into the pixel electrode 17h that is connected to the scanning signal line G(n+2) and the data signal line Sy via a transistor (see FIGS. 1, 2, and 4). Further, a positive high-gradation data signal is written into the pixel electrode 17E that is connected to the scanning signal line G(n+2) and the data signal line SX via a transistor, and a negative high-gradation data signal is written into the pixel electrode 17H that is connected to the scanning signal line G(n+2) and the data signal line SY via a transistor.

Consequently, sub-pixels respectively corresponding to the pixel electrode 17e, 17g, 17h, 17E, 17G, and 17H become bright sub-pixel (negative), dark sub-pixel (negative), bright sub-pixel (positive), bright sub-pixel (positive), dark sub-pixel (positive), and bright sub-pixel (negative), respectively.

In the two-scanning-signal-line selection period of H3, the two scanning signal lines G(n+4) and G(n+5) are selected. Next, in the one-scanning-signal-line selection period of H3, the scanning signal line G(n+5) is in a non-selection state and only the scanning signal line G(n+4) is selected. The state of H3 is as illustrated in FIG. 5.

A liquid crystal display device including the liquid crystal panel 5a is an individual-writing type pixel division mode liquid crystal display device, and therefore has good viewing angle characteristics and the following advantages over a capacitively-coupled type liquid crystal display device. Specifically, the individual-writing type liquid crystal panel is highly reliable since no electrically floating pixel electrode is present. Moreover, luminance of bright and dark sub-pixels can be accurately controlled.

The scanning signal lines are selected two at a time, and a data signal can be written into bright sub-pixels connected to the even-numbered scanning signal lines (Gn, G(n+2), ...) in the one-scanning-signal-line selection period after they are pre-charged in the two-scanning-signal-line selection period. Accordingly, in the case of normal driving, a period of time for charging the bright sub-pixels can be made substantially two times longer. Further, since the two-scanning-signal-line selection period in which data signals are written into dark sub-pixels connected to the odd-numbered scanning signal lines (G(n+1), G(n+3), . . . ) is set longer than the one-scanning-signal-line selection period, a period of time for charging the dark sub-pixels can be also extended in the case of normal driving. As such, the present invention is suitable for a large-sized high-definition liquid crystal display device and a liquid crystal display device driven at high speed (driven at 60 Hz or more).

Further, in a case where a halftone is displayed, bright sub-pixels and dark sub-pixels are alternately disposed both in the row direction and in the column direction (bright sub-pixels and dark sub-pixels are disposed in a checkered pattern). This produces an effect that striped unevenness is less likely to be observed.

In addition, a polarity of a data signal written into a screen is reversed every two sub-pixels both in the row direction and in the column direction. This allows suppression of flickering of the screen.

FIG. 6 is a plan view illustrating an exemplary configuration of part of the liquid crystal panel 5a illustrated in FIG. 1. As illustrated in FIG. 6, in the liquid crystal panel 5a, the scanning signal line G(n−1), the scanning signal line Gn, and the scanning signal line G(n+1) which extend in the row direction are disposed in this order in the scanning direction, and the data signal lines Sx, Sy, SX, and SY which extend in the column direction are disposed in this order. From a plan view, the pixel electrodes 17a and 17b are disposed in this order in the row direction in a region surrounded by the scanning signal lines G(n−1) and Gn and the data signal lines Sx and Sy, the pixel electrodes 17A and 17B are disposed in this order in the row direction in a region surrounded by the scanning signal lines G(n−1) and Gn and the data signal lines SX and SY, the pixel electrodes 17c and 17d are disposed in this order in the row direction in a region surrounded by the scanning signal lines Gn and G(n+1) and the data signal lines Sx and Sy, and the pixel electrodes 17C and 17D are disposed in this order in the row direction in a region surrounded by the scanning signal lines Gn and G(n+1) and the data signal lines SX and SY. Further, a retention capacitor wiring Cs(n−1) is disposed between the scanning signal line G(n−1) and the scanning signal line Gn, and a retention capacitor wiring Csn is disposed between the scanning signal line Gn and the scanning signal line G(n+1).

Note that the scanning signal line G(n−1) serves as gate electrodes of the transistors 12b and 12B, the scanning signal line Gn serves as gate electrodes of the transistors 12a and 12A, and the scanning signal line G(n+1) serves as gate electrodes of the transistors 12c and 12C. Source electrodes of the transistors 12a and 12c are connected to the data signal line Sx, source electrodes of the transistors 12b and 12d are connected to the data signal line Sy, source electrodes of the transistors 12A and 12C are connected to the data signal line SX, and source electrode of the transistors 12B and 12D are connected to the data signal line SY.

Further, a drain electrode of the transistor 12a is connected to the pixel electrode 17a via a contact hole 11a, a drain electrode of the transistor 12b is connected to the pixel electrode 17b via a contact hole 11b, a capacitor electrode 67a overlapping the retention capacitor wiring Cs(n−1) is connected to the pixel electrode 17a via a contact hole 91a, and a capacitor electrode 67b overlapping the retention capacitor wiring Cs(n−1) is connected to the pixel electrode 17b via a contact hole 91b. Similarly, a drain electrode of the transistor 12A is connected to the pixel electrode 17A via a contact hole 11A, a drain electrode of the transistor 12B is connected to the pixel electrode 17B via a contact hole 11B, a capacitor electrode 67A overlapping the retention capacitor wiring Cs(n−1) is connected to the pixel electrode 17A via a contact hole 91A, and a capacitor electrode 67B overlapping the retention capacitor wiring Cs(n−1) is connected to the pixel electrode 17B via a contact hole 91B.

Large parts of the retention capacitances csa, csb, csA, and csB (see FIG. 1) are formed in a part where the retention capacitor wiring Cs(n−1) overlaps the capacitor electrode 67a, a part where the retention capacitor wiring Cs(n−1) overlaps the capacitor electrode 67b, a part where the retention capacitor wiring Cs(n−1) overlaps the capacitor electrode 67A, and a part where the retention capacitor wiring Cs(n−1) overlaps the capacitor electrode 67B, respectively.

Further, a drain electrode of the transistor 12c is connected to the pixel electrode 17c via a contact hole 11c, a drain electrode of the transistor 12d is connected to the pixel electrode 17d via a contact hole 11d, a capacitor electrode 67c overlapping the retention capacitor wiring Csn is connected to the pixel electrode 17c via a contact hole 91c, and a capacitor electrode 67d overlapping the retention capacitor wiring Csn is connected to the pixel electrode 17d via a contact hole 91d. Similarly, a drain electrode of the transistor 12C is connected to the pixel electrode 17C via a contact hole 11C, a drain electrode of the transistor 12D is connected to the pixel electrode 17D via a contact hole 11D, a capacitor electrode 67C overlapping the retention capacitor wiring Csn is connected to the pixel electrode 17C via a contact hole 91C, and a capacitor electrode 67D overlapping the retention capacitor wiring Csn is connected to the pixel electrode 17D via a contact hole 91D.

Large parts of the retention capacitances csc, csd, csC, and csD (see FIG. 1) are formed in a part where the retention capacitor wiring Csn overlaps the capacitor electrode 67c, a part where the retention capacitor wiring Csn overlaps the capacitor electrode 67d, a part where the retention capacitor wiring Csn overlaps the capacitor electrode 67C, and a part where the retention capacitor wiring Csn overlaps the capacitor electrode 67D, respectively.

In FIG. 6, channel sizes (W/L) of the transistors 12a, 12d, 12A, and 12D are equal to channel sizes (W/L) of the transistors 12b, 12c, 12B, and 12C, respectively. However, the present embodiment is not limited to this. The channel sizes of the transistors 12a, 12d, 12A, and 12D each of which is connected to a bright pixel electrode for which a long charging time can be secured may be smaller than the channel sizes of the transistors 12b, 12c, 12B, and 12C each of which is connected to a dark pixel electrode. This allows an increase in aperture ratio.

Figure 7:
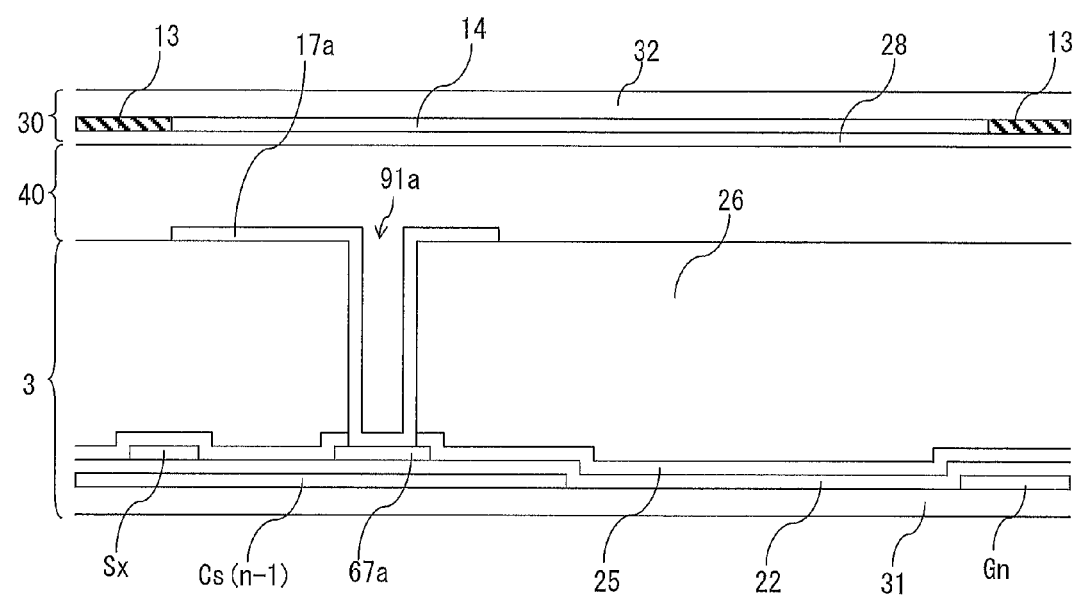
FIG. 7 is a cross-sectional view of FIG. 6.

FIG. 7 is a cross-sectional view of FIG. 6. As illustrated in FIG. 7, the liquid crystal panel 5a includes an active matrix substrate 3, a color filter substrate 30 facing the active matrix substrate 3, and a liquid crystal layer 40 sandwiched between the two substrates (3 and 30).

The active matrix substrate 3 has the scanning signal line Gn and the retention capacitor wiring Cs(n−1) provided on a glass substrate 31, and on these members, a gate insulating film 22 is provided so as to cover these members. On the gate insulating film 22, a semiconductor layer (i layer and n+ layer), a source electrode that is in contact with the n+ layer, a drain electrode (not present on the cross section), and the capacitor electrode 67a are provided. On these members, an inorganic interlayer insulating film 25 is provided so as to cover these members. On the inorganic interlayer insulating film 25, an organic interlayer insulating film 26 which has a larger thickness than the inorganic interlayer insulating film 25 is provided. On the organic interlayer insulating film 26, the pixel electrode 17a is provided. Note that an alignment film (not illustrated) is provided so as to cover a surface of the active matrix substrate 3. The inorganic interlayer insulating film 25 and the organic interlayer insulating film 26 are hollowed out at the contact hole 91a, thereby allowing connection between the pixel electrode 17a and the capacitor electrode 67a. The capacitor electrode 67a overlaps the retention capacitor wiring Cs(n−1) via the gate insulating film 22. A large part of the retention capacitance csa (see FIG. 1) is formed in a part where the capacitor electrode 67a overlaps the retention capacitor wiring Cs(n−1).

Meanwhile, the color filter substrate 30 includes a black matrix 13 and a colored layer 14 provided on a glass substrate 32. A common electrode (com) 28 is provided on an upper layer of the black matrix 13 and colored layer 14. Further, an alignment film (not illustrated) is formed on the color filter substrate 30 so as to cover a surface of the color filter substrate 30.

The following describes a method for producing the present liquid crystal panel. The method for producing the present liquid crystal panel includes an active matrix substrate producing step, a color filter substrate producing step, and an assembling step of bonding the two substrates and filling a gap between the two substrates with liquid crystals.

First, a metal film made of a metal such as titanium, chromium, aluminum, molybdenum, tantalum, tungsten or copper, an alloy film of these metals, or a laminated film of these metals is formed on a substrate made of a material such as glass or plastic so as to have a thickness of 1000 Å to 3000 Å by a method such as sputtering. The film thus formed is patterned by a photolithography technique (Photo Engraving Process (hereinafter referred to as "PEP technique") which includes an etching process) so as to remove photoresist. Thus, scanning signal lines (gate electrodes of the transistors) and retention capacitor wirings are formed.

Next, on the entire substrate on which the scanning signal lines are formed, an inorganic insulating film (thickness: approximately 3000 Å to 5000 Å) such as a silicon nitride film or a silicon oxide film is formed by a CVD (chemical vapor deposition) method, so as to form a gate insulating film.

Subsequently, on the gate insulating film (entire substrate), an intrinsic amorphous silicon film (thickness: 1000 Å to 3000 Å) and an n+ amorphous silicon film (thickness: 400 Å to 700 Å) doped with phosphorus are successively formed by a CVD method. Thereafter, the films are patterned by the PEP technique so as to remove photoresist. Thus, a silicon laminate constituted by the intrinsic amorphous silicon layer and the n+ amorphous silicon layer is formed in the shape of islands.

Subsequently, on the entire substrate on which the silicon laminate is formed, a metal film made of a metal such as titanium, chromium, aluminum, molybdenum, tantalum, tungsten or copper, an alloy film of these metals, or a laminated film of these metals is formed so as to have a thickness of 1000 Å to 3000 Å by sputtering. Thereafter, the film is patterned by the PEP technique so as to form data signal lines, and source electrodes, drain electrodes, and capacitor electrodes of transistors (formation of a metal layer). In this process, resist is removed according to need.

The n+ amorphous silicon layer constituting the silicon laminate is removed by etching by using, as a mask, (i) photoresist used at the time of formation of the metal wiring or (ii) the source electrode and drain electrode, and the photoresist is removed. Thus, channels of the transistors are formed. The semiconductor layer may be formed from an amorphous silicon film as described above, but may be formed from a polysilicon film. Alternatively, the amorphous silicon film and the polysilicon film may be subjected to laser annealing treatment so as to improve crystallinity. This increases moving velocity of electrons in the semiconductor layer, thereby improving characteristics of the transistors (TFTs).

Next, an interlayer insulating film is formed on the entire substrate on which the data signal lines etc. are formed. Specifically, the inorganic interlayer insulating film 25 (passivation film) made of SiNx having a thickness of approximately 3000 Å is formed by CVD with the use of a mixed gas of $SiH_4$ gas, $NH_3$ gas and $N_2$ gas so as to cover the entire surface of the substrate. Thereafter, an organic interlayer insulating film 26 made of positive-type photosensitive acrylic resin is formed by spin coating or die coating, so as to have a thickness of approximately 3 μm.

Subsequently, contact patterns are formed on the organic interlayer insulating film 26 by the PEP technique. Furthermore, the organic interlayer insulating film 26 that is patterned is used as a mask to dry etch the inorganic interlayer insulating film 25, by use of a mixed gas of $CF_4$ gas and $O_2$ gas. The organic interlayer insulating film 26 may be, for example, an insulating film made of SOG (spin-on glass) material. Further, the organic interlayer insulating film 26 may include at least one of acrylic resin, epoxy resin, polyimide resin, polyurethane resin, novolac resin, and siloxane resin.

Subsequently, on the entire substrate on which the interlayer insulating film provided with contact holes is formed, a transparent conductive film (thickness: 1000 Å to 2000 Å) made of ITO (Indium Tin Oxide), IZO (Indium Zinc Oxide), zinc oxide, tin oxide, or the like is formed by sputtering. Thereafter, the transparent conductive film is patterned by the PEP technique, and resist is removed. Thus, the pixel electrodes are formed.

Finally, on the entire substrate on which the pixel electrodes are formed, polyimide resin is printed to the thickness of 500 Å to 1000 Å. Thereafter, the substrate is burned and is subjected to rubbing treatment in one direction with the use of a rotating cloth, so as to form an alignment film. In this way, the active matrix substrate is produced.

The following describes the color filter substrate producing step.

First, a chromium thin film or resin containing a black pigment is formed on a substrate (entire substrate) made of a material such as glass or plastic. Thereafter, the film is patterned by the PEP technique so as to form a black matrix. Next, patterns of red, green, and blue color filter layer (thickness: approximately 2 μm) are formed in gaps of the black matrix by a method such as a pigment dispersion method.

Subsequently, on the entire substrate on which the color filter layer is formed, a transparent conductive film (thickness: approximately 1000 Å) made of a material such as ITO, IZO, zinc oxide, or tin oxide is formed so as to form a common electrode (com).

Finally, on the entire substrate on which the common electrode is formed, a polyimide resin is printed to the thickness of 500 Å to 1000 Å. Thereafter, the substrate is burned and is subjected to rubbing treatment in one direction with the use of rotation cloth so as to form an alignment film. In this way, the color filter substrate can be produced.

The following describes an assembling step.

First, a sealing material made of thermosetting epoxy resin or the like is applied onto one of the active matrix substrate and the color filter substrate by screen printing so as to form a frame-shaped pattern with a liquid crystal injection opening. Then, onto the other one of the active matrix substrate and the color filter substrate, sphere-shaped spacers each of which has a diameter equivalent to the thickness of the liquid crystal layer and which is made of plastic or silica are sprayed. Instead of spraying the spacers, spacers may be formed on the BM of the CF substrate or on the metal wirings of the active matrix substrate by the PEP technique.

Next, the active matrix substrate and the color filter substrate are bonded to each other, and the sealing material is cured.

Finally, a liquid crystal material is injected into a space surrounded by the active matrix substrate, the color filter substrate, and the sealing material by a reduced pressure method. Thereafter, a UV cure resin is applied to the liquid crystal injection opening, and the liquid crystal material is sealed in by UV irradiation. Thus, a liquid crystal layer is formed. In this, way, the liquid crystal panel is produced.

In a liquid crystal panel of a MVA (multi-domain vertical alignment) mode, slits for alignment controlling are provided on each pixel electrode of the active matrix substrate, and ribs (linear projections) for alignment controlling are provided on the color filter substrate, for example. Note that, instead of the ribs, slits for alignment controlling may be provided on the common electrode of the color filter substrate. Further, photo-aligned liquid crystal whose alignment is determined by irradiation of ultraviolet rays or the like may be used. In this case, high viewing angle can be achieved without the use of constructions such as ribs and slits, and an aperture ratio can be greatly improved.

Note that, in the configuration of FIGS. 6 and 7, an intermediate wiring to which a signal different from a data signal is supplied may be provided in a gap (in an identical layer to the data signal lines) or on the gap (in an identical layer to the pixel electrodes) between two adjacent data signal lines associated with different pixel columns. For example, the intermediate wiring is provided in a gap between the data signal lines Sy and SX. This allows a reduction in cross talk between the data signal line SX and the pixel electrode 17a and cross talk between the data signal line Sy and the pixel electrode 17A, for example. In FIGS. 6 and 7, the retention capacitor wirings are provided in an identical layer to the scanning signal lines and extend in the row direction (horizontal direction in the drawings). However, the present embodiment is not limited to this. The retention capacitor wirings may be provided on an identical layer (metal layer) to the data signal lines and may extend in the column direction (vertical direction in the drawings).

For example, in FIG. 34, a retention capacitor wiring Csz which extends in the column direction is provided in the metal layer so as to overlap a gap between the pixel electrodes 17a and 17b and a gap between the pixel electrodes 17c and 17d, and a retention capacitance is formed in each of parts where the retention capacitor wiring Csz overlaps the pixel electrodes 17a, 17b, 17c, and 17d. Further, a retention capacitor wiring CsZ which extends in the column direction is provided in the metal layer so as to overlap a gap between the pixel electrodes 17A and 17B and a gap between the pixel electrodes 17C and 17D, and a retention capacitance is formed in each of parts where the retention capacitor wiring CsZ overlaps the pixel electrodes 17A, 17B, 17C, and 17D. With the configuration, it is possible to efficiently conceal alignment disorder of liquid crystals and light leakage between the pixel electrodes. This makes it possible to narrow or omit the black matrix provided, corresponding to a gap between pixel electrodes, on the color filter substrate, thereby increasing an aperture ratio. Note that, in the configuration as shown in FIG. 34, a channel protection film (interlayer insulating film) may be formed only from an inorganic insulating film in order to secure retention capacitance.

Figure 8:
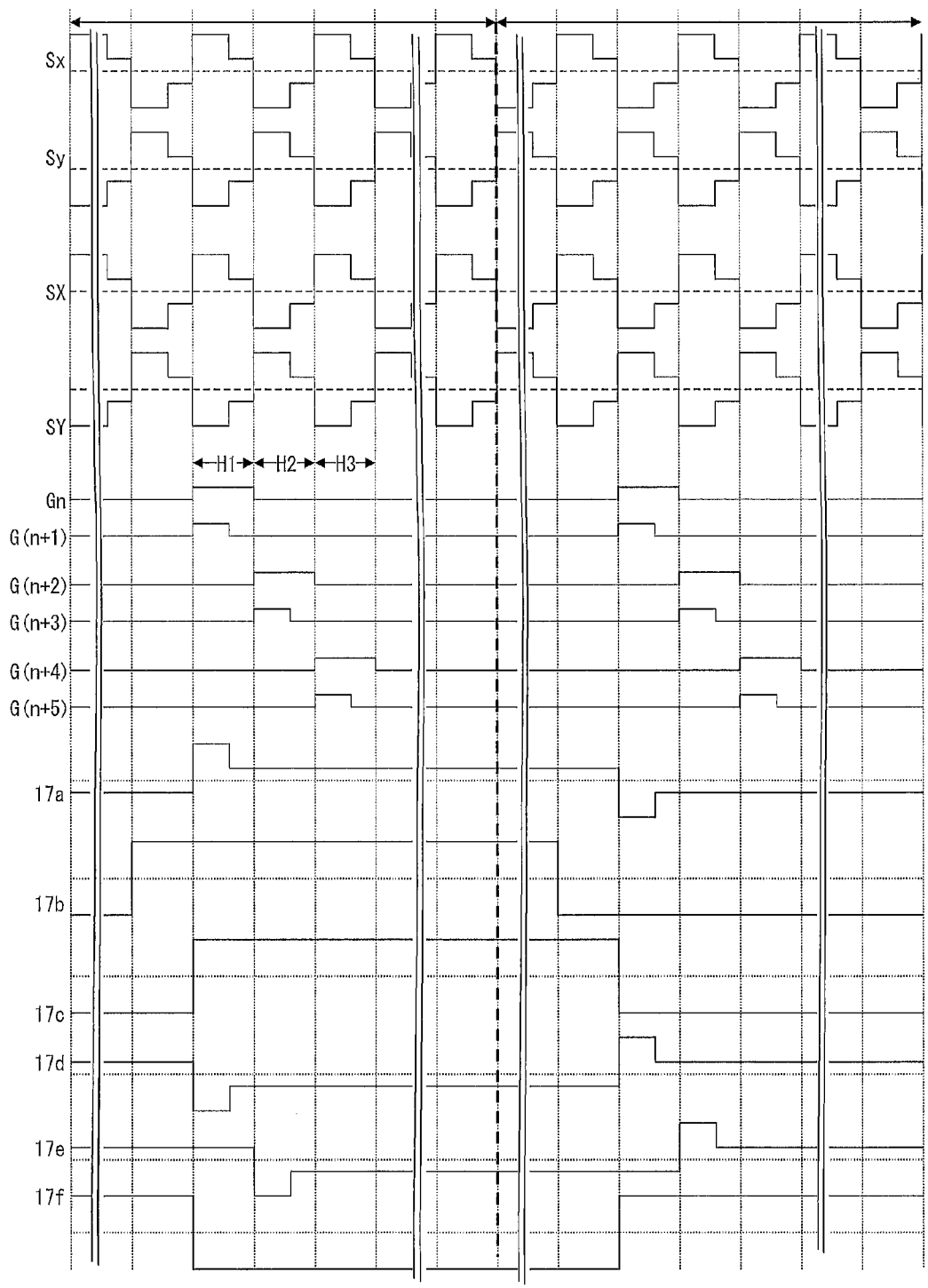
FIG. 8 is a timing chart illustrating another method for driving the liquid crystal panel of FIG. 1.

According to the driving method of the liquid crystal panel 5a shown in FIG. 2, a low-gradation data signal is supplied to each data signal line in the two-scanning-signal-line selection period, and a high-gradation data signal is supplied to each data signal line in the one-scanning-signal-line selection period. However, the present embodiment is not limited to this. Another arrangement is also possible in which a high-gradation data signal is supplied to each data signal line in the two-scanning-signal-line selection period and a low-gradation data signal is supplied to each data signal line in the one-scanning-signal-line selection period as illustrated in FIG. 8.

Figure 9:
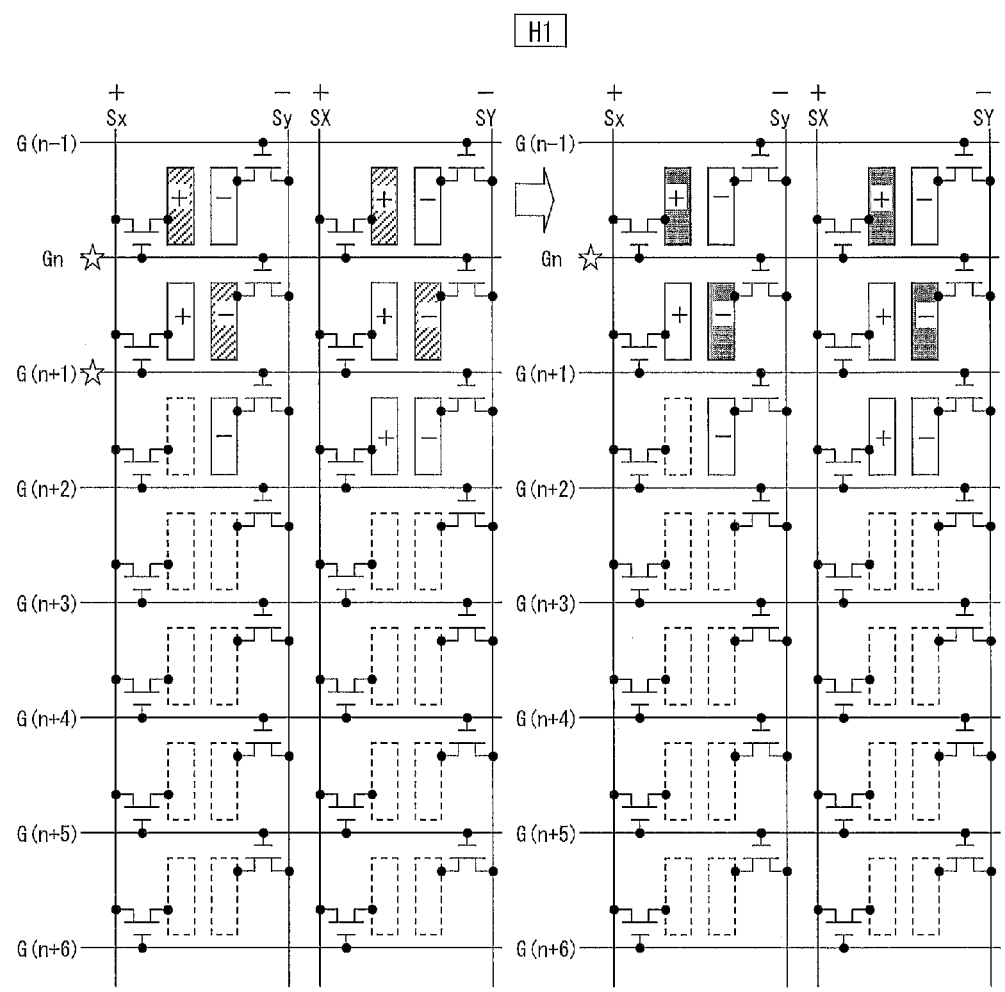
FIG. 9 is a diagram schematically explaining a state of H1 of FIG. 8.
Figure 10:
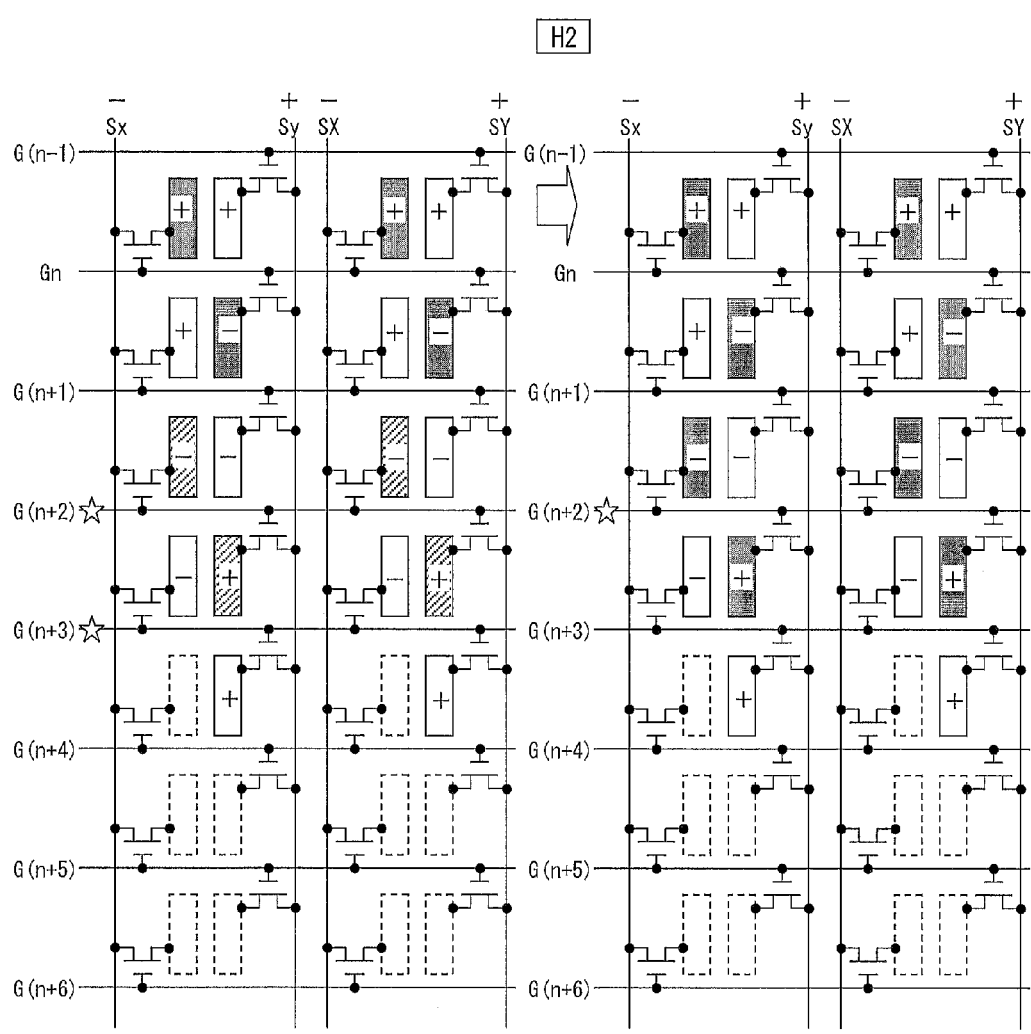
FIG. 10 is a diagram schematically explaining a state of H2 of FIG. 8.

In this case, in the two-scanning-signal-line selection period of H1 out of the three successive horizontal scanning periods H1 through H3, the two scanning signal lines Gn and G(n+1) are selected (made active) as illustrated in FIG. 9. Accordingly, a positive pre-charge signal (high gradation) is written into the pixel electrode 17a that is connected to the scanning signal line Gn and the data signal line Sx via a transistor, a negative pre-charge signal (high gradation) is written into the pixel electrode 17d that is connected to the scanning signal line Gn and the data signal line Sy via a transistor, a positive high-gradation data signal is written into the pixel electrode 17c that is connected to the scanning signal line G(n+1) and the data signal line Sx via a transistor, and a negative high-gradation data signal is written into the pixel electrode 17f that is connected to the scanning signal line G(n+1) and the data signal line Sy via a transistor (see FIGS. 1, 8, and 9). Further, a negative pre-charge signal (high gradation) is written into the pixel electrode 17A that is connected to the scanning signal line Gn and the data signal line SX via a transistor, a positive pre-charge signal (high gradation) is written into the pixel electrode 17D that is connected to the scanning signal line Gn and the data signal line SY via a transistor, a negative high-gradation data signal is written into the pixel electrode 17C that is connected to the scanning signal line G(n+1) and the data signal line SX via a transistor, and a positive high-gradation data signal is written into the pixel electrode 17F that is connected to the scanning signal line G(n+1) and the data signal line SY via a transistor.

Next, in the one-scanning-signal-line selection period of H1, the scanning signal line G(n+1) is in a non-selection state and only the scanning signal line Gn is selected. Accordingly, a positive low-gradation data signal is written into the pixel electrode 17a that is connected to the scanning signal line Gn and the data signal line Sx via a transistor, and a negative low-gradation data signal is written into the pixel electrode 17d that is connected to the scanning signal line Gn and the data signal line Sy via a transistor (see FIGS. 1, 8, and 9). Further, a negative low-gradation data signal is written into the pixel electrode 17A that is connected to the scanning signal line Gn and the data signal line SX via a transistor, and a positive low-gradation data signal is written into the pixel electrode 17D that is connected to the scanning signal line Gn and the data signal line SY via a transistor.

Consequently, sub-pixels respectively corresponding to the pixel electrodes 17a, 17c, 17d, 17f, 17A, 17C, 17D, and 17F become dark sub-pixel (positive), bright sub-pixel (positive), dark sub-pixel (negative), bright sub-pixel (negative), dark sub-pixel (negative), bright sub-pixel (negative), dark sub-pixel (positive), and bright sub-pixel (positive), respectively.

In the two-scanning-signal-line selection period of H2, the two scanning signal lines G(n+2) and G(n+3) are selected (made active). Accordingly, a negative pre-charge signal (high gradation) is written into the pixel electrode 17e that is connected to the scanning signal line G(n+2) and the data signal line Sx via a transistor, a positive pre-charge signal (high gradation) is written into the pixel electrode 17*h* that is connected to the scanning signal line G(n+2) and the data signal line Sy via a transistor, a negative high-gradation data signal is written into the pixel electrode 17*g* that is connected to the scanning signal line G(n+3) and the data signal line Sx via a transistor, and a positive high-gradation data signal is written into a pixel electrode that is connected to the scanning signal line G(n+3) and the data signal line Sy via a transistor (see FIGS. 1, 8, and 10). Further, a positive pre-charge signal (high gradation) is written into the pixel electrode 17E that is connected to the scanning signal line G(n+2) and the data signal line SX via a transistor, a negative pre-charge signal (high gradation) is written into the pixel electrode 17H that is connected to the scanning signal line G(n+2) and the data signal line SY via a transistor, a positive high-gradation data signal is written into the pixel electrode 17G that is connected to the scanning signal line G(n+3) and the data signal line SX via a transistor, and a negative high-gradation data signal is written into a pixel electrode that is connected to the scanning signal line G(n+3) and the data signal line SY via a transistor.

Next, in the one-scanning-signal-line selection period of H2, the scanning signal line G(n+3) is in a non-selection state and only the scanning signal line G(n+2) is selected. Accordingly, a negative low-gradation data signal is written into the pixel electrode 17*e* that is connected to the scanning signal line G(n+2) and the data signal line Sx via a transistor, and a positive low-gradation data signal is written into the pixel electrode 17*h* that is connected to the scanning signal line G(n+2) and the data signal line Sy via a transistor (see FIGS. 1, 8, and 10). Further, a positive low-gradation data signal is written into the pixel electrode 17E that is connected to the scanning signal line G(n+2) and the data signal line SX via a transistor; and a negative low-gradation data signal is written into the pixel electrode 17H that is connected to the scanning signal line G(n+2) and the data signal line SY via a transistor.

Consequently, sub-pixels respectively corresponding to the pixel electrodes 17*e*, 17*g*, 17*h*, 17E, 17G, and 17H become dark sub-pixel (negative), bright sub-pixel (negative), dark sub-pixel (positive), dark sub-pixel (positive), bright sub-pixel (positive), and dark sub-pixel (negative), respectively.

Figure 11:
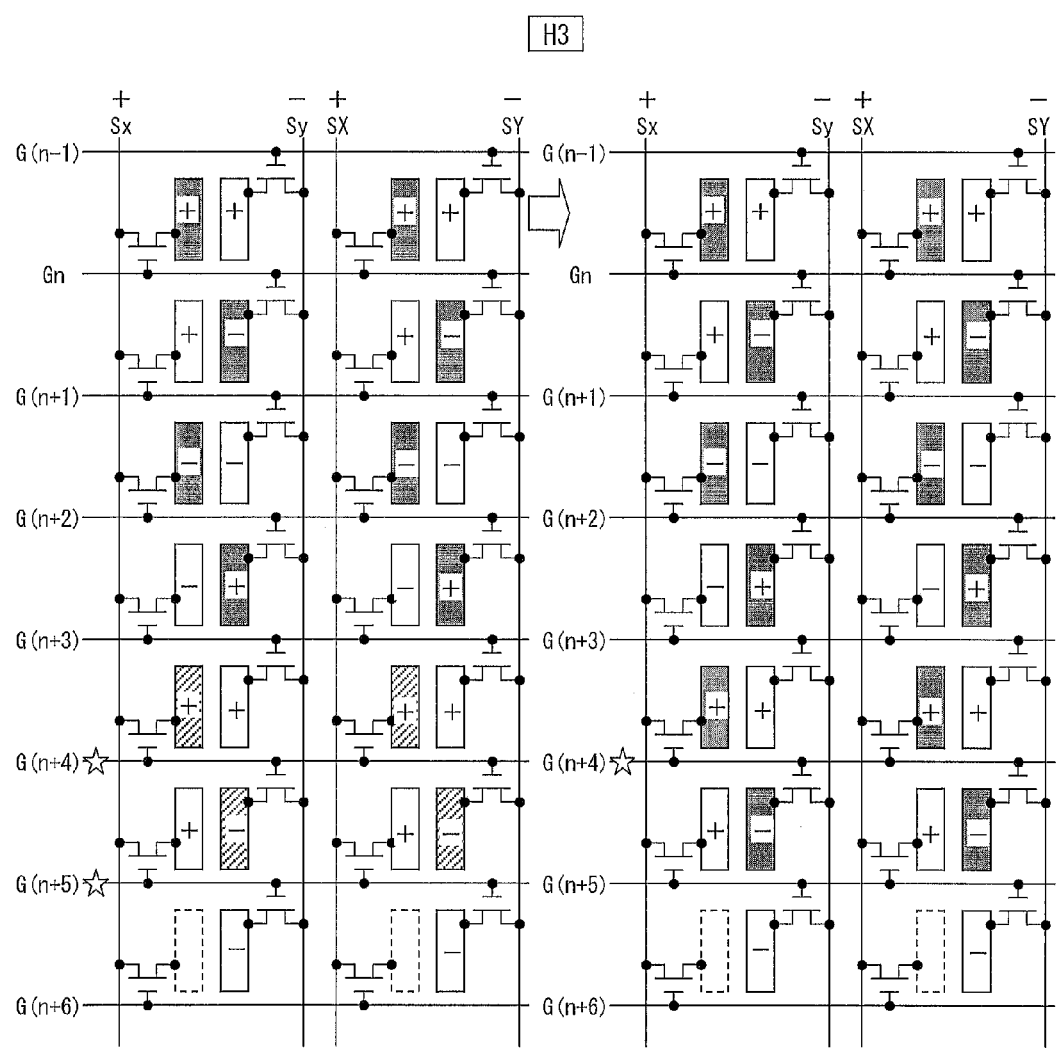
FIG. 11 is a diagram schematically explaining a state of H3 of FIG. 8.
Figure 12:
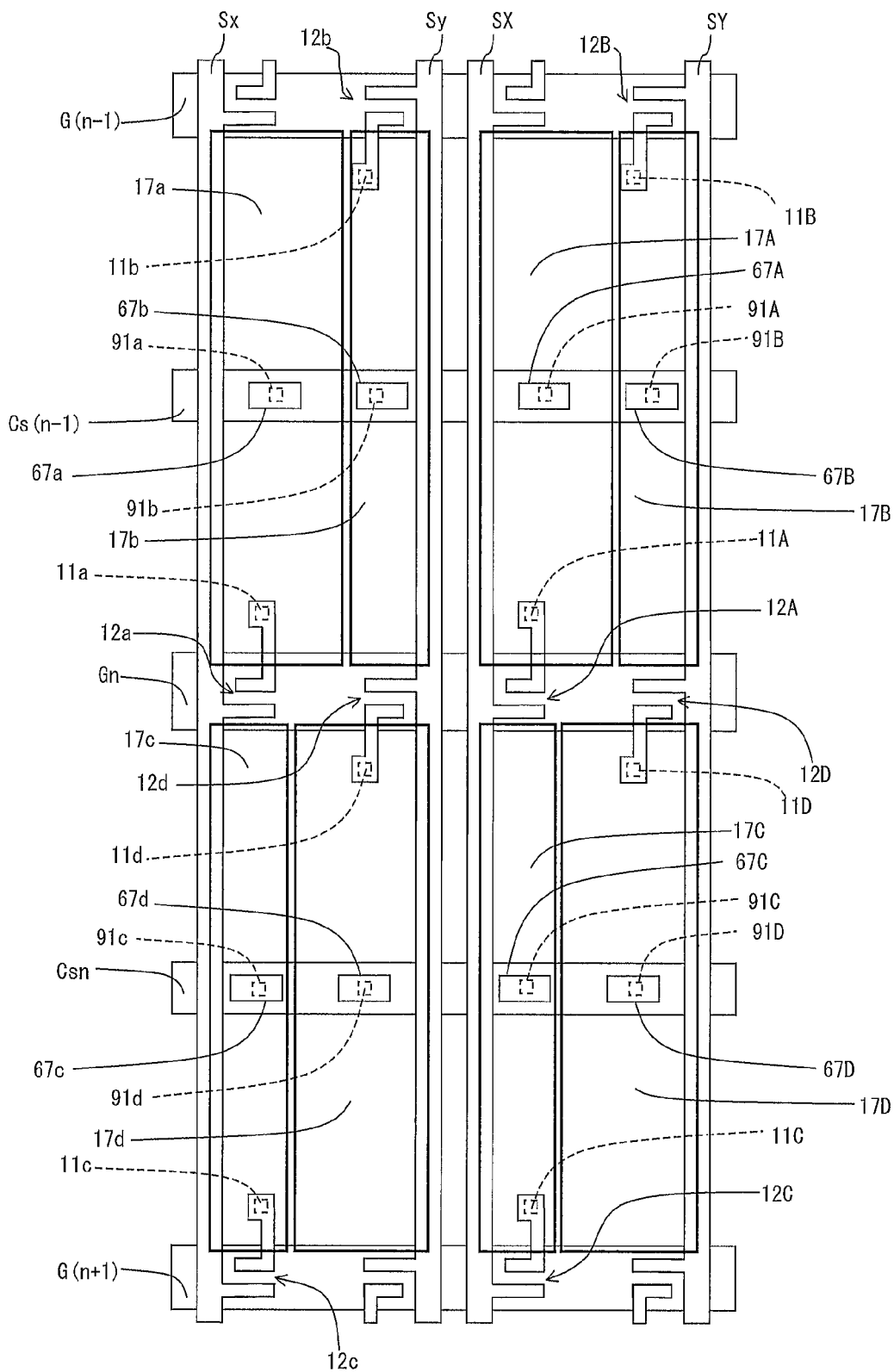
FIG. 12 is a plan view illustrating another specific configuration of the liquid crystal panel of FIG. 1.

In the two-scanning-signal-line selection period of H3, the two scanning signal lines G(n+4) and G(n+5) are selected. Next, in the one-scanning-signal-line selection period of H3, the scanning signal line G(n+5) is in a non-selection state and only the scanning signal line G(n+4) is selected. The state of H3 is as illustrated in FIG. 11.

According to the driving method of FIG. 8, the scanning signal lines are selected two at a time, and a data signal can be written into dark sub-pixels connected to the even-numbered scanning signal lines (Gn, G(n+2), . . . ) in the one-scanning-signal-line selection period after they are pre-charged in the two-scanning-signal-line selection period. Accordingly, in the case of normal driving, a period of time for charging the dark sub-pixels can be made substantially two times longer. Further, since the two-scanning-signal-line selection period in which a data signal is written into bright sub-pixels connected to the odd-numbered scanning signal lines (G(n+1), G(n+3), . . . ) is set longer than the one-scanning-signal-line selection period, a period of time for charging the bright sub-pixels can be also extended in the case of normal driving. As such, the present invention is suitable for a large-sized high-definition liquid crystal display device and a liquid crystal display device driven at high speed (driven at 60 Hz or more). The driving method of FIG. 8 is suitable especially for a case where the pixel electrodes 17*a*, 17*d*, 17A, and 17D (dark pixel electrodes) connected to the even-numbered scanning signal lines (Gn, G(n+2), . . . ) are larger in area than the pixel electrodes 17*b*, 17*c*, 17B, and 17C (bright pixel electrodes) connected to the odd-numbered scanning signal lines (G(n+1), G(n+3), . . . ). This is because a period of time for charging the dark pixel electrodes, which are large in area (hard to charge), can be made two times longer, and an overshooting effect produced by writing of a low-gradation data signal after writing of a high-gradation data signal for pre-charging can also be expected. Note that the area of a dark pixel electrode is preferably 1 to 4 times larger than that of a bright pixel electrode.

Figure 13:
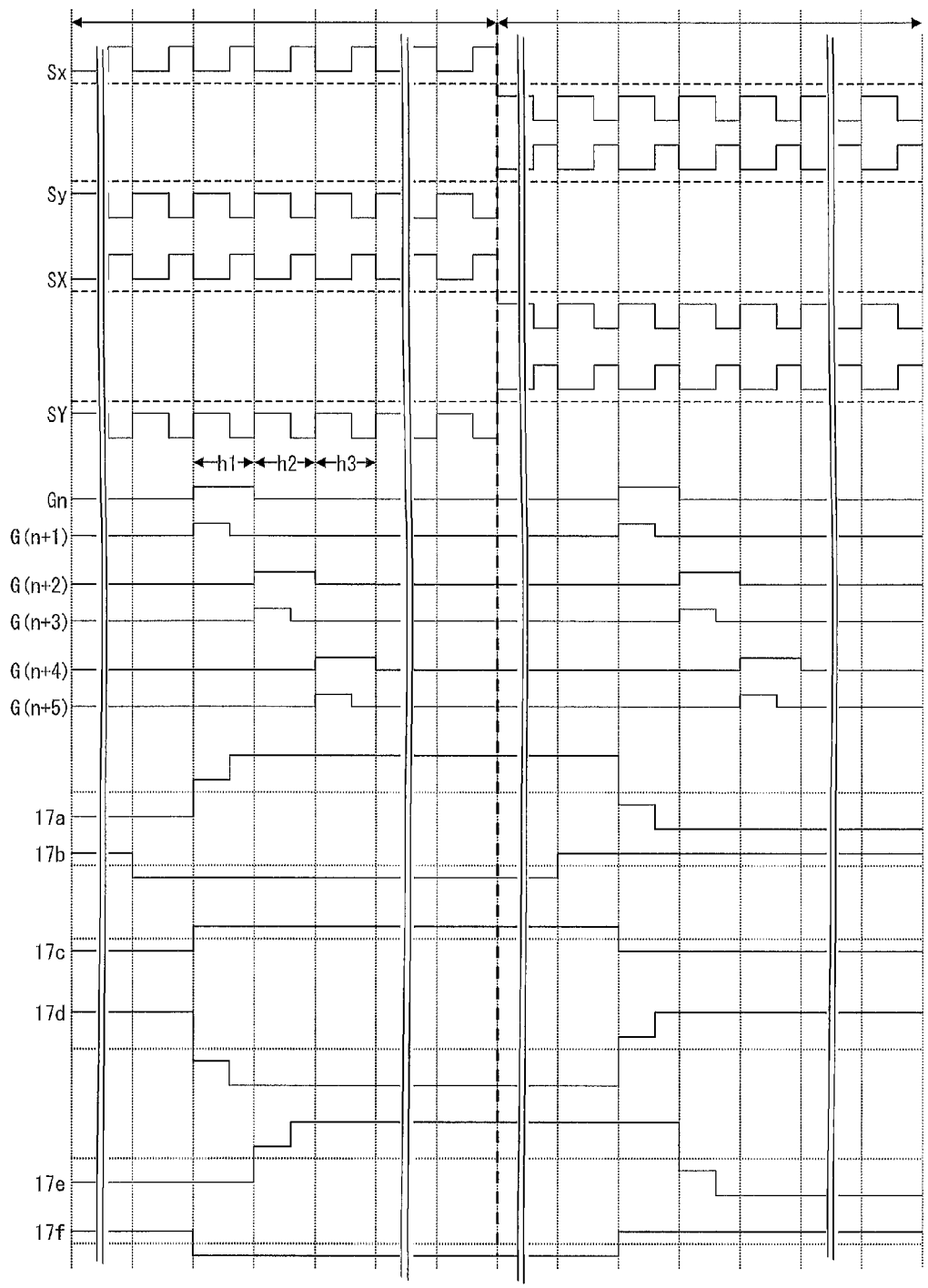
FIG. 13 is a timing chart illustrating still another method for driving the liquid crystal panel of FIG. 1.

According to the driving method of the liquid crystal panel 5*a* shown in FIG. 2, data signals of an identical polarity are supplied to two adjacent data signal lines (e.g., Sy and SX) that are associated with different pixel columns, and a polarity of a data signal supplied to each data signal line is reversed every horizontal scanning period (1H). However, the present embodiment is not limited to this. It is also possible that data signals of reverse polarities are supplied to two adjacent data signal lines (e.g., Sy and SX) that are associated with different pixel columns and a polarity of a data signal supplied to each data signal line is reversed every vertical scanning period (1 frame period) as illustrated in FIG. 13. Note that data signals of reverse polarities are supplied to two data signal lines associated with a single pixel column.

Figure 14:
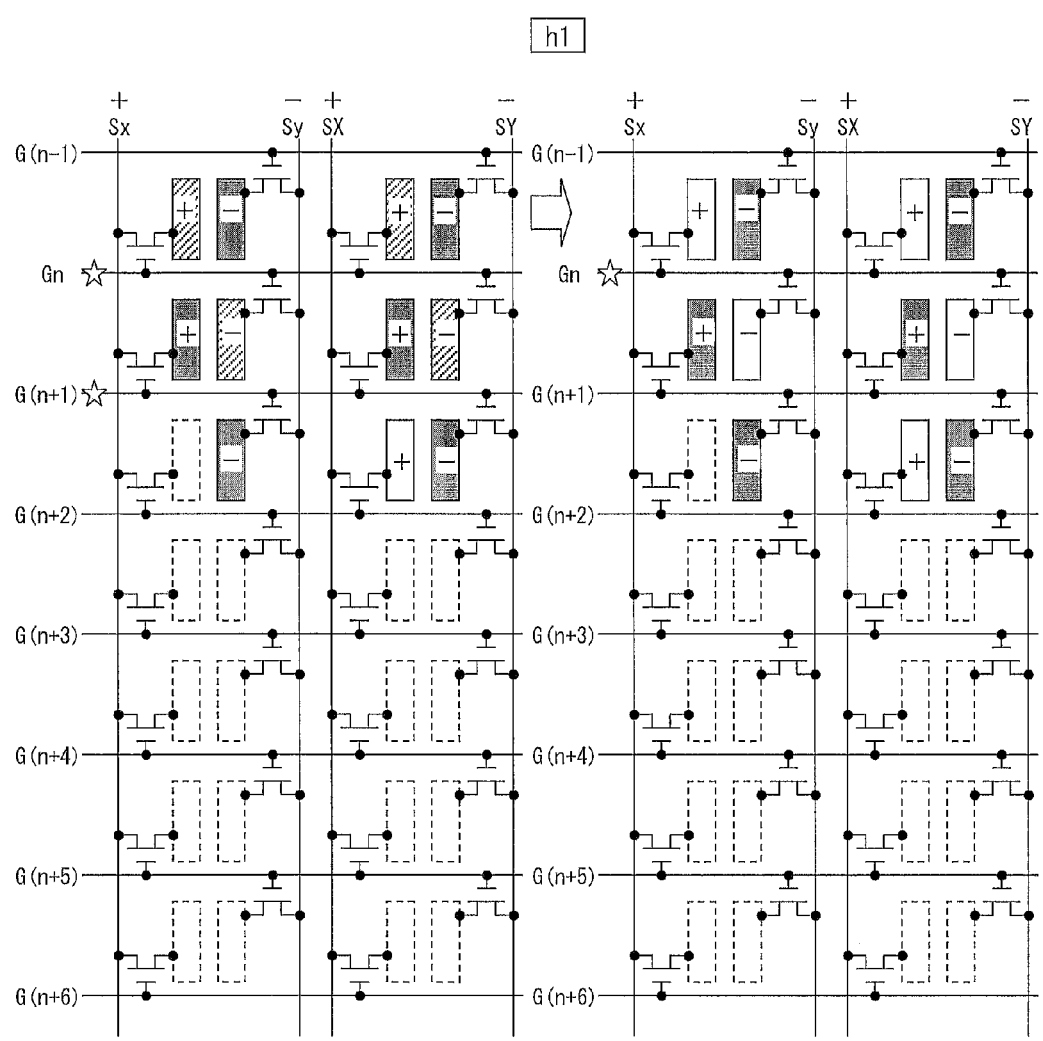
FIG. 14 is a diagram schematically explaining a state of h1 of FIG. 13.

For example, in the two-scanning-signal-line selection period of h1 out of the three successive horizontal scanning periods h1 through h3, the two scanning signal lines Gn and G(n+1) are selected (see FIGS. 13 and 14). Accordingly, a positive pre-charge signal (low gradation) is written into the pixel electrode 17*a* that is connected to the scanning signal line Gn and the data signal line Sx via a transistor, a negative pre-charge signal (low gradation) is written into the pixel electrode 17*d* that is connected to the scanning signal line Gn and the data signal line Sy via a transistor, a positive low-gradation data signal is written into the pixel electrode 17*c* that is connected to the scanning signal line G(n+1) and the data signal line Sx via a transistor, and a negative low-gradation data signal is written into the pixel electrode 17*f* that is connected to the scanning signal line G(n+1) and the data signal line Sy via a transistor (see FIGS. 1, 13, and 14). Further, a negative pre-charge signal (low gradation) is written into the pixel electrode 17A that is connected to the scanning signal line Gn and the data signal line SX via a transistor, a positive pre-charge signal (low gradation) is written into the pixel electrode 17D that is connected to the scanning signal line Gn and the data signal line SY via a transistor, a negative low-gradation data signal is written into the pixel electrode 17C that is connected to the scanning signal line G(n+1) and the data signal line SX via a transistor, and a positive low-gradation data signal is written into the pixel electrode 17F that is connected to the scanning signal line G(n+1) and the data signal line SY via a transistor.

Next, in the one-scanning-signal-line selection period of h1, the scanning signal line G(n+1) is in a non-selection state and only the scanning signal line Gn is selected. Accordingly, a positive high-gradation data signal is written into the pixel electrode 17*a* that is connected to the scanning signal line Gn and the data signal line Sx via a transistor; and a negative high-gradation data signal is written into the pixel electrode 17*d* that is connected to the scanning signal line Gn and the data signal line Sy via a transistor (see FIGS. 1, 13, and 14). Further, a negative high-gradation data signal is written into the pixel electrode 17A that is connected to the scanning signal line Gn and the data signal line SX via a transistor, and a positive high-gradation data signal is written into the pixel electrode 17D that is connected to the scanning signal line Gn and the data signal line SY via a transistor.

Consequently, sub-pixels respectively corresponding to the pixel electrodes 17a, 17c, 17d, 17f, 17A, 17C, 17D, and 17F become bright sub-pixel (positive), dark sub-pixel (positive), bright sub-pixel (negative), dark sub-pixel (negative), bright sub-pixel (negative), dark sub-pixel (negative), bright sub-pixel (positive), and dark sub-pixel (positive), respectively.

Figure 15:
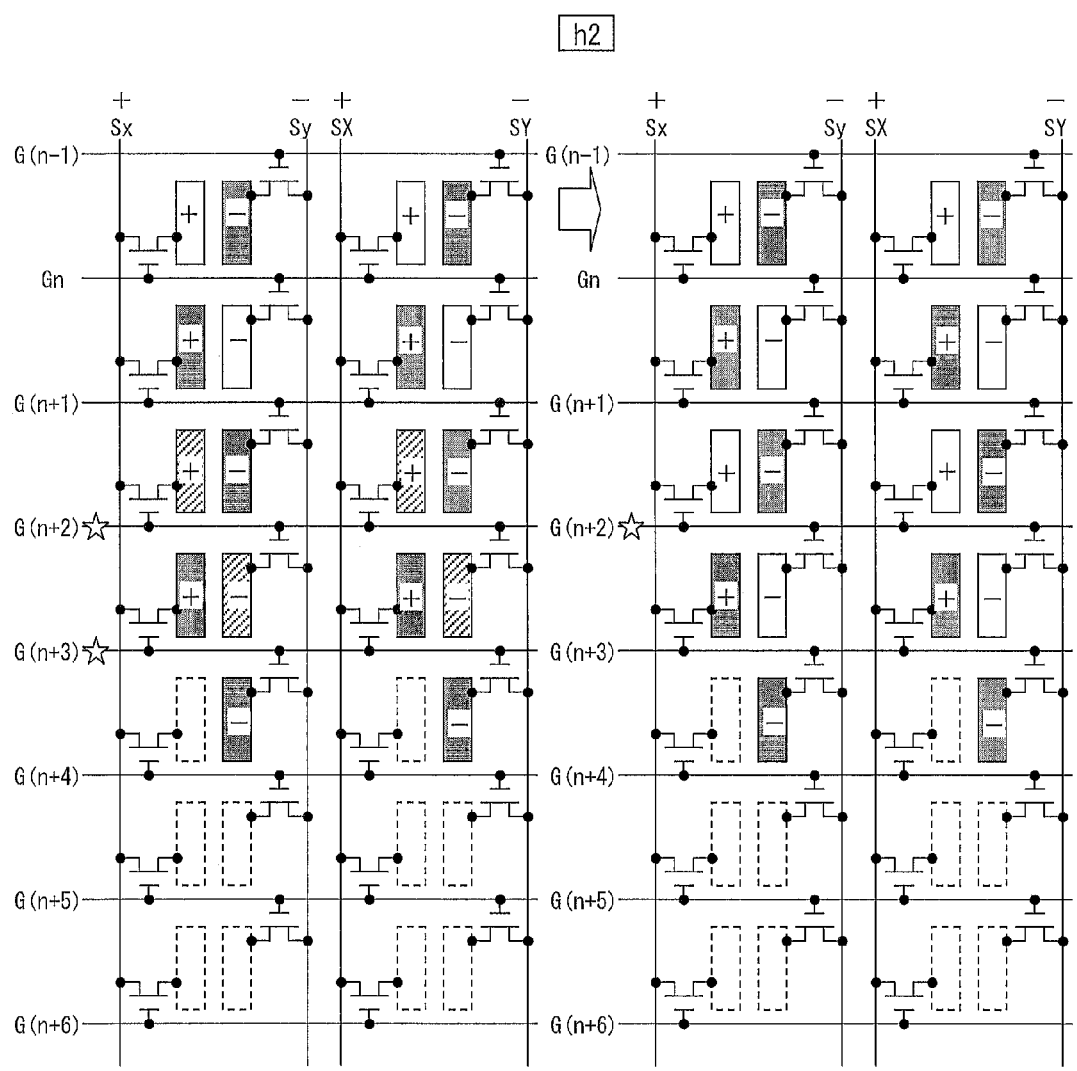
FIG. 15 is a diagram schematically explaining a state of h2 of FIG. 13.

In the two-scanning-signal-line selection period of h2, the two scanning signal lines G(n+2) and G(n+3) are selected (see FIGS. 13 and 15). Accordingly, a positive pre-charge signal (low gradation) is written into the pixel electrode 17e that is connected to the scanning signal line G(n+2) and the data signal line Sx via a transistor, a negative pre-charge signal (low gradation) is written into the pixel electrode 17h that is connected to the scanning signal line G(n+2) and the data signal line Sy via a transistor, a positive low-gradation data signal is written into the pixel electrode 17g that is connected to the scanning signal line G(n+3) and the data signal line Sx via a transistor, and a negative low-gradation data signal is written into the pixel electrode that is connected to the scanning signal line G(n+3) and the data signal line Sy via a transistor (see FIGS. 1, 13, and 15). Further, a positive pre-charge signal (low gradation) is written into the pixel electrode 17E that is connected to the scanning signal line G(n+2) and the data signal line SX via a transistor, a negative pre-charge signal (low gradation) is written into the pixel electrode 17H that is connected to the scanning signal line G(n+2) and the data signal line SY via a transistor, a positive low-gradation data signal is written into the pixel electrode 17G that is connected to the scanning signal line G(n+3) and the data signal line SX via a transistor, and a negative low-gradation data signal is written into a pixel electrode that is connected to the scanning signal line G(n+3) and the data signal line SY via a transistor.

Next, in the one-scanning-signal-line selection period of h2, the scanning signal line G(n+3) is in a non-selection state and only the scanning signal line G(n+2) is selected. Accordingly, a positive high-gradation data signal is written into the pixel electrode 17e that is connected to the scanning signal line G(n+2) and the data signal line Sx via a transistor, and a negative high-gradation data signal is written into the pixel electrode 17h that is connected to the scanning signal line G(n+2) and the data signal line Sy via a transistor (see FIGS. 1, 13, and 15). Further, a positive high-gradation data signal is written into the pixel electrode 17E that is connected to the scanning signal line G(n+2) and the data signal line SX via a transistor, and a negative high-gradation data signal is written into the pixel electrode 17H that is connected to the scanning signal line G(n+2) and the data signal line SY via a transistor.

Consequently, sub-pixels respectively corresponding to the pixel electrodes 17e, 17g, 17h, 17E, 17G, and 17H become bright sub-pixel (positive), dark sub-pixel (positive), bright sub-pixel (negative), bright sub-pixel (positive), dark sub-pixel (positive), and bright sub-pixel (negative), respectively.

Figure 16:
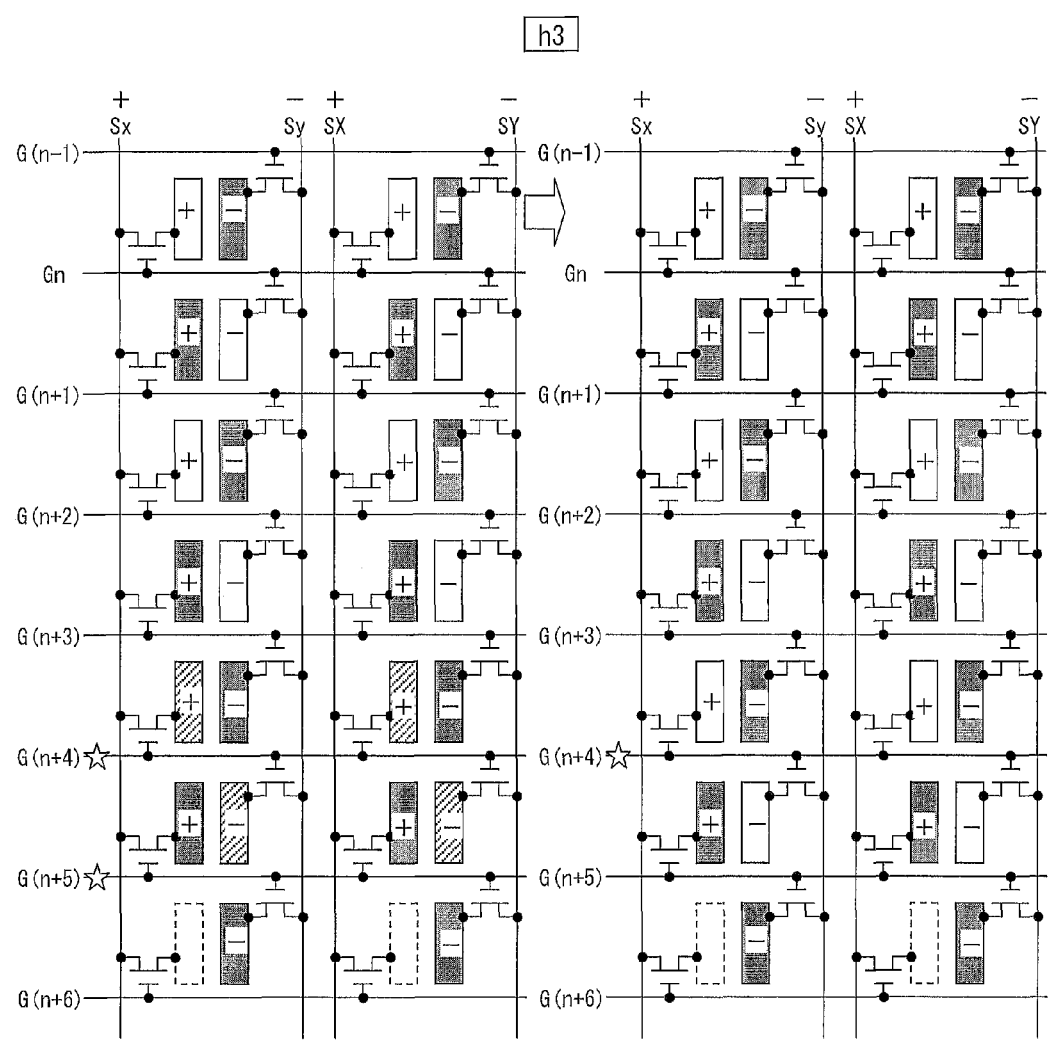
FIG. 16 is a diagram schematically explaining a state of h3 of FIG. 13.

In the two-scanning-signal-line selection period of h3, the two scanning signal lines G(n+4) and G(n+5) are selected. Next, in the one-scanning-signal-line selection period of h3, the scanning signal line G(n+5) is in a non-selection state and only the scanning signal line G(n+4) is selected. The state of h3 is as illustrated in FIG. 16.

According to the driving method shown in FIGS. 13 through 16, a polarity of a data signal supplied to a single data signal line does not change during 1 vertical scanning period. This allows suppression of power consumption of a source driver as compared with a case where a polarity of a data signal is reversed every 1 horizontal scanning period. In addition, in a case where a halftone is displayed, the bright sub-pixels and the dark sub-pixels are alternately disposed both in the row direction and in the column direction (the bright sub-pixels and the dark sub-pixels are disposed in a checkered pattern). This produces an effect that striped unevenness is less likely to be observed.

Embodiment 2

Figure 17:
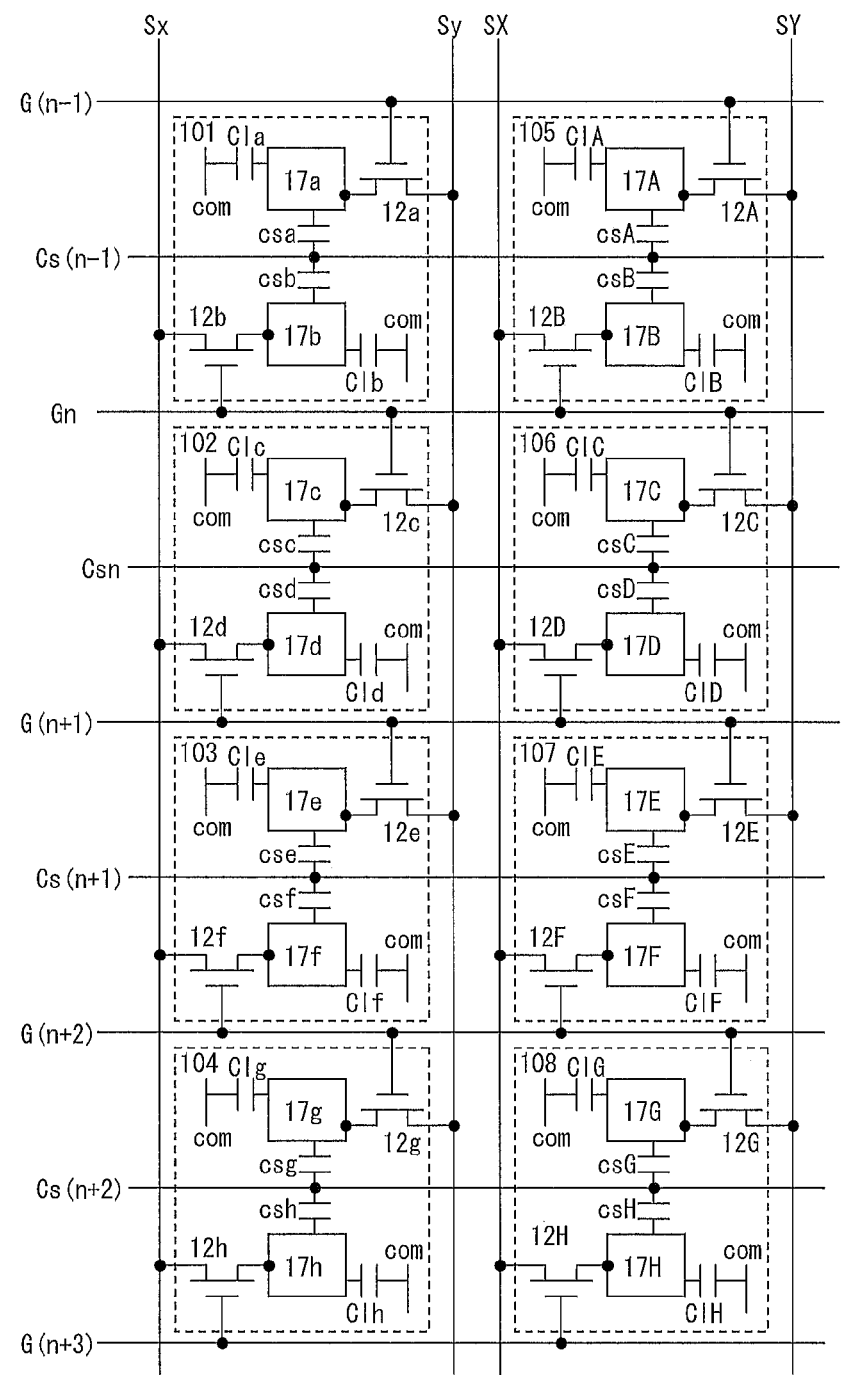
FIG. 17 is a circuit diagram illustrating a configuration of a liquid crystal panel of Embodiment 2.

FIG. 17 is an equivalent circuit diagram illustrating part of the present liquid crystal panel 5b. In the liquid crystal panel 5b, each pixel includes two pixel electrodes aligned in the column direction, and two pixel electrodes which belong to an identical pixel column and which are connected to an identical scanning signal line via respective transistors are adjacent to each other. The liquid crystal panel 5b is same as the liquid crystal panel 5a illustrated in FIG. 1 except for this.

For example, in a pixel 101, two pixel electrodes 17a and 17b are aligned in this order in the column direction (scanning direction). The pixel electrode 17a is connected to a drain electrode of a transistor 12a that is connected to a scanning signal line G(n−1). The pixel electrode 17b is connected to a drain electrode of a transistor 12b that is connected to a scanning signal line Gn. A source electrode of the transistor 12a is connected to a data signal line Sy. A source electrode of the transistor 12b is connected to a data signal line Sx.

In a pixel 102 that is adjacent to the pixel 101 in the column direction, two pixel electrodes 17c and 17d are aligned in this order in the column direction (scanning direction). The pixel electrode 17c is connected to a drain electrode of a transistor 12c that is connected to the scanning signal line Gn. The pixel electrode 17d is connected to a drain electrode of a transistor 12d that is connected to a scanning signal line G(n+1). A source electrode of the transistor 12c is connected to the data signal line Sy. A source electrode of the transistor 12d is connected to the data signal line Sx.

In a pixel 103 that is adjacent to the pixel 102 in the column direction, two pixel electrodes 17e and 17f are aligned in this order in the column direction (scanning direction). The pixel electrode 17e is connected to a drain electrode of a transistor 12e that is connected to the scanning signal line G(n+1). The pixel electrode 17f is connected to a drain electrode of a transistor 12f that is connected to a scanning signal line G(n+2). A source electrode of the transistor 12e is connected to the data signal line Sy. A source electrode of the transistor 12f is connected to the data signal line Sx.

In a pixel 104 that is adjacent to the pixel 103 in the column direction, two pixel electrodes 17g and 17h are aligned in this order in the column direction (scanning direction). The pixel electrode 17g is connected to a drain electrode of a transistor 12g that is connected to the scanning signal line G(n+2). The pixel electrode 17h is connected to a drain electrode of a transistor 12h that is connected to a scanning signal line G(n+3). A source electrode of the transistor 12g is connected to the data signal line Sy. A source electrode of the transistor 12h is connected to the data signal line Sx.

In a pixel 105 that is adjacent to the pixel 101 in the row direction, two pixel electrodes 17A and 17B are aligned in this order in the column direction (scanning direction). The pixel electrode 17A is connected to a drain electrode of a transistor 12A that is connected to the scanning signal line G(n−1). The pixel electrode 17B is connected to a drain electrode of a transistor 12B that is connected to the scanning signal line Gn. A source electrode of the transistor 12A is connected to the data signal line SY. A source electrode of the transistor 12B is connected to the data signal line SX.

In a pixel 106 that is adjacent to the pixel 102 in the row direction, two pixel electrodes 17C and 17D are aligned in this order in the column direction (scanning direction). The pixel electrode 17C is connected to a drain electrode of a transistor 12C that is connected to the scanning signal line Gn. The pixel electrode 17D is connected to a drain electrode of a transistor 12D that is connected to the scanning signal line G(n+1). A source electrode of the transistor 12C is connected to the data signal line SY. A source electrode of the transistor 12D is connected to the data signal line SX.

In a pixel 107 that is adjacent to the pixel 103 in the row direction, two pixel electrodes 17E and 17F are aligned in this order in the column direction (scanning direction). The pixel electrode 17E is connected to a drain electrode of a transistor 12E that is connected to the scanning signal line G(n+1). The pixel electrode 17F is connected to a drain electrode of a transistor 12F that is connected to the scanning signal line G(n+2). A source electrode of the transistor 12E is connected to the data signal line SY. A source electrode of the transistor 12F is connected to the data signal line SX.

In a pixel 108 that is adjacent to the pixel 104 in the row direction, two pixel electrodes 17G and 17H are aligned in this order in the column direction (scanning direction). The pixel electrode 17G is connected to a drain electrode of a transistor 12G that is connected to the scanning signal line G(n+2). The pixel electrode 17H is connected to a drain electrode of a transistor 12H that is connected to the scanning signal line G(n+3). A source electrode of the transistor 12G is connected to the data signal line SY. A source electrode of the transistor 12H is connected to the data signal line SX.

Figure 18:
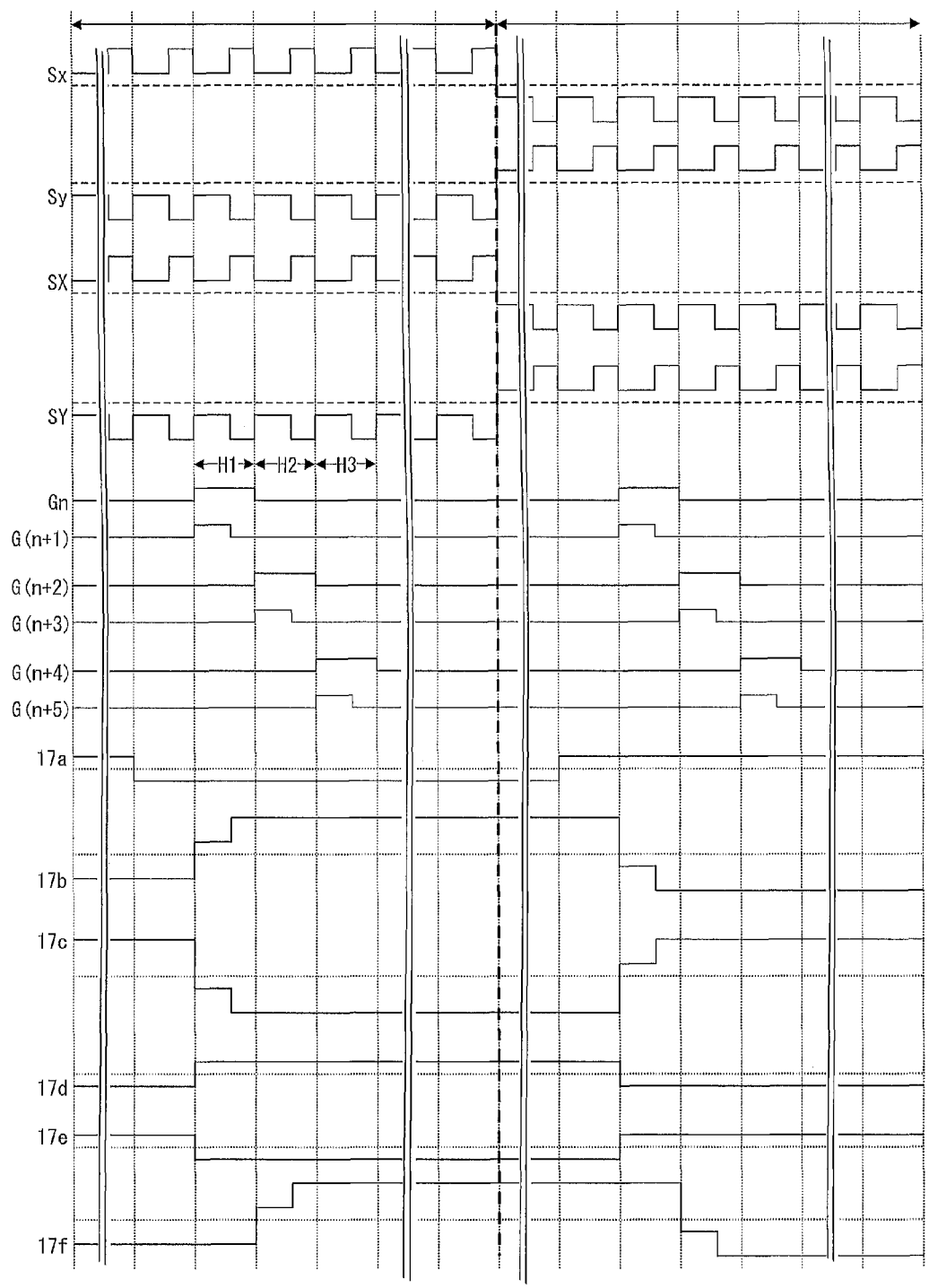
FIG. 18 is a timing chart illustrating a method for driving the liquid crystal panel of FIG. 17.
Figure 19:
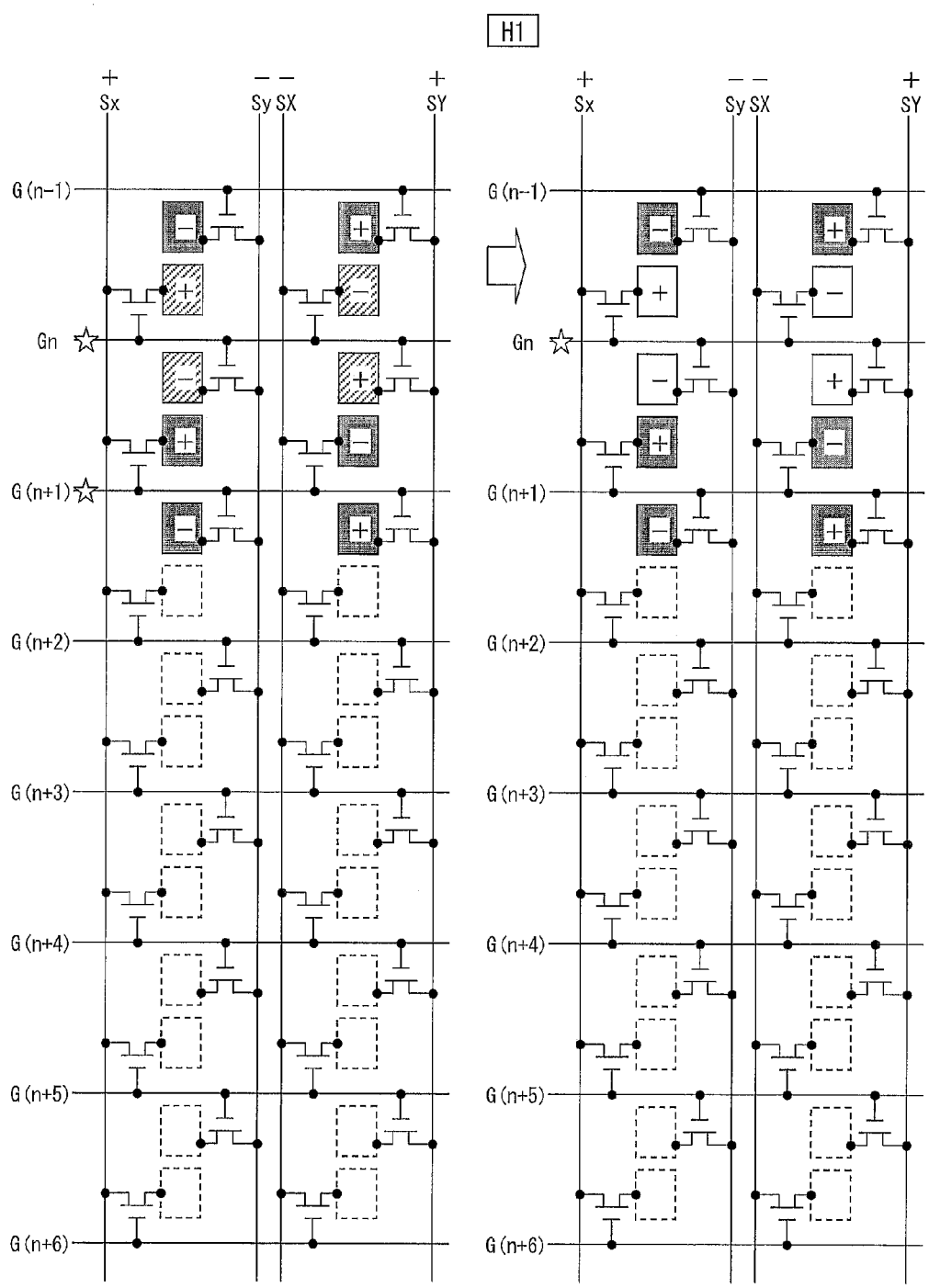
FIG. 19 is a diagram schematically explaining a state of a horizontal scanning period H1.
Figure 20:
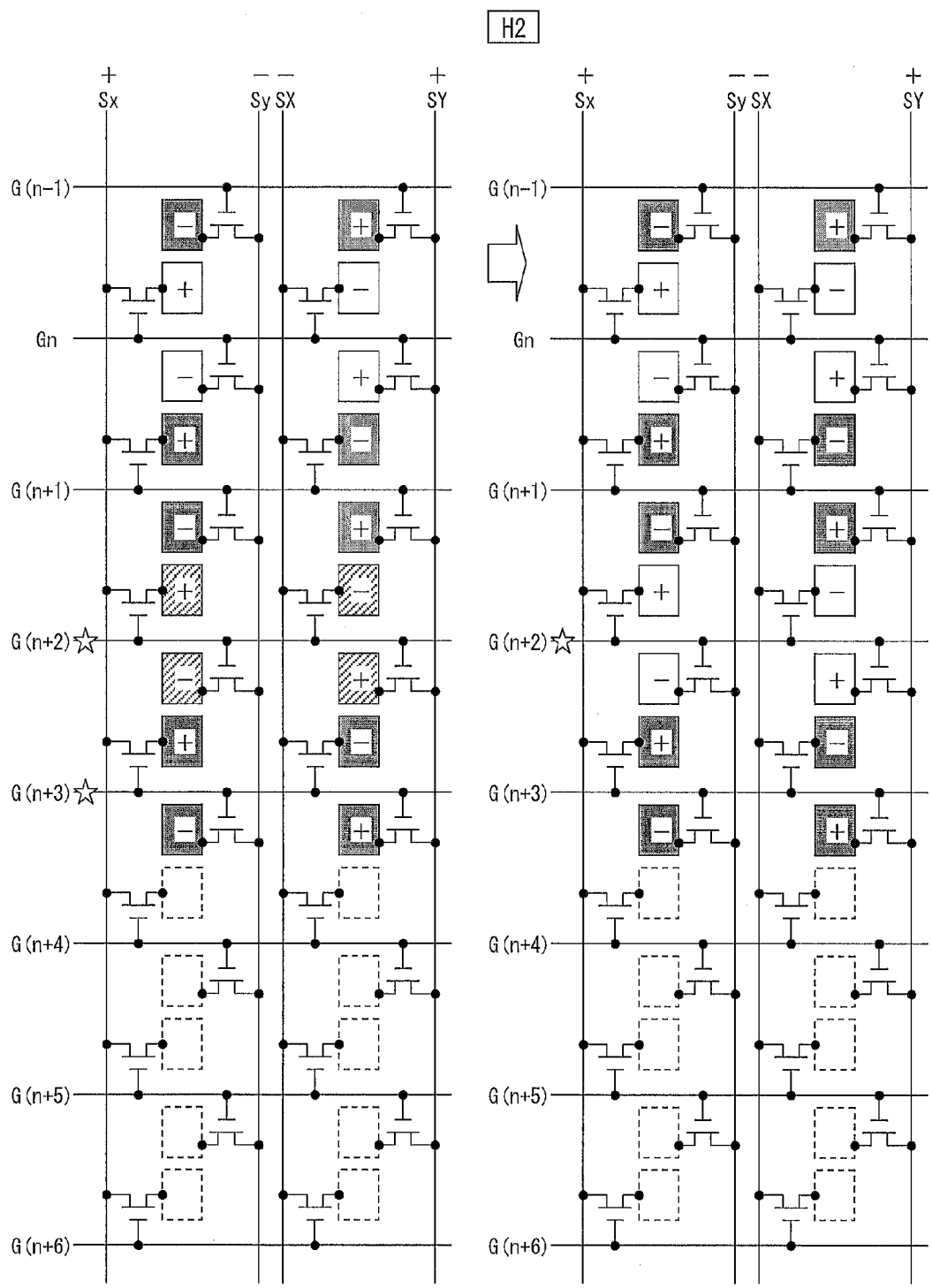
FIG. 20 is a diagram schematically explaining a state of a horizontal scanning period H2.
Figure 21:
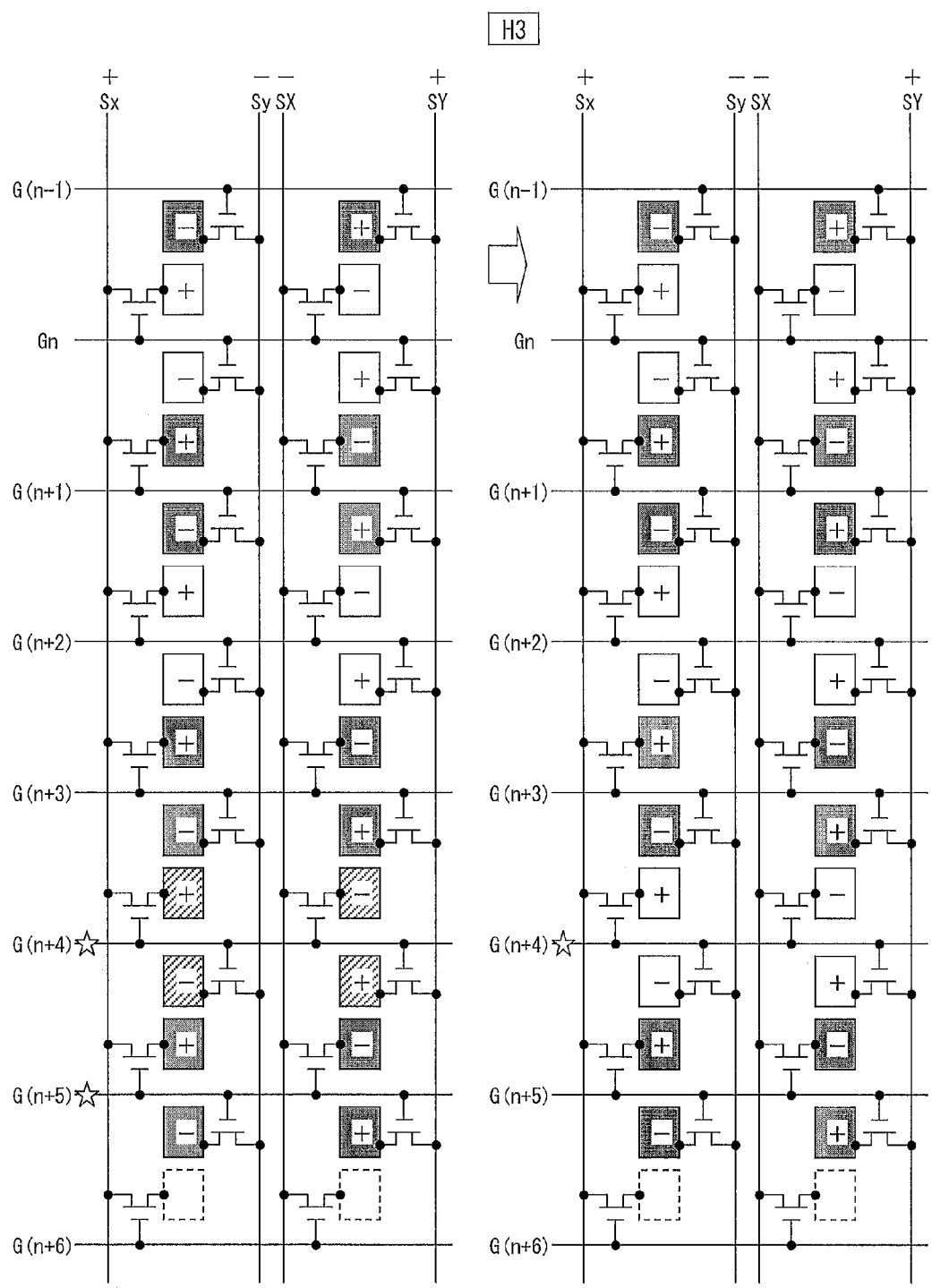
FIG. 21 is a diagram schematically explaining a state of a horizontal scanning period H3.

FIGS. 19 through 21 are diagrams schematically illustrating, for respective three successive horizontal scanning periods (H1 through H3), how the liquid crystal panel 5b is driven in a case where a halftone is displayed in part (seven pixel rows including the four pixel rows of FIG. 17) of the liquid crystal panel 5b. FIG. 18 is a timing chart (for two frames) illustrating how the liquid crystal panel 5b is driven in a case where a halftone is displayed in the part of the liquid crystal panel 5b.

According to the driving method illustrated in FIGS. 18 through 21, scanning signal lines are sequentially selected two at a time, and a single horizontal scanning period includes (i) a two-scanning-signal-line selection period in which two scanning signal lines are concurrently selected and (ii) a one-scanning-signal-line selection period which follows the two-scanning-signal-line selection period and in which one of the two scanning signal lines is in a non-selection state. In a case where a halftone is displayed, a low-gradation data signal is supplied to each data signal line in the two-scanning-signal-line selection period, and a high-gradation data signal is supplied to each data signal line in the one-scanning-signal-line selection period. Data signals of reverse polarities are supplied to two data signal lines associated with a single pixel column. Data signals of an identical polarity are supplied to two adjacent data signal lines (e.g., Sy and SX) which are associated with different pixel columns. Note that a polarity of a data signal supplied to each data signal line is reversed every vertical scanning period (1 frame).

For example, in the two-scanning-signal-line selection period of H1 out of the three successive horizontal scanning periods H1 through H3, the two scanning signal lines Gn and G(n+1) are selected (see FIGS. 18 and 19). Accordingly, a positive pre-charge signal (low gradation) is written into the pixel electrode 17b that is connected to the scanning signal line Gn and the data signal line Sx via a transistor, a negative pre-charge signal (low gradation) is written into the pixel electrode 17c that is connected to the scanning signal line Gn and the data signal line Sy via a transistor, a positive low-gradation data signal is written into the pixel electrode 17d that is connected to the scanning signal line G(n+1) and the data signal line Sx via a transistor, and a negative low-gradation data signal is written into the pixel electrode 17e that is connected to the scanning signal line G(n+1) and the data signal line Sy via a transistor (see FIGS. 17 through 19). Further, a negative pre-charge signal (low gradation) is written into the pixel electrode 17B that is connected to the scanning signal line Gn and the data signal line SX via a transistor, a positive pre-charge signal (low gradation) is written into the pixel electrode 17C that is connected to the scanning signal line Gn and the data signal line SY via a transistor, a negative low-gradation data signal is written into the pixel electrode 17D that is connected to the scanning signal line G(n+1) and the data signal line SX via a transistor, and a positive low-gradation data signal is written into the pixel electrode 17E that is connected to the scanning signal line G(n+1) and the data signal line SY via a transistor.

Next, in the one-scanning-signal-line selection period of H1, the scanning signal line G(n+1) is in a non-selection state and only the scanning signal line Gn is selected. Accordingly, a positive high-gradation data signal is written into the pixel electrode 17b that is connected to the scanning signal line Gn and the data signal line Sx via a transistor, and a negative high-gradation data signal is written into the pixel electrode 17c that is connected to the scanning signal line Gn and the data signal line Sy via a transistor (see FIGS. 17 through 19). Further, a negative high-gradation data signal is written into the pixel electrode 17B that is connected to the scanning signal line Gn and the data signal line SX via a transistor, and a positive high-gradation data signal is written into the pixel electrode 17C that is connected to the scanning signal line Gn and the data signal line SY via a transistor.

Consequently, sub-pixels respectively corresponding to the pixel electrodes 17b, 17c, 17d, 17e, 17B, 17C, 17D, and 17E become bright sub-pixel (positive), bright sub-pixel (negative), dark sub-pixel (positive), dark sub-pixel (negative), bright sub-pixel (negative), bright sub-pixel (positive), dark sub-pixel (negative), and dark sub-pixel (positive), respectively.

In the two-scanning-signal-line selection period of H2, the two scanning signal lines G(n+2) and G(n+3) are selected (see FIGS. 18 and 20). Accordingly, a positive pre-charge signal (low gradation) is written into the pixel electrode 17f that is connected to the scanning signal line G(n+2) and the data signal line Sx via a transistor, a negative pre-charge signal (low gradation) is written into the pixel electrode 17g that is connected to the scanning signal line G(n+2) and the data signal line Sy via a transistor, a positive low-gradation data signal is written into the pixel electrode 17h that is connected to the scanning signal line G(n+3) and the data signal line Sx via a transistor, and a negative low-gradation data signal is written into a pixel electrode that is connected to the scanning signal line G(n+3) and the data signal line Sy via a transistor (see FIGS. 17, 18, and 20). Further, a negative pre-charge signal (low gradation) is written into the pixel electrode 17F that is connected to the scanning signal line G(n+2) and the data signal line SX via a transistor, a positive pre-charge signal (low gradation) is written into the pixel electrode 17G that is connected to the scanning signal line G(n+2) and the data signal line SY via a transistor, a negative low-gradation data signal is written into the pixel electrode 17H that is connected to the scanning signal line G(n+3) and the data signal line SX via a transistor, and a positive low-gradation data signal is written into a pixel electrode that is connected to the scanning signal line G(n+3) and the data signal line SY via a transistor.

Next, in the one-scanning-signal-line selection period of H2, the scanning signal line G(n+3) is in a non-selection state and only the scanning signal line G(n+2) is selected. Accordingly, a positive high-gradation data signal is written into the pixel electrode 17f that is connected to the scanning signal line G(n+2) and the data signal line Sx via a transistor, and a negative high-gradation data signal is written into the pixel electrode 17g that is connected to the scanning signal line G(n+2) and the data signal line Sy via a transistor (see 17, 18, and 20). Further, a negative high-gradation data signal is written into the pixel electrode 17F that is connected to the scanning signal line G(n+2) and the data signal line SX via a transistor, and a positive high-gradation data signal is written into the pixel electrode 17G that is connected to the scanning signal line G(n+2) and the data signal line SY via a transistor.

Consequently, sub-pixels respectively corresponding to the pixel electrodes 17f, 17g, 17h, 17F, 17G, and 17H become bright sub-pixel (positive), bright sub-pixel (negative), dark sub-pixel (positive), bright sub-pixel (negative), bright sub-pixel (positive), and dark sub-pixel (negative), respectively.

In the two-scanning-signal-line selection period of H3, the two scanning signal lines G(n+4) and G(n+5) are selected. Next, in the one-scanning-signal-line selection period of H3, the scanning signal line G(n+5) is in a non-selection state and only the scanning signal line G(n+4) is selected. The state of H3 is as illustrated in FIG. 21.

A liquid crystal display device including the liquid crystal panel 5b is an individual-writing type pixel division mode liquid crystal display device, and therefore has good viewing angle characteristics and the following advantages over a capacitively-coupled type liquid crystal display device. Specifically, the individual-writing type liquid crystal panel is highly reliable since no electrically floating pixel electrode is present. Moreover, luminance of bright and dark sub-pixels can be accurately controlled.

The scanning signal lines are selected two at a time, and a data signal can be written into bright sub-pixels connected to the even-numbered scanning signal lines (Gn, G(n+2), . . . ) in the one-scanning-signal-line selection period after they are pre-charged in the two-scanning-signal-line selection period. Accordingly, in the case of normal driving, a period of time for charging the bright sub-pixels can be made substantially two times longer. Further, since the two-scanning-signal-line selection period in which a data signal is written into dark sub-pixels connected to the odd-numbered scanning signal lines (G(n+1), G(n+3), . . . ) is set longer than the one-scanning-signal-line selection period, a period of time for charging the dark sub-pixels can be also extended in the case of normal driving. As such, the present invention is suitable for a large-sized high-definition liquid crystal display device and a liquid crystal display device driven at high speed (driven at 60 Hz or more).

In addition, a polarity of a data signal written into a screen is reversed every sub-pixel both in the row direction and in the column direction. This allows suppression of flickering of the screen.

Figure 22:
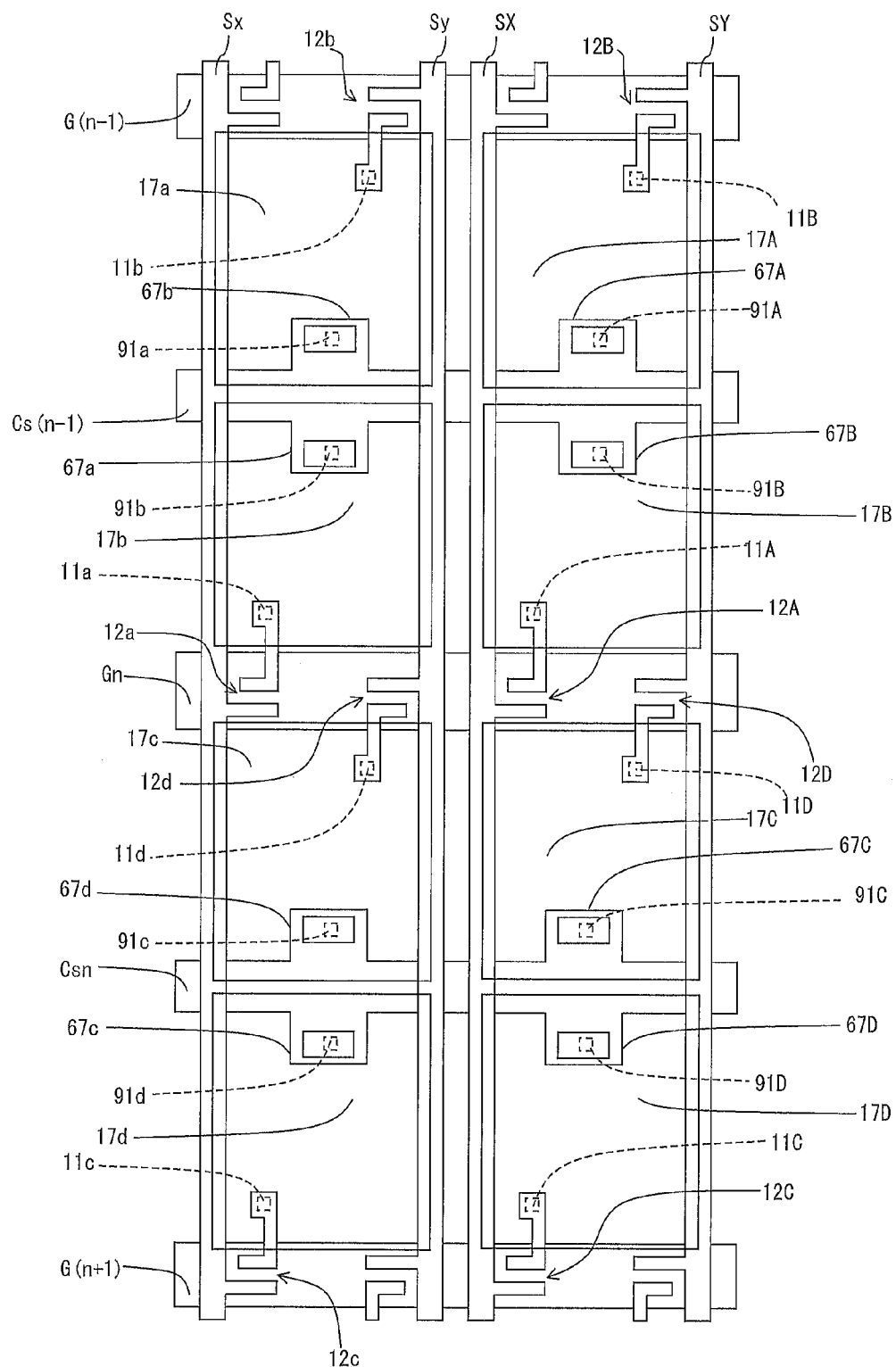
FIG. 22 is a plan view illustrating a specific configuration of the liquid crystal panel of FIG. 17.

FIG. 22 is a plan view illustrating an exemplary configuration of part of the liquid crystal panel 5b illustrated in FIG. 17. As illustrated in FIG. 22, in the liquid crystal panel 5b, from a plan view, the pixel electrodes 17a and 17b are aligned in this order in the column direction (scanning direction) in a region surrounded by the scanning signal lines G(n−1) and Gn and the data signal lines Sx and Sy, the pixel electrodes 17A and 17B are aligned in this order in the column direction (scanning direction) in a region surrounded by the scanning signal lines G(n−1) and Gn and the data signal lines SX and SY, the pixel electrodes 17c and 17d are aligned in this order in the column direction (scanning direction) in a region surrounded by the scanning signal lines Gn and G(n+1) and the data signal lines Sx and Sy, and the pixel electrodes 17C and 17D are aligned in this order in the column direction (scanning direction) in a region surrounded by the scanning signal lines Gn and G(n+1) and the data signal lines SX and SY. Further, a retention capacitor wiring Cs(n−1) is disposed between the scanning signal line G(n−1) and the scanning signal line Gn, and a retention capacitor wiring Csn is disposed between the scanning signal line Gn and the scanning signal line G(n+1).

Note that the scanning signal line G(n−1) serves as gate electrodes of the transistors 12b and 12B, the scanning signal line Gn serves as gate electrodes of the transistors 12a and 12A, and the scanning signal line G(n+1) serves as gate electrodes of the transistors 12c and 12C. Source electrodes of the transistors 12a and 12c are connected to the data signal line Sx, source electrodes of the transistors 12b and 12d are connected to the data signal line Sy, source electrodes of the transistors 12A and 12C are connected to the data signal line SX, and source electrode of the transistors 12B and 12D are connected to the data signal line SY.

A drain electrode of the transistor 12a is connected to the pixel electrode 17a via a contact hole 11a, a drain electrode of the transistor 12b is connected to the pixel electrode 17b via a contact hole 11b, a capacitor electrode 67a overlapping the retention capacitor wiring Cs(n−1) is connected to the pixel electrode 17a via a contact hole 91a, and a capacitor electrode 67b overlapping the retention capacitor wiring Cs(n−1) is connected to the pixel electrode 17b via a contact hole 91b. Similarly, a drain electrode of the transistor 12A is connected to the pixel electrode 17A via a contact hole 11A, a drain electrode of the transistor 12B is connected to the pixel electrode 17B via a contact hole 11B, a capacitor electrode 67A overlapping the retention capacitor wiring Cs(n−1) is connected to the pixel electrode 17A via a contact hole 91A, and a capacitor electrode 67B overlapping the retention capacitor wiring Cs(n−1) is connected to the pixel electrode 17B via a contact hole 91B.

Further, a drain electrode of the transistor 12c is connected to the pixel electrode 17c via a contact hole 11c, a drain electrode of the transistor 12d is connected to the pixel electrode 17d via a contact hole 11d, a capacitor electrode 67c overlapping the retention capacitor wiring Csn is connected to the pixel electrode 17c via a contact hole 91c, and a capacitor electrode 67d overlapping the retention capacitor wiring Csn is connected to the pixel electrode 17d via a contact hole 91d. Similarly, a drain electrode of the transistor 12C is connected to the pixel electrode 17C via a contact hole 11C, a drain electrode of the transistor 12D is connected to the pixel electrode 17D via a contact hole 11D, a capacitor electrode 67C overlapping the retention capacitor wiring Csn is connected to the pixel electrode 17C via a contact hole 91C, and a capacitor electrode 67D overlapping the retention capacitor wiring Csn is connected to the pixel electrode 17D via a contact hole 91D.

Figure 23:
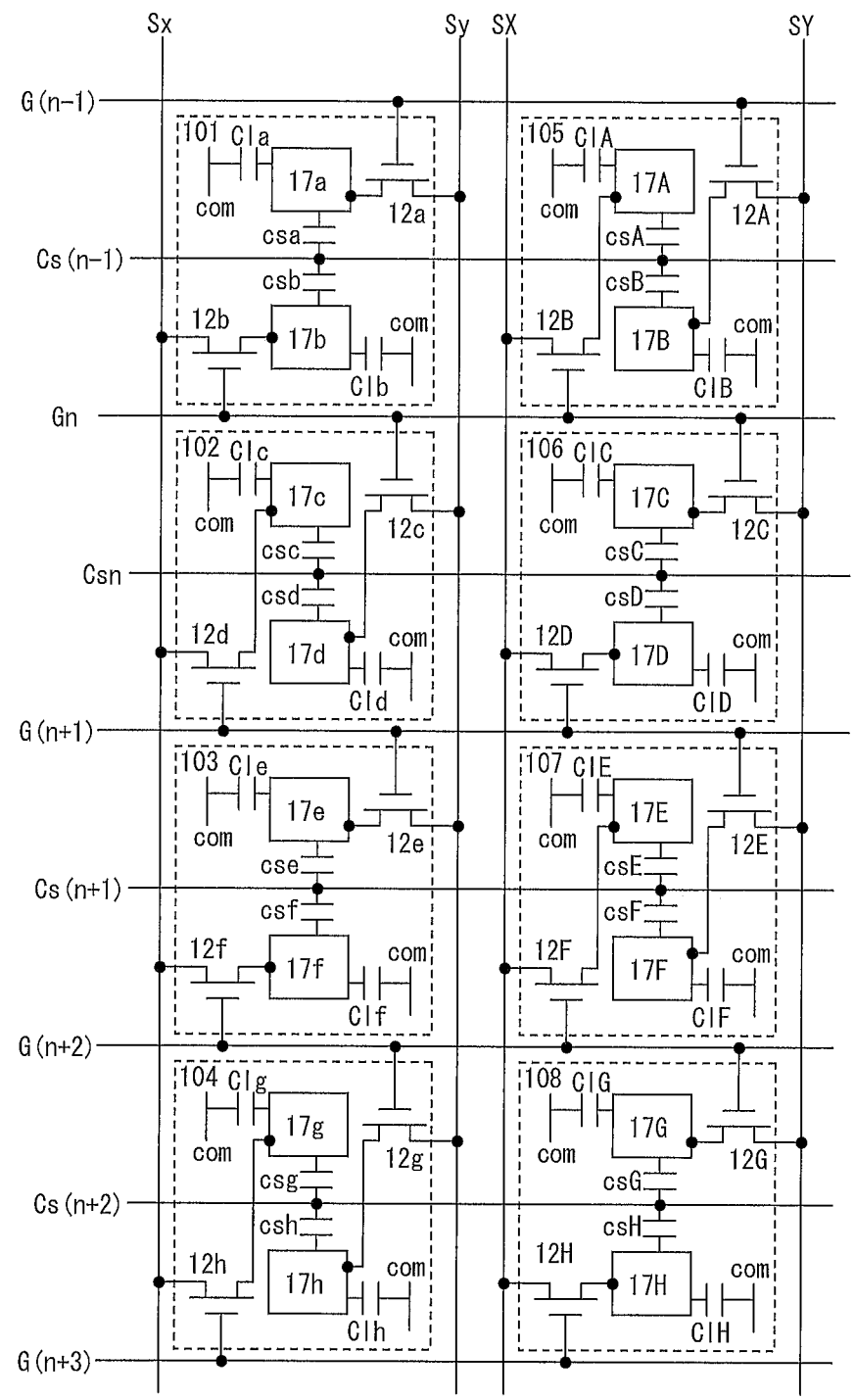
FIG. 23 is a circuit diagram illustrating another configuration of the liquid crystal panel of Embodiment 2.

The liquid crystal panel 5b of FIG. 17 may be modified as illustrated in FIG. 23. In a liquid crystal panel 5c of FIG. 23, two pixel electrodes which belong to an identical column of pixel regions and which are connected to an identical scanning signal line via respective transistors are disposed so as to sandwich another pixel electrode. Further, two pixel electrodes which belong to an identical row of pixel regions and which are connected to an identical scanning signal line via respective transistors are disposed diagonally opposite to each other.

For example, in a pixel 101, two pixel electrodes 17a and 17b are aligned in this order in the column direction (scanning direction). The pixel electrode 17a is connected to a drain electrode of a transistor 12a that is connected to a scanning signal line G(n−1). The pixel electrode 17b is connected to a drain electrode of a transistor 12b that is connected to a scanning signal line Gn. A source electrode of the transistor 12a is connected to a data signal line Sy. A source electrode of the transistor 12b is connected to a data signal line Sx.

In a pixel 102 that is adjacent to the pixel 101 in the column direction, two pixel electrodes 17c and 17d are aligned in this order in the column direction (scanning direction). The pixel electrode 17d is connected to a drain electrode of a transistor 12c that is connected to the scanning signal line Gn. The pixel electrode 17c is connected to a drain electrode of a transistor 12d that is connected to a scanning signal line G(n+1). A source electrode of the transistor 12c is connected to the data signal line Sy. A source electrode of the transistor 12d is connected to the data signal line Sx.

In a pixel 103 that is adjacent to the pixel 102 in the column direction, two pixel electrodes 17e and 17f are aligned in this order in the column direction (scanning direction). The pixel electrode 17e is connected to a drain electrode of a transistor 12e that is connected to the scanning signal line G(n+1). The pixel electrode 17f is connected to a drain electrode of a transistor 12f that is connected to a scanning signal line G(n+2). A source electrode of the transistor 12e is connected to the data signal line Sy. A source electrode of the transistor 12f is connected to the data signal line Sx.

In a pixel 104 that is adjacent to the pixel 103 in the column direction, two pixel electrodes 17g and 17h are aligned in this order in the column direction (scanning direction). The pixel electrode 17h is connected to a drain electrode of a transistor 12g that is connected to the scanning signal line G(n+2). The pixel electrode 17g is connected to a drain electrode of a transistor 12h that is connected to a scanning signal line G(n+3). A source electrode of the transistor 12g is connected to the data signal line Sy. A source electrode of the transistor 12h is connected to the data signal line Sx.

In a pixel 105 that is adjacent to the pixel 101 in the row direction, two pixel electrodes 17A and 17B are aligned in this order in the column direction (scanning direction). The pixel electrode 17B is connected to a drain electrode of a transistor 12A that is connected to the scanning signal line G(n−1). The pixel electrode 17A is connected to a drain electrode of a transistor 12B that is connected to the scanning signal line Gn. A source electrode of the transistor 12A is connected to a data signal line SY. A source electrode of the transistor 12B is connected to a data signal line SX.

In a pixel 106 that is adjacent to the pixel 102 in the row direction, two pixel electrodes 17C and 17D are aligned in this order in the column direction (scanning direction). The pixel electrode 17C is connected to a drain electrode of a transistor 12C that is connected to the scanning signal line Gn. The pixel electrode 17D is connected to a drain electrode of a transistor 12D that is connected to the scanning signal line G(n+1). A source electrode of the transistor 12C is connected to the data signal line SY. A source electrode of the transistor 12D is connected to the data signal line SX.

In a pixel 107 that is adjacent to the pixel 103 in the row direction, two pixel electrodes 17E and 17F are aligned in this order in the column direction (scanning direction). The pixel electrode 17F is connected to a drain electrode of a transistor 12E that is connected to the scanning signal line G(n+1). The pixel electrode 17E is connected to a drain electrode of a transistor 12F that is connected to the scanning signal line G(n+2). A source electrode of the transistor 12E is connected to the data signal line SY. A source electrode of the transistor 12F is connected to the data signal line SX.

In a pixel 108 that is adjacent to the pixel 104 in the row direction, two pixel electrodes 17G and 17H are aligned in this order in the column direction (scanning direction). The pixel electrode 17G is connected to a drain electrode of a transistor 12G that is connected to the scanning signal line G(n+2). The pixel electrode 17H is connected to a drain electrode of a transistor 12H that is connected to the scanning signal line G(n+3). A source electrode of the transistor 12G is connected to the data signal line SY. A source electrode of the transistor 12H is connected to the data signal line SX.

Figure 24:
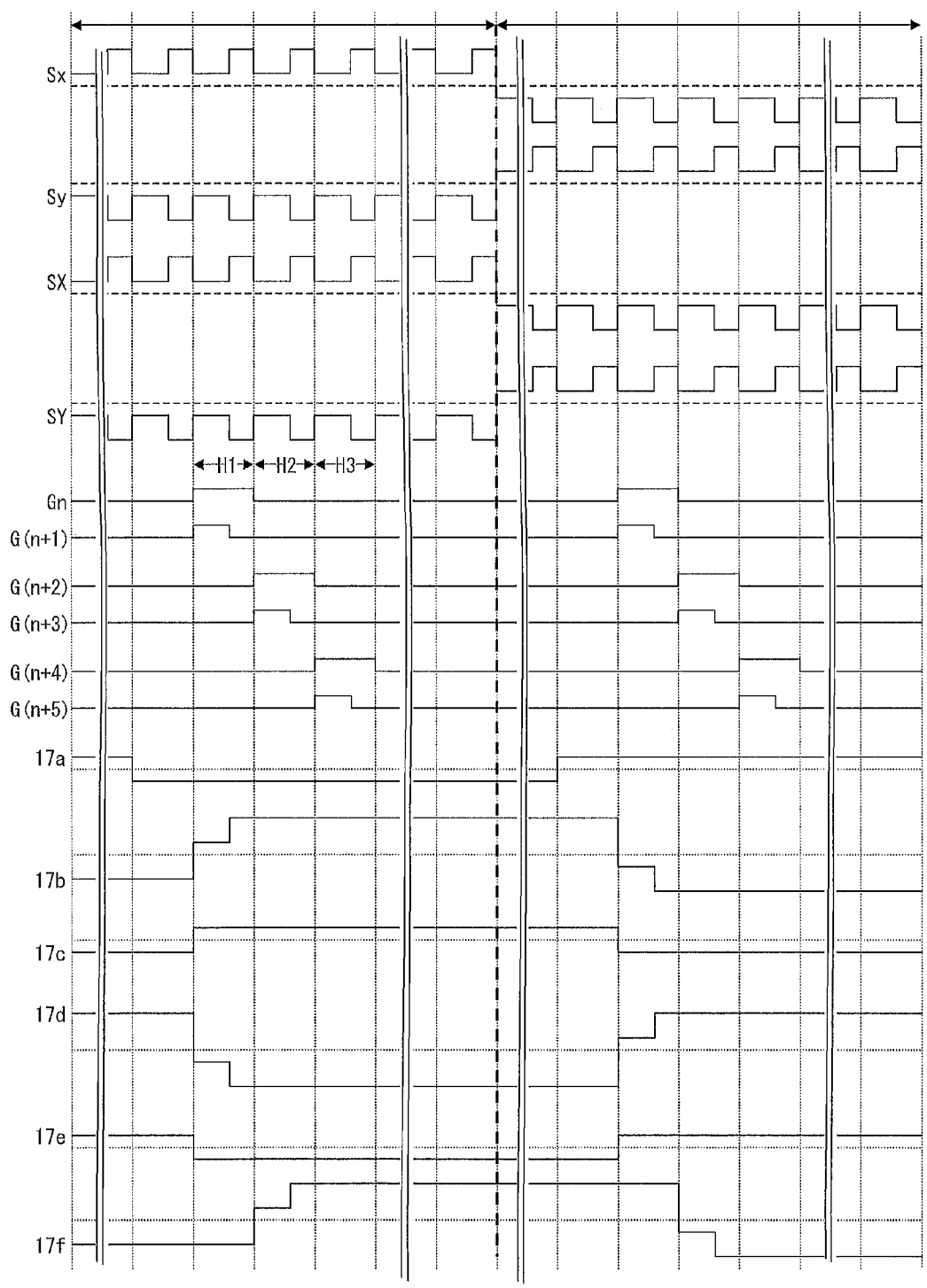
FIG. 24 is a timing chart illustrating a method for driving the liquid crystal panel of FIG. 23.
Figure 25:
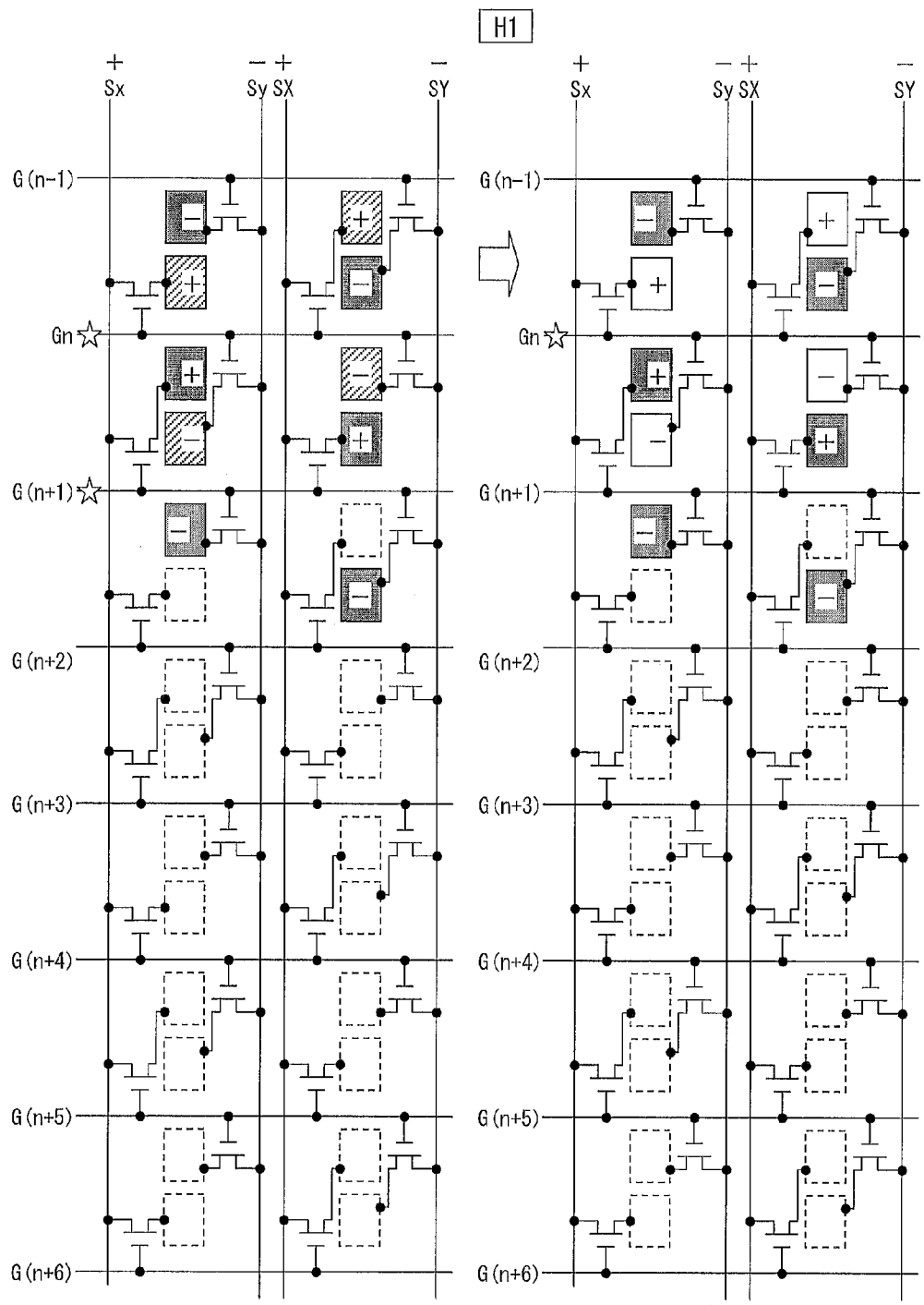
FIG. 25 is a diagram schematically explaining a state of a horizontal scanning period H1.
Figure 26:
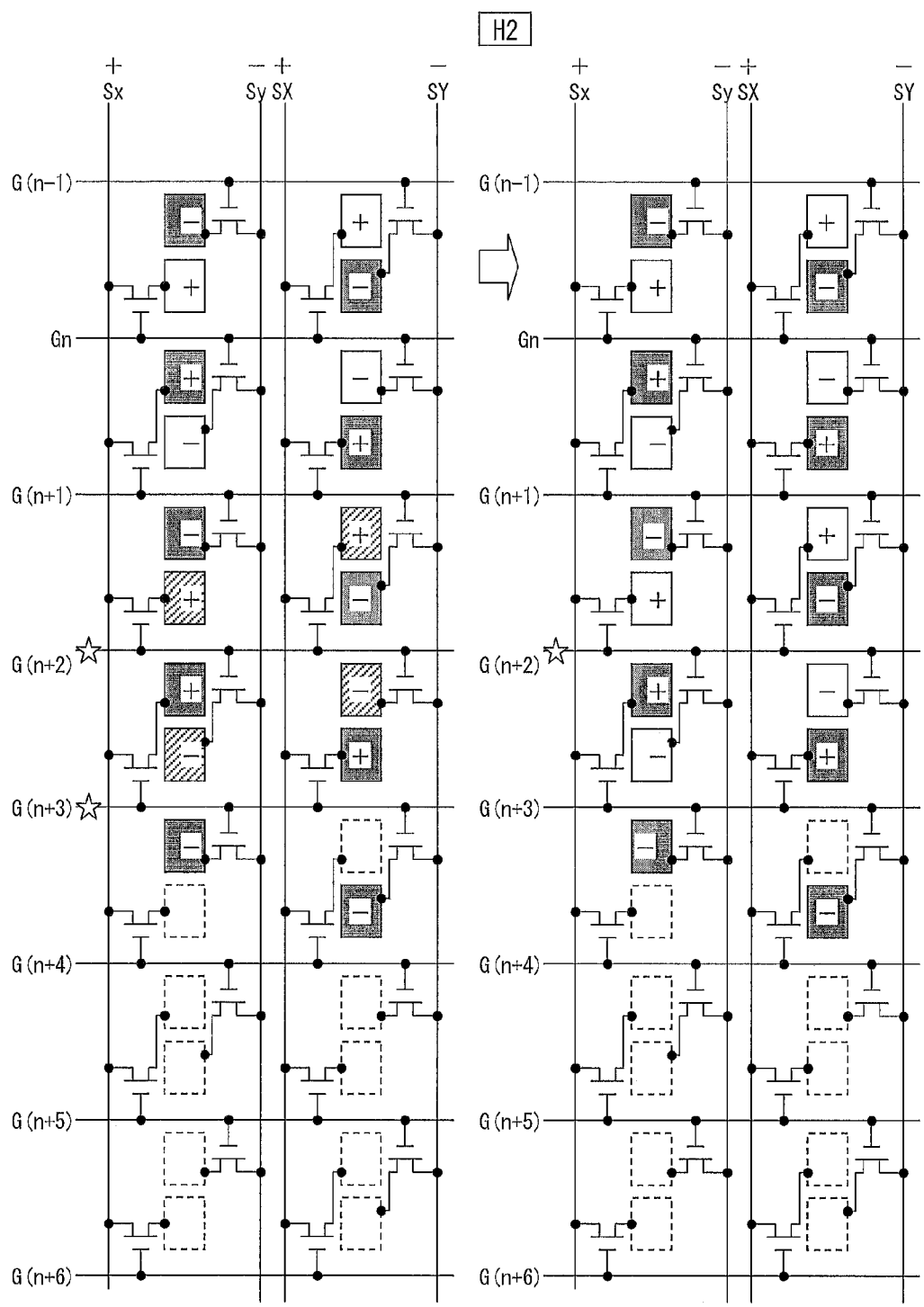
FIG. 26 is a diagram schematically explaining a state of a horizontal scanning period H2.
Figure 27:
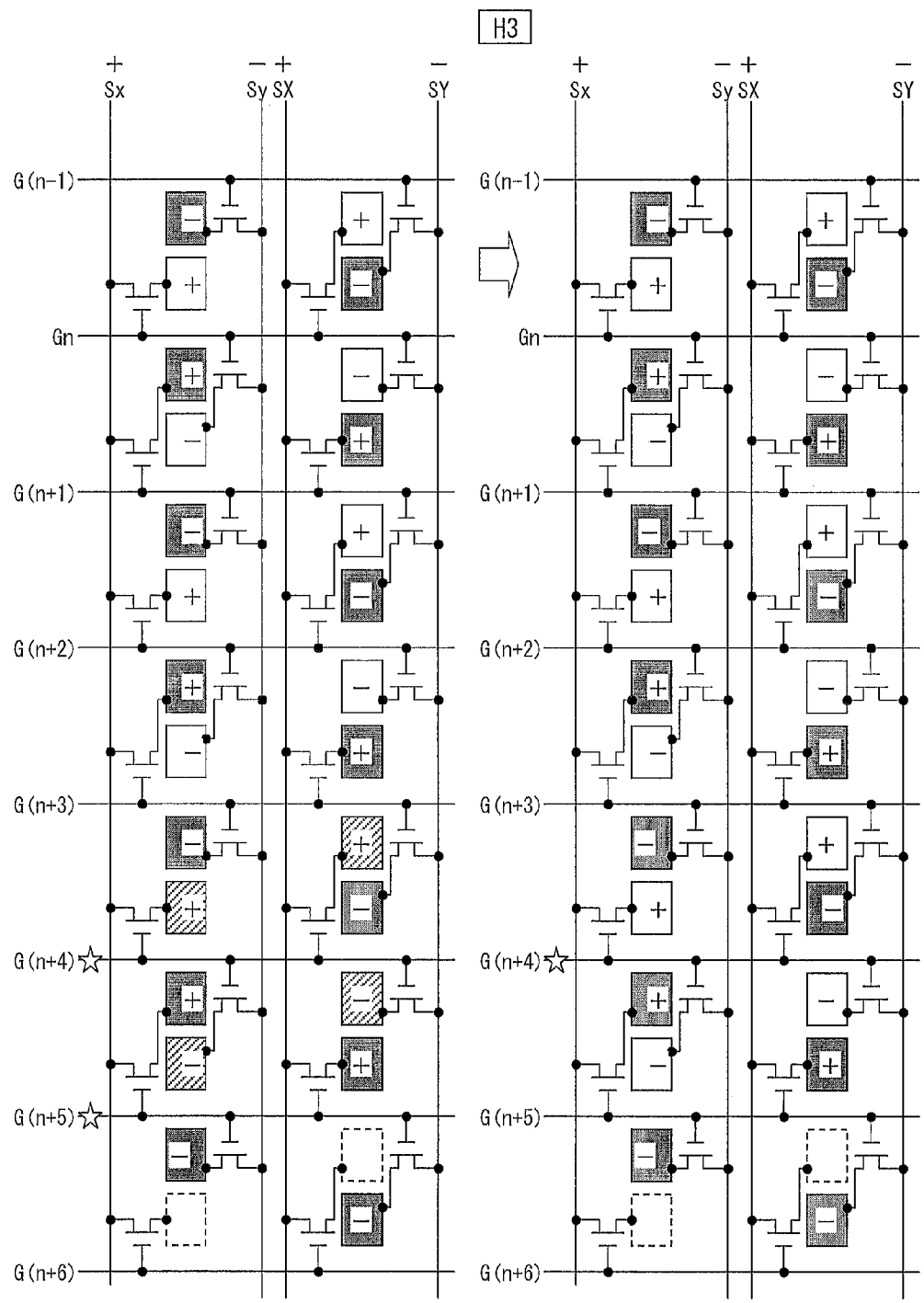
FIG. 27 is a diagram schematically explaining a state of a horizontal scanning period H3.

FIGS. 25 through 27 are diagrams schematically illustrating, for respective three successive horizontal scanning periods (H1 through H3), how the liquid crystal panel 5c is driven in a case where a halftone is displayed in part (seven pixel rows including the four pixel rows of FIG. 23) of the liquid crystal panel 5c. FIG. 24 is a timing chart (for two frames) illustrating how the liquid crystal panel 5c is driven in a case where a halftone is displayed in the part of the liquid crystal panel 5c.

According to the driving method illustrated in FIGS. 24 through 27, scanning signal lines are sequentially selected two at a time, and a single horizontal scanning period includes (i) a two-scanning-signal-line selection period in which two scanning signal lines are concurrently selected and (ii) a one-scanning-signal-line selection period which follows the two-scanning-signal-line selection period and in which one of the two scanning signal lines is in a non-selection state. In a case where a halftone is displayed, a low-gradation data signal is supplied to each data signal line in the two-scanning-signal-line selection period, and a high-gradation data signal is supplied to each data signal line in the one-scanning-signal-line selection period. Data signals of reverse polarities are supplied to two data signal lines associated with a single pixel column. Data signals of reverse polarities are supplied to two adjacent data signal lines (e.g., Sy and SX) which are associated with different pixel columns. Note that a polarity of a data signal supplied to each data signal line is reversed every vertical scanning period (1 frame).

For example, in the two-scanning-signal-line selection period of H1 out of the three successive horizontal scanning periods H1 through H3, the two scanning signal lines Gn and G(n+1) are selected (see FIGS. 24 and 25). Accordingly, a positive pre-charge signal (low gradation) is written into the pixel electrode 17b that is connected to the scanning signal line Gn and the data signal line Sx via a transistor, a negative pre-charge signal (low gradation) is written into the pixel electrode 17d that is connected to the scanning signal line Gn and the data signal line Sy via a transistor, a positive low-gradation data signal is written into the pixel electrode 17c that is connected to the scanning signal line G(n+1) and the data signal line Sx via a transistor, and a negative low-gradation data signal is written into the pixel electrode 17e that is connected to the scanning signal line G(n+1) and the data signal line Sy via a transistor (see FIGS. 23 through 25). Further, a positive pre-charge signal (low gradation) is written into the pixel electrode 17A that is connected to the scanning signal line Gn and the data signal line SX via a transistor, a negative pre-charge signal (low gradation) is written into the pixel electrode 17C that is connected to the scanning signal line Gn and the data signal line SY via a transistor, a positive low-gradation data signal is written into the pixel electrode 17D that is connected to the scanning signal line G(n+1) and the data signal line SX via a transistor, and a negative low-gradation data signal is written into the pixel electrode 17F that is connected to the scanning signal line G(n+1) and the data signal line SY via a transistor.

Next, in the one-scanning-signal-line selection period of H1, the scanning signal line G(n+1) is in a non-selection state and only the scanning signal line Gn is selected. Accordingly, a positive high-gradation data signal is written into the pixel electrode 17b that is connected to the scanning signal line Gn and the data signal line Sx via a transistor, and a negative high-gradation data signal is written into the pixel electrode 17d that is connected to the scanning signal line Gn and the data signal line Sy via a transistor (see FIGS. 23 through 25). Further, a positive high-gradation data signal is written into the pixel electrode 17A that is connected to the scanning signal line Gn and the data signal line SX via a transistor, and a negative high-gradation data signal is written into the pixel electrode 17C that is connected to the scanning signal line Gn and the data signal line SY via a transistor.

Consequently, sub-pixels respectively corresponding to the pixel electrodes 17b, 17c, 17d, 17e, 17A, 17C, 17D, and 17F become bright sub-pixel (positive), dark sub-pixel (positive), bright sub-pixel (negative), dark sub-pixel (negative), bright sub-pixel (positive), bright sub-pixel (negative), dark sub-pixel (positive), and dark sub-pixel (negative), respectively.

In the two-scanning-signal-line selection period of H2, the two scanning signal lines G(n+2) and G(n+3) are selected (see FIGS. 24 and 26). Accordingly, a positive pre-charge signal (low gradation) is written into the pixel electrode 17f that is connected to the scanning signal line G(n+2) and the data signal line Sx via a transistor, a negative pre-charge signal (low gradation) is written into the pixel electrode 17h that is connected to the scanning signal line G(n+2) and the data signal line Sy via a transistor, a positive low-gradation data signal is written into the pixel electrode 17g that is connected to the scanning signal line G(n+3) and the data signal line Sx via a transistor, and a negative low-gradation data signal is written into a pixel electrode that is connected to the scanning signal line G(n+3) and the data signal line Sy via a transistor (see FIGS. 23, 24, and 26). Further, a positive pre-charge signal (low gradation) is written into the pixel electrode 17E that is connected to the scanning signal line G(n+2) and the data signal line SX via a transistor, a negative pre-charge signal (low gradation) is written into the pixel electrode 17G that is connected to the scanning signal line G(n+2) and the data signal line SY via a transistor, a positive low-gradation data signal is written into the pixel electrode 17H that is connected to the scanning signal line G(n+3) and the data signal line SX via a transistor, and a positive low-gradation data signal is written into a pixel electrode that is connected to the scanning signal line G(n+3) and the data signal line SY via a transistor.

Next, in the one-scanning-signal-line selection period of H2, the scanning signal line G(n+3) is in a non-selection state and only the scanning signal line G(n+2) is selected. Accordingly, a positive high-gradation data signal is written into the pixel electrode 17f that is connected to the scanning signal line G(n+2) and the data signal line Sx via a transistor, and a negative high-gradation data signal is written into the pixel electrode 17h that is connected to the scanning signal line G(n+2) and the data signal line Sy via a transistor (see FIGS. 23, 24, and 26). Further, a positive high-gradation data signal is written into the pixel electrode 17E that is connected to the scanning signal line G(n+2) and the data signal line SX via a transistor, and a negative high-gradation data signal is written into the pixel electrode 17G that is connected to the scanning signal line G(n+2) and the data signal line SY via a transistor.

Consequently, sub-pixels respectively corresponding to the pixel electrodes 17f, 17g, 17h, 17E, 17G, and 17H become bright sub-pixel (positive), dark sub-pixel (positive), bright sub-pixel (negative), bright sub-pixel (positive), bright sub-pixel (negative), and dark sub-pixel (positive), respectively.

In the two-scanning-signal-line selection period of H3, the two scanning signal lines G(n+4) and G(n+5) are selected. Next, in the one-scanning-signal-line selection period of H3, the scanning signal line G(n+5) is in a non-selection state and only the scanning signal line G(n+4) is selected. The state of H3 is as illustrated in FIG. 27.

In the liquid crystal panel 5c, in a case where a halftone is displayed, bright sub-pixels and dark sub-pixels are alternately disposed both in the row direction and in the column direction (bright sub-pixels and dark sub-pixels are disposed in a checkered pattern). This produces an effect that striped unevenness is less likely to be observed.

Further, a polarity of a data signal supplied to a single data signal line does not change during 1 vertical scanning period. This allows suppression of power consumption of a source driver as compared with a case where a polarity of a data signal is reversed every horizontal scanning period.

In addition, a polarity of a data signal written into a screen is reversed every two sub-pixels both in the row direction and in the column direction. This allows suppression of flickering of the screen.

Figure 28:
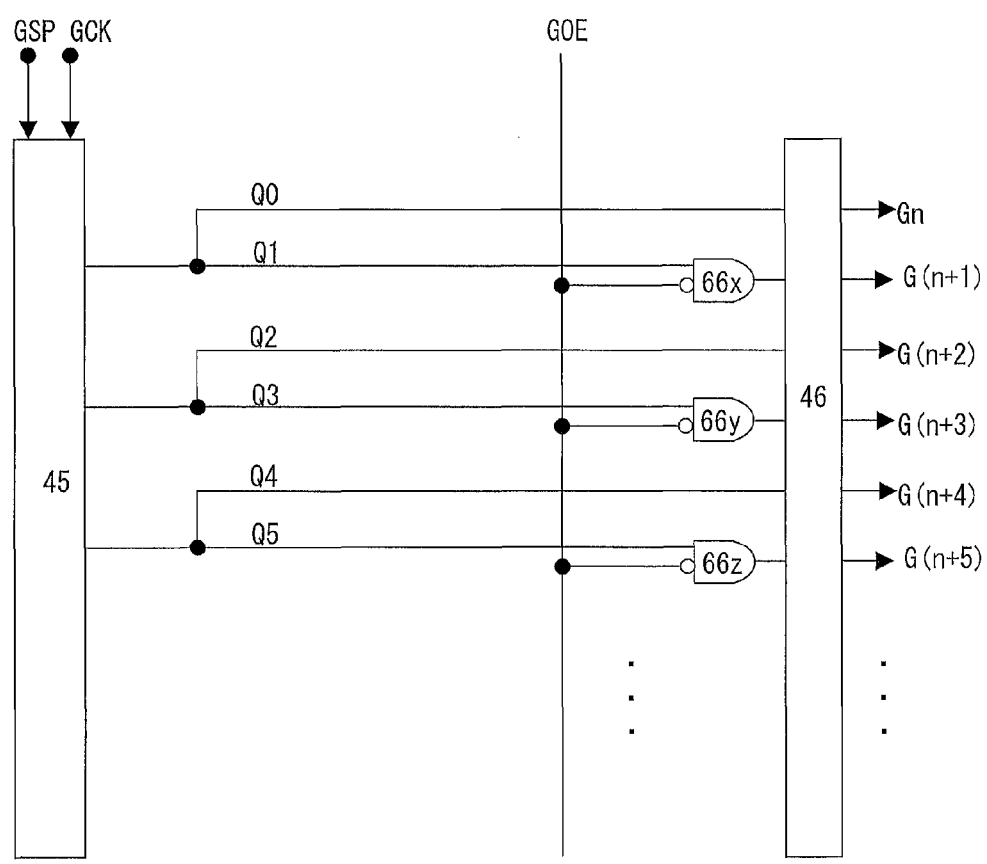
FIG. 28 is a diagram schematically illustrating an exemplary configuration of a gate driver of a liquid crystal display device.

FIG. 28 is a circuit diagram illustrating a configuration of a gate driver of the present liquid crystal display device, and FIG. 35 is a timing chart illustrating a method for driving the present gate driver. As illustrated in FIG. 28, the gate driver GD includes a shift register 45, a plurality of AND circuits (66x through 66z) aligned in the column direction, and an output circuit 46. The shift register 45 receives a gate start pulse signal GSP and a gate clock signal GCK. Each of the AND circuits (66x through 66z) receives an inverted signal of a GOE signal (see FIG. 35) which becomes "H" in a one-scanning-signal-line selection period of each horizontal scanning period. Output in each stage of the shift register 45 is branched out into two systems. One of them becomes a scanning signal via the output circuit 46. The other one of them is inputted to one AND circuit, and an output of this AND circuit becomes a scanning signal via the output circuit 46.

For example, an output from a stage of the shift register 45 is branched out into two systems (Q0 and Q1). One output Q0 passes through the output circuit 46 and then becomes a scanning signal to be supplied to the scanning signal line Gn. The other output Q1 is supplied to the AND circuit 66x, and an output of the AND circuit 66x passes through the output circuit 46 and then becomes a scanning signal to be supplied to the scanning signal line G(n+1). Further, an output of another stage of the shift register 45 is branched out into two systems (Q2 and Q3). One output Q2 passes through the output circuit 46 and then becomes a scanning signal to be supplied to the scanning signal line G(n+2). The other output Q3 is supplied to the AND circuit 66y, and an output of the AND circuit 66y passes through the output circuit 46 and then becomes a scanning signal to be supplied to the scanning signal line G(n+3).

The present gate driver has the following advantage. Specifically, scanning signals to be supplied to two scanning signal lines that are concurrently selected can be generated with the use of an output of a single stage of a shift register, as illustrated in FIGS. 28 and 35. This allows a configuration of the gate driver to be simplified.

In the present embodiment, the present liquid crystal display unit and liquid crystal display device are constructed as follows. Specifically, two polarizing plates A and B are attached to both surfaces of a liquid crystal panel (5a through 5f) so that a polarization axis of the polarizing plate A and a polarization axis of the polarizing plate B cross at right angles. Note that an optical compensation film etc. may be stacked on the polarizing plates as necessary. Next, drivers (a gate driver 202 and a source driver 201) are connected to the liquid crystal panel as shown in (a) of FIG. 29. The following description deals with an example in which the drivers are connected to the liquid crystal panel by a TCP (Tape Career Package) method. First, an ACF (Anisotropic Conductive Film) is provisionally compressed to a terminal section of the liquid crystal panel. Next, TCPs on which the drivers are disposed are punched out from a carrier tape; the TCPs are aligned with a panel terminal electrode, and thereafter the TCPs are heated and firmly compressed. Thereafter, a circuit substrate 203 (PWB: Printed Wiring Board) for linking the driver TCPs together and input terminals of the TCPs are connected by the ACF. This obtains a liquid crystal display unit 200. Thereafter, as illustrated in (b) of FIG. 29, the drivers (201 and 202) of the liquid crystal display unit are connected to a display control circuit 209 via the circuit substrate 203, to integrate the drivers with a lighting device (backlight unit) 204. This obtains a liquid crystal display device 210.

The "polarity of an electric potential" in the present application denotes high (positive) and low (negative) with respect to a standard electric potential. The standard electric potential in the present embodiment may be Vcom (common electric potential) which is an electric potential of a common electrode (counter electrode) or may be any other arbitrary electric potential.

FIG. 30 is a block diagram illustrating a configuration of the present liquid crystal display device. As illustrated in FIG. 30, the present liquid crystal display device includes a display section (liquid crystal panel), a source driver (SD), a gate driver (GD), and a display control circuit. The source driver drives data signal lines, the gate driver drives scanning signal lines, and the display control circuit controls the source driver and the gate driver.

The display control circuit receives, from an external signal source (e.g., a tuner), a digital video signal Dv representing an image to be displayed, a horizontal sync signal HSY and vertical sync signal VSY corresponding to the digital video signal Dv, and a control signal Dc for controlling a display operation. Moreover, based on these received signals Dv, HSY, VSY, and Dc, the display control circuit generates, as signals for displaying on the display section the image represented by the digital video signal Dv, a data start pulse signal SSP, data clock signal SCK, charge sharing signal sh, digital image signal DA (signal corresponding to the video signal Dv) representing the image to be displayed, gate start pulse signal GSP, gate clock signal GCK, and gate driver output control signal (scanning signal output control signal) GOE. The display control circuit then outputs these signals.

More specifically, the display control circuit (i) outputs the video signal Dv as the digital image signal DA, after carrying out timing adjustment and the like of the video signal Dv by use of an inner memory as necessary, (ii) generates the data clock signal SCK as a signal made up of a pulse corresponding to pixels in the image that the digital image signal DA represents, (iii) generates the data start pulse signal SSP as a signal that, based on the horizontal sync signal HSY, becomes a high-level (H level) for just a predetermined time per horizontal scanning period, (iv) generates a gate start pulse signal GSP as a signal that, based on the vertical sync signal VSY, becomes a H level for just a predetermined time per frame period (one vertical scanning period), (v) generates a gate clock signal GCK based on the horizontal sync signal HSY, and (vi) generates a charge sharing signal sh and a gate driver output control signal GOE based on the horizontal sync signal HSY and control signal Dc.

Among the signals that are generated in the display control circuit as aforementioned, the digital image signal DA, the charge sharing signal sh, a signal POL that controls a polarity of the signal electric potential (data signal electric potential), the data start pulse signal SSP, and the data clock signal SCK are inputted into the source driver; whereas the gate start pulse signal GSP, gate clock signal GCK, and gate driver output control signal GOE are inputted into the gate driver.

The source driver successively generates, per one horizontal scanning period, an analog electric potential (signal electric potential) that is equivalent to a pixel value in the scanning signal lines of the image represented by the digital image signal DA, based on the digital image signal DA, data clock signal SCK, charge sharing signal sh, data start pulse signal SSP, and polarity inversion signal POL. The source driver then outputs these data signals to the data signal lines (e.g., Sx and Sy).

The gate driver generates a gate on-pulse signal based on the gate start pulse signal GSP, gate clock signal GCK, and gate driver output control signal GOE, and outputs this generated signal to the scanning signal line. This causes the scanning signal lines to be sequentially selected two at a time.

The following description explains one configuration example of the present liquid crystal display device in a case where the liquid crystal display device is applied to a television receiver. FIG. 31 is a block diagram illustrating a configuration of a liquid crystal display device 800 for use in a television receiver. The liquid crystal display device 800 includes: a liquid crystal display unit 84; a Y/C separation circuit 80, a video chroma circuit 81; a A/D converter 82; a liquid crystal controller 83; a backlight driving circuit 85; a backlight 86; a microcomputer (microcomputer) 87; and a gradation circuit 88. The liquid crystal display unit 84 includes a liquid crystal panel, and a source driver and gate driver for driving the liquid crystal panel.

In the liquid crystal display device 800 of this configuration, first, a composite color video signal Scv as a television signal is inputted into the Y/C separation circuit 80 from outside, and the composite color video signal Scv is divided into a brightness signal and a color signal. The brightness signal and color signal are converted by the video chroma circuit 81 into analog RGB signals that correspond to the light's three principle colors, and further the analog RGB signals are converted by the A/D converter 82 into digital RGB signals. The digital RGB signals are inputted into the liquid crystal controller 83. Moreover, in the Y/C separation circuit 80, horizontal and vertical sync signals are also retrieved from the composite color video signal Scv inputted from the outside. These sync signals also are inputted into the liquid crystal controller 83 via the microcomputer 87.

In the liquid crystal display unit 84, the digital RGB signals are inputted from the liquid crystal controller 83 at a predetermined timing, together with a timing signal based on the sync signal. Moreover, in the gradation circuit 88, gradation electric potentials are generated for each of the three principle colors of color display R, G, B. These gradation electric potentials are also supplied to the liquid crystal display unit 84. In the liquid crystal display unit 84, a driving signal (data signal=signal electric potential, scanning signal etc.) is generated by the source driver, gate driver and the like provided inside, based on the RGB signals, timing signals, and gradation electric potentials, and a color image is displayed on the inner liquid crystal panel based on the driving signal. In order to display an image by the liquid crystal display unit 84, the liquid crystal panel needs to be irradiated with light from a rear side of the liquid crystal panel inside of the liquid crystal display unit. With the liquid crystal display device 800, a backside of the liquid crystal panel is irradiated with light by having the backlight driving circuit 85 drive the backlight 86 under control of the microcomputer 87. Control of the entire system including the foregoing processes is carried out by the microcomputer 87. Video signals inputted from the outside (composite color video signal) may be not just video signals based on television broadcast, but may also be video signals captured by a camera and video signals supplied via Internet connection. With use of the liquid crystal display device 800, it is possible to perform image display based on various video signals.

In a case where an image based on television broadcast is displayed by the liquid crystal display device 800, a tuner section 90 is connected to the liquid crystal display device 800 as illustrated in FIG. 32, thus configuring the present television receiver 601. The tuner section 90 extracts signals of channels to be received among waves (high frequency signals) that are received by an antenna (not illustrated), and converts them to an intermediate frequency signal. By detecting this intermediate frequency signal, composite color video signals Scv as a television signal are taken out. The composite color video signal Scv is, as already described, inputted into the liquid crystal display device 800, and an image based on this composite color video signal Scv is displayed on the liquid crystal display device 800.

FIG. 33 is an exploded perspective view of an example illustrating one configuration of the present television receiver. As illustrated in FIG. 33, the present television receiver 601 includes, as its constituents, the liquid crystal display device 800, a first housing 801 and a second housing 806. The first housing 801 and second housing 806 sandwich the liquid crystal display device 800 so that the liquid crystal display device 800 is surrounded by the two housings. The first housing 801 has an opening 801a that transmits an image displayed on the liquid crystal display device 800. Moreover, the second housing 806 covers a rear side of the liquid crystal display device 800, and includes an operation circuit 805 for operating the display device 800. Further, the second housing 806 has a supporting member 808 disposed to its lower side.

The present invention is not limited to the description of the embodiments above, but may be altered by a skilled person within the scope of the claims. An embodiment based on a proper combination of technical means disclosed in different embodiments is encompassed in the technical scope of the present invention.

As described above, the present active matrix substrate includes: data signal lines; scanning signal lines; pixel electrodes; and transistors, the data signal lines extending in a column direction, each column of pixel regions being associated with two data signal lines, each pixel region included in said each column including a plurality of pixel electrodes, one of the plurality of pixel electrodes of said each pixel region being connected to one of the two data signal lines via a transistor that is connected to a scanning signal line, another one of the plurality of pixel electrodes of said each pixel region being connected to the other one of the two data signal lines via a transistor that is connected to another scanning signal line, and one of pixel electrodes in one of two adjacent pixel regions of said each column and one of pixel electrodes in the other one of the two adjacent pixel regions of said each column being connected to an identical scanning signal line via respective transistors.

In a liquid crystal display device including the present active matrix substrate, individual writing can be carried out with respect to a plurality of pixel electrodes provided in a pixel region while selecting scanning signal lines two at a time. This makes it possible to extend a pixel charging time of an individual-writing type liquid crystal display device.

The present liquid crystal display device may be arranged such that said each pixel region includes two pixel electrodes that are aligned in a row direction.

The present active matrix substrate may be arranged such that two pixel electrodes which belong to an identical column of pixel regions and which are connected to an identical scanning signal line via respective transistors are disposed diagonally opposite to each other.

The present active matrix substrate may be arranged such that said each pixel region includes two pixel electrodes that are aligned in the column direction.

The present active matrix substrate may be arranged such that two pixel electrodes which belong to an identical column of pixel regions and which are connected to an identical scanning signal line via respective transistors are disposed so as to sandwich another pixel electrode.

The present active matrix substrate may be arranged such that two pixel electrodes which belong to an identical row of pixel regions and which are connected to an identical scanning signal line via respective transistors are disposed diagonally opposite to each other.

The present liquid crystal panel includes the active matrix substrate.

The present liquid crystal display device includes the active matrix substrate.

The present liquid crystal display device may be arranged such that the scanning signal lines are sequentially selected two at a time.

The present liquid crystal display device may be arranged such that a single horizontal scanning period includes (i) a two-scanning-signal-line selection period in which two scanning signal lines are concurrently selected and (ii) a one-scanning-signal-line selection period which follows the two-scanning-signal-line selection period and in which only one of the two scanning signal lines is selected.

The present liquid crystal display device may be arranged such that, in a case where a halftone is displayed, a data signal of a relatively low gradation is supplied to each of the data signal lines in the two-scanning-signal-line selection period, whereas a data signal of a relatively high gradation is supplied to each of the data signal lines in the one-scanning-signal-line selection period.

The present liquid crystal display device may be arranged such that, in a case where a halftone is displayed, a data signal of a relatively high gradation is supplied to each of the data signal lines in the two-scanning-signal-line selection period, whereas a data signal of a relatively low gradation is supplied to each of the data signal lines in the one-scanning-signal-line selection period.

The present liquid crystal display device may be arranged such that a pixel electrode connected via a transistor to a scanning signal line which is selected in the one-scanning-signal-line selection period is larger in area than a pixel electrode connected via a transistor to a scanning signal line which is not selected in the one-scanning-signal-line selection period.

The present liquid crystal display device may be arranged such that data signals of reverse polarities are supplied to two data signal lines associated with a single column of pixel regions.

The present liquid crystal display device may be arranged such that a data signal whose polarity is reversed every horizontal scanning period is supplied to each of the data signal lines.

The present liquid crystal display device may be arranged such that a data signal whose polarity is reversed every vertical scanning period is supplied to each of the data signal lines.

The present liquid crystal display device may be arranged such that data signals of reverse polarities are supplied to adjacent data signal lines which are associated with different columns of pixel regions.

The present liquid crystal display device may be arranged such that data signals of an identical polarity are supplied to adjacent data signal lines which are associated with different columns of pixel regions.

The present liquid crystal display device may be arranged to further include a scanning signal line driving circuit including a shift register, scanning signals to be supplied to respective scanning signal lines that are concurrently selected being generated with the use of an output of a single stage of the shift register.

The present liquid crystal display unit includes the liquid crystal panel and a driver. The present television receiver includes the liquid crystal display device and a tuner section for receiving television broadcast.

The present method for driving a liquid crystal panel includes the step of sequentially selecting scanning signal lines two at a time, the liquid crystal panel including: data signal lines; scanning signal lines; pixel electrodes; and transistors, the data signal lines extending in a column direction, each column of pixel regions being associated with two data signal lines, each pixel region included in said each column including a plurality of pixel electrodes, one of the plurality of pixel electrodes of said each pixel region being connected to one of the two data signal lines via a transistor that is connected to a scanning signal line, another one of the plurality of pixel electrodes of said each pixel region being connected to the other one of the two data signal lines via a transistor that is connected to another scanning signal line, and one of pixel electrodes in one of two adjacent pixel regions of said each column and one of pixel electrodes in the other one of the two adjacent pixel regions of said each column being connected to an identical scanning signal line via respective transistors.

INDUSTRIAL APPLICABILITY

The active matrix substrate and the liquid crystal panel of the present invention is suitably applicable, for example, to a liquid crystal television.

REFERENCE SIGNS LIST 5a through 5c: Liquid crystal panel
12a through 12h, 12A through 12H: Transistor
17a through 17h, 17A through 17H: Pixel electrode
Sx, Sy, SX, SY: Data signal line
Gn through G(n+6): Scanning signal line
Csn through Cs(n+2): Retention capacitor wiring
22: Gate insulating film
24: Semiconductor layer
25: Inorganic interlayer insulating film
26: Organic interlayer insulating film
84: Liquid crystal display unit
101 through 108: Pixel
601: Television receiver
800: Liquid crystal display device

The invention claimed is:

1. An active matrix substrate comprising:
a plurality of data signal lines extending in a first direction
a plurality of scanning signal lines extending in a second direction perpendicular or substantially perpendicular to the first direction;
a plurality of pixel electrodes;
a plurality of retention capacitor wirings including overlapping portions arranged to overlap at least one of the plurality of pixel electrodes with an insulating layer therebetween;
a plurality of first transistors; and
a plurality of second transistors; wherein
two of the plurality of pixel electrodes are surrounded by two adjacent ones of the plurality of data signal lines and two adjacent ones of the plurality of scanning signal lines, the two of the plurality of pixel electrodes are arranged adjacent to one another in the second direction;
the plurality of retention capacitor wirings include extending portions which extend in the first direction and overlap gaps between the two of the plurality of pixel electrodes;
one of the two of the plurality of pixel electrodes is connected to one of the two adjacent ones of the plurality of scanning signal lines through one of the plurality of first transistors; and
another one of the two of the plurality of pixel electrodes is connected to another one of the two adjacent ones of the plurality of scanning signal lines through one of the plurality of second transistors.

2. The active matrix substrate according to claim 1, wherein
the insulating layer is made of only inorganic material.

3. The active matrix substrate according to claim 1, wherein the plurality of retention capacitor wirings and the data signal lines are defined by an identical layer.

4. The active matrix substrate according to claim 1, wherein
each of the plurality of pixel electrodes is connected to one of the plurality of first transistors or one of the plurality of second transistors; and
an arrangement of the one of the plurality of first transistors and the one of the plurality of second transistors is identical or substantially identical for each of a plurality of adjacent pairs of the plurality of pixel electrodes.

5. The active matrix substrate according to claim 1, wherein
one of the two adjacent ones of the plurality of scanning signal lines also surrounds another two of the plurality of pixel electrodes next to the two of the plurality of pixel electrodes in cooperation with the two adjacent ones of the plurality of data signal lines and another one of the plurality of scanning signal lines adjacent to the one of the two adjacent ones of the plurality of scanning signal lines.

6. An active matrix display panel comprising the active matrix substrate according to claim 1.

7. An active matrix display device comprising the active matrix substrate according to claim 1, further comprising:
a data drive circuit arranged to supply data signals to the plurality of data signal lines; and
a scan drive circuit arranged to supply scanning signals to the plurality of scanning signal lines.

8. The active matrix display device according to claim 7, wherein
first data signals are written to one of the two of the plurality of pixel electrodes through the first transistor at a first scanning period; and
second data signals are written to another of the two of the plurality of pixel electrodes through the second transistor at a second scanning period which is different from the first scanning period.

9. The active matrix display device according to claim 7, wherein
the plurality of data signal lines are arranged to be driven using a single scanning period which includes: (i) a two-scanning-signal-line selection period in which the two adjacent ones of the plurality of scanning signal lines are concurrently selected, and (ii) a one-scanning-signal-line selection period which follows the two-scanning-signal-line selection period and in which only one of the two adjacent ones of the plurality of scanning signal lines is selected.

10. The active matrix display device according to claim 7, wherein
in a same scanning period, a polarity of one of the data signals supplied to one of the two adjacent ones of the plurality of data signal lines is different from a polarity of another of the data signals supplied to another of the two adjacent ones of the plurality of data signal lines.

11. The active matrix display device according to claim 7, wherein
a polarity of one of the data signals supplied to one of the plurality of data signal lines in a scanning period is different from a polarity of another of the data signals supplied to the one of the plurality of data signal lines in another scanning period immediately after the scanning period.

12. The active matrix substrate according to claim 1, further comprising:
a plurality of retention capacitors, wherein
each of the plurality of retention capacitors is coupled to a respective one of the plurality of pixel electrodes, and
each of the plurality of retention capacitors is primarily arranged at respective ones of the overlapping portions of the plurality of retention capacitor wirings which overlap the respective one of the plurality of pixel electrodes.

* * * * *